(12) United States Patent
Kataoka et al.

(10) Patent No.: US 9,490,381 B2
(45) Date of Patent: Nov. 8, 2016

(54) PHOTOVOLTAIC DEVICE, PHOTOVOLTAIC SYSTEM, AND VEHICLE INCLUDING PHOTOVOLTAIC DEVICE

(75) Inventors: Kohtaroh Kataoka, Osaka (JP); Kohichiroh Adachi, Osaka (JP); Masatomi Harada, Osaka (JP); Yoshiji Ohta, Osaka (JP); Hiroshi Iwata, Osaka (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 750 days.

(21) Appl. No.: 13/978,293

(22) PCT Filed: Dec. 16, 2011

(86) PCT No.: PCT/JP2011/079212
§ 371 (c)(1),
(2), (4) Date: Jul. 3, 2013

(87) PCT Pub. No.: WO2012/101928
PCT Pub. Date: Aug. 2, 2012

(65) Prior Publication Data
US 2013/0284233 A1    Oct. 31, 2013

(30) Foreign Application Priority Data

Jan. 28, 2011  (JP) ................. 2011-017126
Mar. 24, 2011  (JP) ................. 2011-065765

(51) Int. Cl.
*H01L 31/05*     (2014.01)
*H01L 31/042*    (2014.01)
*B60L 8/00*      (2006.01)
(Continued)

(52) U.S. Cl.
CPC .......... *H01L 31/0504* (2013.01); *B60L 8/003* (2013.01); *B60L 11/1877* (2013.01); *B60L 15/007* (2013.01); *H01L 31/02021* (2013.01);
(Continued)

(58) Field of Classification Search
CPC ................................................... H01L 31/0504
USPC ............................................. 307/71; 136/244
See application file for complete search history.

(56) References Cited

U.S. PATENT DOCUMENTS 5,637,155 A     6/1997  Inoue
6,635,817 B2 *  10/2003 Chang ............... H01L 31/02021
                                                      136/244
(Continued)

FOREIGN PATENT DOCUMENTS

| JP | 53-82192    | 7/1978  |
|----|-------------|---------|
| JP | 8-153883    | 6/1996  |
| JP | 2010-287795 | 12/2010 |
| JP | 2012-178616 | 9/2012  |

OTHER PUBLICATIONS

Search Report mailed Jan. 31, 2012, directed to International Application No. PCT/JP2011/079212; 6 pages.

*Primary Examiner* — Joseph Chang
(74) *Attorney, Agent, or Firm* — Morrison & Foerster LLP

(57) ABSTRACT

Disclosed is a photovoltaic device 1 including a plurality of cluster power generation sections G (G11, G12, G21, and G22). Each cluster power generation section G includes unitary power generation sections D (D1, D2) connected in series via connection points CP12. The cluster power generation sections G each have at least a predetermined one of the connection points CP12 designated as a specific connection point SP12. The specific connection points SP12 are connected together to link the cluster power generation sections G.

15 Claims, 38 Drawing Sheets

(51) Int. Cl.
   *H01L 31/02*    (2006.01)
   *B60L 11/18*    (2006.01)
   *B60L 15/00*    (2006.01)
(52) U.S. Cl.
   CPC .......... *H01L 31/042* (2013.01); *B60L 2200/18* (2013.01); *Y02E 10/50* (2013.01); *Y02T 10/645* (2013.01); *Y02T 10/7005* (2013.01); *Y02T 10/705* (2013.01); *Y02T 10/7083* (2013.01)

(56) References Cited

U.S. PATENT DOCUMENTS

2010/0013309 A1\* 1/2010 Rosenblatt ................ H02J 7/35
   307/64
2010/0313930 A1   12/2010 Yokobayashi et al.
2013/0269747 A1\* 10/2013 Lentine ................ H01L 31/0504
   136/244

\* cited by examiner

FIG.15B    Gc
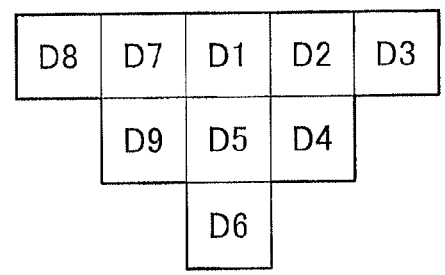
FIG.15C    Gd
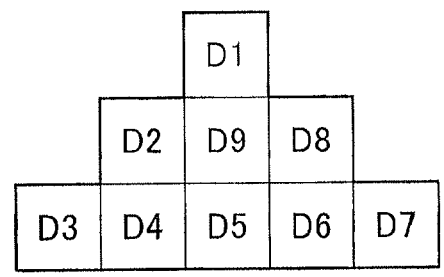
FIG.15D    Ge
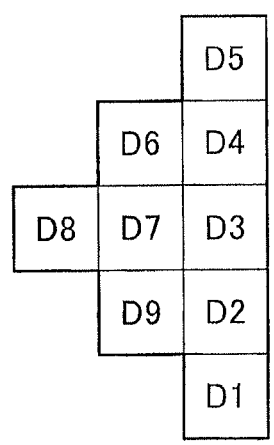

FIG.17A    Gf
|D1|D2|D3|
|---|---|---|
|D6|D5|D4|
|D7|D8|D9|
FIG.17B    Gg
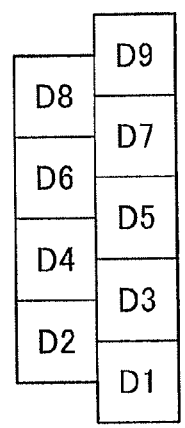
FIG.17C    Gh
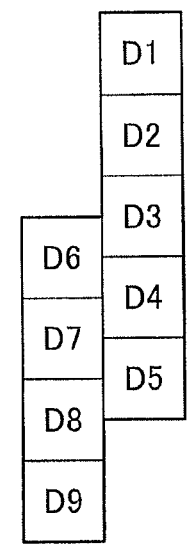

| D1 | D6 | D7 |
|----|----|----|
| D2 | D5 | D8 |
| D3 | D4 | D9 |

| D9 | D4 | D3 |
|----|----|----|
| D8 | D5 | D2 |
| D7 | D6 | D1 |

PHOTOVOLTAIC DEVICE, PHOTOVOLTAIC SYSTEM, AND VEHICLE INCLUDING PHOTOVOLTAIC DEVICE

REFERENCE TO RELATED APPLICATIONS

This application is a national stage application under 35 USC 371 of International Application No. PCT/JP2011/079212, filed Dec. 16, 2011, which claims the priority of Japanese Patent Application Nos. 2011-017126, filed Jan. 28, 2011, and 2011-065765, filed Mar. 24, 2011, the entire contents of which are incorporated herein by reference.

FIELD OF THE INVENTION

The present invention relates to a photovoltaic device including parallel-connected cluster power generation sections in each of which unitary power generation sections for converting light to electricity for power generation are connected in series via connection points. The present invention also relates to a photovoltaic system including a power conditioner for converting the electric power supplied by the photovoltaic device to a predetermined mode of electric power and to a vehicle including a photovoltaic device installed on its body surface.

BACKGROUND OF THE INVENTION

Solar cells have a low output voltage as individual elements. Therefore, when they are applied, an appropriate solar cell module is prepared as necessary by configuring a solar cell cluster in which multiple solar cells are connected in series. In other words, a solar cell module is formed by connecting multiple solar cells in series, and there are cases where variation in the amount of light irradiation for some solar cells (e.g., a shaded area) has an influence on the solar cell module as a whole.

For example, if only some of the solar cells connected in series become shaded, an imbalance in the irradiated area arises between the series stages. If the irradiated area differs between solar cells, the output of the series-connected solar cells will be limited by the solar cell having the lowest irradiation amount (solar irradiation amount). In other words, even if the shaded area is small, all of the series-connected solar cells are affected, and there are cases where the output is greatly limited.

A known countermeasure for variation in the amount of light irradiation for solar cells is to connect a bypass diode in parallel with the solar cell. According to this countermeasure, a bypass current flows in a stage where there is low light irradiation (a stage where there is a large shaded area) because of the operation of the bypass diode, and even when the stage is partly illuminated by light irradiation, there is little contribution to the output. In addition, the voltage drop which occurs across the bypass diode leads to loss of electric power.

Furthermore, various techniques have been proposed as countermeasures for shaded areas (e.g., see Patent Documents 1 to 4,).

According to the technology disclosed in Patent Document 1, the direction of cross-pieces for fixing a roof member incorporating solar cell elements and the direction of the series connection of the solar cell elements are set parallel to each other so as to equalize the reduction in the output of the solar cell elements due to shadows created by the cross-pieces. This is a countermeasure for a very specialized mode of avoiding the influence of shadows created by cross-pieces used in installation, not a general countermeasure for variation in the amount of light irradiation, and therefore cannot be said to be a so-called countermeasure for shaded areas. Furthermore, other applications of this technology would be very difficult.

According to the technology disclosed in Patent Document 2, solar cell modules configured by solar cell elements are arranged in a vertically stepped manner, and the direction of the series connection of the solar cell elements is set to a direction orthogonal to the vertical direction. Although this prevents a problem from arising even if an upper solar cell module creates a shadow on a lower solar cell module, this is a countermeasure directed to solar cell modules that are arranged in a vertically stepped manner, and is for avoiding the influence of shadows created by the solar cell modules. This is not a general countermeasure for variation in the amount of light irradiation, and therefore cannot be said to be a so-called countermeasure for shaded areas. Furthermore, other applications of this technology would be very difficult.

According to the technology disclosed in Patent Document 3, the longitudinal direction of solar cells and the longitudinal direction of solar cell modules formed by arranging the solar cells are set so as to be orthogonal to each other so as to diminish a reduction in output due to a shadow created by a step portion when the solar cell modules are stacked in steps. This is not a general countermeasure for variation in the amount of light irradiation, and therefore cannot be said to be a so-called countermeasure for shaded areas. Furthermore, other applications of this technology would be very difficult.

According to the technology disclosed in Patent Document 4, the number of solar cell modules that are installed is set high in advance for solar cell arrays that are installed in places where shadows are created. This is not a general countermeasure for variation in the amount of light irradiation, and therefore cannot be said to be a so-called countermeasure for shaded areas. Furthermore, other applications of this technology would be very difficult.

Patent Document 1: JP H7-217087A
Patent Document 2: JP 2001-36125A
Patent Document 3: JP 2001-111083A
Patent Document 4: JP 2002-237612A

SUMMARY OF THE INVENTION

As described above, conventional solar cell modules only have countermeasures for predetermined shadows. In other words, random variation in the amount of light irradiation has not been taken into consideration at all. Although it is conceivable to use bypass diodes as a countermeasure for random variation in the amount of light irradiation, the use of bypass diodes is inevitably accompanied by power loss and a reduction in output.

The present invention has been achieved in light of such circumstances. Specifically, an object of the present invention is to provide a photovoltaic device which, by specifying a planar arrangement for cluster power generation sections in each of which unitary power generation sections for converting light to electricity for power generation are connected in series and also specifying interconnections for the cluster power generation sections, prevents the adverse effect of variation in light irradiation (sunlight) (e.g., a local reduction in light irradiation on the unitary power generation sections caused by a shadow) and also restrains an imbalance between the irradiated area and the area taken up by the operating unitary power generation sections to realize efficient power generation even if there occurs variation in the amount of light irradiation.

Another object of the present invention is to provide a photovoltaic system which, by including a photovoltaic device of the present invention, restrains an imbalance between the irradiated area and the area taken up by the operating unitary power generation sections (cluster power generation sections, photovoltaic device) to realize efficient power generation even if there occurs variation in the amount of light irradiation on the photovoltaic device, A further object of the present invention is to provide a vehicle which, by including a photovoltaic device of the present invention, restrains an imbalance between the irradiated area and the area taken up by the operating unitary power generation sections (cluster power generation sections, photovoltaic device) to realize efficient power generation and also supplies generated electric power to a vehicle power supply system while restraining the adverse effect of variation in the amount of light irradiation even if there occurs variation in the amount of light irradiation on the photovoltaic device.

A photovoltaic device in accordance with the present invention includes a plurality of cluster power generation sections. Each cluster power generation section includes unitary power generation sections connected in series via connection points. The cluster power generation sections each have at least a predetermined one of the connection points designated as a specific connection point. The specific connection points are connected together to link the cluster power generation sections.

According to this configuration, in the photovoltaic device in accordance with the present invention, the cluster power generation sections formed by the series-connected unitary power generation sections are connected together in parallel at a specific stage (via the specific connection points), so that the unitary power generation sections located at particular positions can be in effect distributed. The configuration thus prevents the adverse effect of variation in light irradiation (sunlight) which may only occur at a specific series stage (e.g., a local reduction in light irradiation on the unitary power generation sections caused by a shadow). Furthermore, even if there occurs variation in the amount of light irradiation, the configuration restrains an imbalance between the irradiated area and the area taken up by the operating unitary power generation sections. The configuration thus realizes efficient power generation.

In the photovoltaic device in accordance with the present invention, the unitary power generation sections preferably have a substantially equal light-receiving area in the cluster power generation sections.

According to the configuration, in the photovoltaic device in accordance with the present invention, the cluster power generation sections formed by the unitary power generation sections of which the series stages have a substantially equal light-receiving area, i.e., a substantially equal power generating capability, are arranged on a light-receiving section. Therefore, the areas of the series stages are locally equalized on the light-receiving section. The arrangement of the unitary power generation sections in the photovoltaic device is free from imbalance and hence uniform. The adverse effect of variation in the amount of light irradiation on a particular series stage (unitary power generation sections) is thereby further restrained. Differences in light-receiving area between the unitary power generation sections in a cluster power generation section are preferably small. It is effective if the light-receiving area of the unitary power generation section with a minimum area is not less than 90% of the light-receiving area of the unitary power generation section with a maximum area.

In the photovoltaic device in accordance with the present invention, each of the specific connection points may be a connection point located at a boundary which divides the cluster power generation section into equal numbers of unitary power generation sections.

According to the configuration, the photovoltaic device in accordance with the present invention includes fewer specific connection points that need to be connected between the cluster power generation sections than the connection points. The configuration thereby simplifies the connections.

In the photovoltaic device in accordance with the present invention, the boundary preferably divides the cluster power generation section along rows or columns of the unitary power generation sections.

According to the configuration, in the photovoltaic device in accordance with the present invention, since the unitary power generation sections are divided along their rows or columns, the arrangement and connections of the specific connection points are simplified.

In the photovoltaic device in accordance with the present invention, all the connection points are preferably designated as specific connection points.

According to the configuration, in the photovoltaic device in accordance with the present invention, since the series-connected unitary power generation sections are all connected in parallel, the adverse effect of light irradiation on a particular stage is more effectively restrained, and power generation efficiency is more reliably prevented from decreasing due to variation in the amount of light irradiation.

In the photovoltaic device in accordance with the present invention, the unitary power generation sections preferably have an identical planar arrangement in the cluster power generation sections.

According to the configuration, in the photovoltaic device in accordance with the present invention, since the series-connected unitary power generation sections have the same in-plane positions in the cluster power generation sections, a simple layout is realized for the cluster power generation sections, and the connection of the specific connection points between the cluster power generation sections is facilitated.

In the photovoltaic device in accordance with the present invention, the unitary power generation sections in one of the cluster power generation sections may have an at least partially different planar arrangement from that of the unitary power generation sections in an adjoining one of the cluster power generation sections.

According to the configuration, in the photovoltaic device in accordance with the present invention, the unitary power generation sections in one of the cluster power generation sections have an at least partially different planar arrangement from that of the unitary power generation sections in an adjoining one of the cluster power generation sections. Thus, the regularity of the arrangement of the unitary power generation sections is restrained as much as possible. The configuration thereby realizes a distributed arrangement of the unitary power generation sections. Thus, the configuration further restrains the adverse effect of variation in the amount of light irradiation and prevents poor power generation efficiency.

In the photovoltaic device in accordance with the present invention, the unitary power generation sections in one of the cluster power generation sections preferably have a planar arrangement rotated a multiple of 90° from that of the unitary power generation sections in an adjoining one of the cluster power generation sections.

According to the configuration, the photovoltaic device in accordance with the present invention enables the planar arrangement of the unitary power generation sections to be readily different from one cluster power generation section to another.

In the photovoltaic device in accordance with the present invention, the cluster power generation sections may be arranged so that they are either wider in a row direction than they are long in a column direction or longer in a column direction than they are wide in a row direction, and the unitary power generation sections in the cluster power generation sections may have different planar arrangements either in the row direction or in the column direction, in whichever direction the photovoltaic device has a greater dimension.

The configuration of the photovoltaic device in accordance with the present invention enables alternate planar arrangements for the unitary power generation sections, which is effective to a light irradiation irregularity extending in the direction in which the cluster power generation sections has a greater dimension. The configuration also effectively restrains poor power generation efficiency.

In the photovoltaic device in accordance with the present invention, the unitary power generation sections in one of the cluster power generation sections may have a different planar arrangement from that of the unitary power generation sections in an adjoining one of the cluster power generation sections at least either from one row to another or from one column to another.

According to the configuration, in the photovoltaic device in accordance with the present invention, the planar arrangement of the unitary power generation sections differs between adjoining cluster power generation sections at least either from one row of the unitary power generation sections in the cluster power generation sections to another or from one column thereof to another. Thus, the regularity of the arrangement of the unitary power generation sections is restrained as much as possible. The configuration thereby realizes a distributed arrangement. Hence, the configuration further restrains the adverse effect of variation in the amount of light irradiation and prevents poor power generation efficiency.

In the photovoltaic device in accordance with the present invention, each of the unitary power generation sections is either a single photovoltaic element or a compound photovoltaic element in which photovoltaic elements are connected in series or in parallel.

According to the configuration, in the photovoltaic device in accordance with the present invention, the unitary power generation section is configured to exhibit necessary electrical characteristics by choosing (selecting or combining) proper photovoltaic elements.

In the photovoltaic device in accordance with the present invention, the unitary power generation sections in some of the cluster power generation sections preferably have a different arrangement from that of the unitary power generation sections in the other cluster power generation sections.

According to the configuration, in the photovoltaic device in accordance with the present invention, the unitary power generation sections in the same series stage (specific series stage) are not fixed at particular positions in the cluster power generation section and hence more distributed (for example, adjoining cluster power generation sections can be located at very different positions (position state)). Thus, the adverse effect of variation in the amount of light irradiation (for example, partial shadow cast over the light-receiving face) is effectively restrained.

In the photovoltaic device in accordance with the present invention, the cluster power generation sections each preferably include an additional unitary power generation section for each one of the unitary power generation sections, the additional unitary power generation section being connected in parallel with that one of the unitary power generation sections.

According to the configuration, in the photovoltaic device in accordance with the present invention, each cluster power generation section includes multiple series circuits each formed by unitary power generation sections, and each series stage of the series circuits includes parallel-connected unitary power generation sections. Therefore, a unitary power generation section in one series circuit and a unitary power generation section in another series circuit can be located at a distance from each other, even if they are in the same series stage. The configuration hence effectively restrains the adverse effect of variation in the amount of light irradiation, for example, partial shadow cast over the light-receiving face.

In the photovoltaic device in accordance with the present invention, the unitary power generation sections in one series circuit in the cluster power generation sections preferably have a different arrangement from that of the unitary power generation sections in another series circuit when the arrangements are compared for the same series stage.

According to the configuration, since the unitary power generation sections in the same series stage (specific series stage) are not fixed at particular positions in the cluster power generation section and hence more distributed, the photovoltaic device in accordance with the invention readily realizes a cluster power generation section with an increased level of irregularity in the arrangement of the unitary power generation sections. The photovoltaic device hence effectively restrains the adverse effect of variation in the amount of light irradiation (for example, partial shadow cast over the light-receiving face) and improves productivity.

In the photovoltaic device in accordance with the present invention, the unitary power generation sections as a whole may form a curved light-receiving face.

According to the configuration, the photovoltaic device in accordance with the present invention is applicable both when the attaching face is planar and when it is curved. The photovoltaic device is thus more broadly applicable.

The photovoltaic device in accordance with the present invention may include a transparent substrate on which the cluster power generation sections are mounted.

According to the configuration, the photovoltaic device in accordance with the present invention provides an easy-to-handle module by collectively outputting the cluster power generation sections arranged in the row direction or in the column direction.

A photovoltaic system in accordance with the present invention includes a photovoltaic device in accordance with the present invention, and a power conditioner for converting electric power supplied by the photovoltaic device to a predetermined mode of electric power.

According to the configuration, the photovoltaic system in accordance with the present invention prevents the adverse effect of variation in the amount of light irradiation on the photovoltaic device. Even if there occurs variation in the amount of light irradiation on the photovoltaic device, the photovoltaic system restrains an imbalance between the irradiated area and the area taken up by the operating unitary power generation sections (cluster power generation sections, photovoltaic devices) and thus realizes efficient power generation.

In the photovoltaic system in accordance with the present invention, at least two photovoltaic devices in accordance with the present invention may be connected in parallel, the specific connection points may have an identical arrangement in the photovoltaic devices, and the specific connection points may be connected together to link the photovoltaic devices.

According to the configuration, the photovoltaic system in accordance with the present invention restrains the adverse effect of variation in the amount of light irradiation on the unitary power generation sections provided between the specific connection points.

A vehicle in accordance with the present invention includes a body and a photovoltaic device in accordance with the present invention installed on a surface of the body.

According to the configuration, the vehicle in accordance with the present invention prevents the adverse effect of variation in light irradiation (sunlight) on the photovoltaic device. Even if there occurs variation in the amount of light irradiation on the photovoltaic device, the vehicle restrains an imbalance between the irradiated area and the area taken up by the operating unitary power generation sections (cluster power generation sections, photovoltaic device) and thus realizes efficient power generation. In addition, the vehicle supplies generated electric power to a vehicle power supply while restraining the adverse effect of variation in the amount of light irradiation.

A photovoltaic device in accordance with the present invention prevents the adverse effect of variation in light irradiation (sunlight) which may only occur at a specific series stage (e.g., a local reduction in light irradiation on the unitary power generation sections caused by a shadow). Even if there occurs variation in the amount of light irradiation, the photovoltaic device restrains an imbalance between the irradiated area and the area taken up by the operating unitary power generation sections and thus realizes efficient power generation.

A photovoltaic system in accordance with the present invention prevents the adverse effect of variation in the amount of light irradiation on the photovoltaic device. Even if there occurs variation in the amount of light irradiation on the photovoltaic device, the photovoltaic system restrains an imbalance between the irradiated area and the area taken up by the operating unitary power generation sections (cluster power generation sections, photovoltaic device) and thus realizes efficient power generation.

A vehicle in accordance with the present invention prevents the adverse effect of variation in light irradiation (sunlight) on the photovoltaic device. Even if there occurs variation in the amount of light irradiation on the photovoltaic device, the vehicle restrains an imbalance between the irradiated area and the area taken up by the operating unitary power generation sections (cluster power generation sections, photovoltaic device) and thus realizes efficient power generation. In addition, the vehicle supplies generated electric power to a vehicle power supply while restraining the adverse effect of variation in the amount of light irradiation.

BRIEF DESCRIPTION OF THE DRAWINGS

FIG. 15B is a plan view illustrating, in a simplified manner, the arrangement of unitary power generation sections in a cluster power generation section applied to a photovoltaic device according to embodiment 15 of the present invention.

FIG. 15C is a plan view illustrating, in a simplified manner, the arrangement of unitary power generation sections in a cluster power generation section applied to a photovoltaic device according to embodiment 15 of the present invention.

FIG. 15D is a plan view illustrating, in a simplified manner, the arrangement of unitary power generation sections in a cluster power generation section applied to a photovoltaic device according to embodiment 15 of the present invention.

FIG. 17A is a plan view illustrating, in a simplified manner, the arrangement of unitary power generation sections in a cluster power generation section applied to a photovoltaic device according to embodiment 17 of the present invention.

FIG. 17B is a plan view illustrating, in a simplified manner, the arrangement of unitary power generation sections in a cluster power generation section applied to a photovoltaic device according to embodiment 17 of the present invention.

FIG. 17C is a plan view illustrating, in a simplified manner, the arrangement of unitary power generation sections in a cluster power generation section applied to a photovoltaic device according to embodiment 17 of the present invention.

FIG. 19A is a plan view illustrating, in a simplified manner, the arrangement of unitary power generation sections in a cluster power generation section applied to a photovoltaic device according to embodiment 19 of the present invention.

FIG. 19B is a plan view illustrating, in a simplified manner, the arrangement of unitary power generation sections in a cluster power generation section applied to a photovoltaic device according to embodiment 19 of the present invention.

DETAILED DESCRIPTION OF THE INVENTION

Referring to drawings, the following will describe embodiments of the present invention.

Embodiment 1

A photovoltaic device 1 in accordance with the present embodiment will be described in reference to FIGS. 1A to 1F.

Figure 1A:
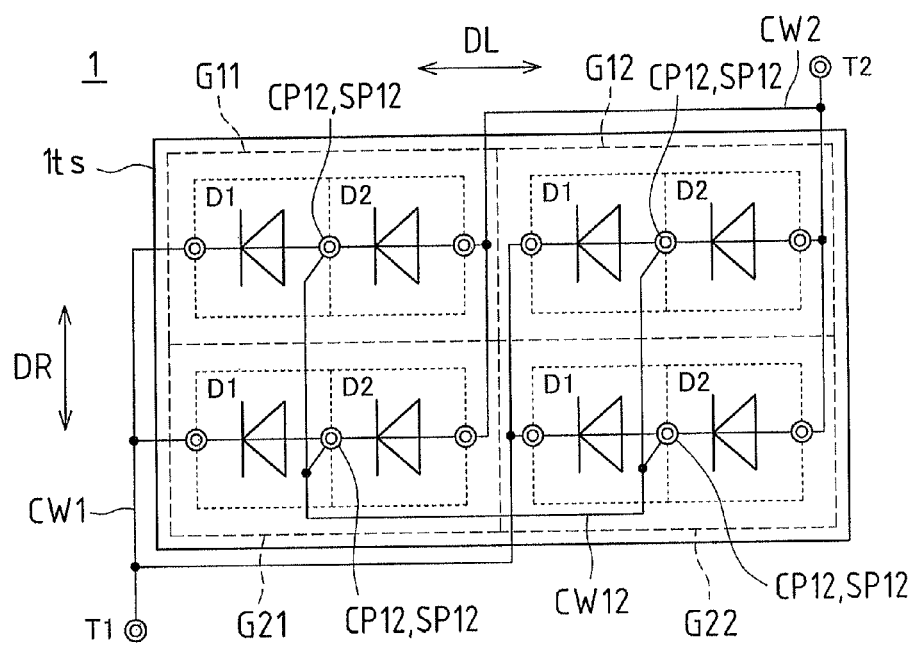
FIG. 1A is a plan view schematically illustrating the arrangement and connections of unitary power generation sections in a photovoltaic device according to embodiment 1 of the present invention.

FIG. 1A is a plan view schematically illustrating the arrangement and connections of unitary power generation sections in a photovoltaic device 1 according to embodiment 1 of the present invention.

Figure 1B:
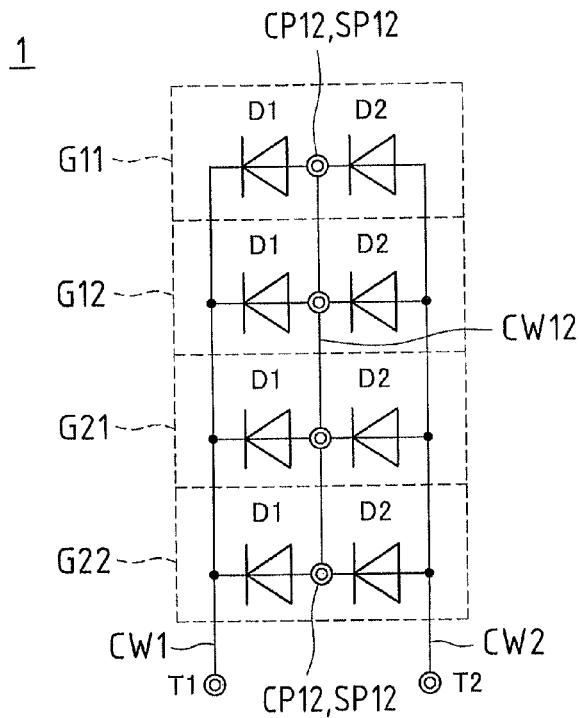
FIG. 1B is an equivalent circuit diagram illustrating, as an equivalent circuit, the connections of the unitary power generation sections in the photovoltaic device shown in FIG. 1A.

FIG. 1B is an equivalent circuit diagram illustrating, as an equivalent circuit, the connections of the unitary power generation sections in the photovoltaic device 1 shown in FIG. 1A.

The photovoltaic device 1 in accordance with the present embodiment includes unitary power generation sections D1 and D2 (hereinafter, may be simply referred to as "unitary power generation sections D" when it is not necessary to distinguish between them individually) which convert light to electricity for power generation. The unitary power generation sections D are represented by diode symbols to indicate directionality.

Each unitary power generation section D is either a single photovoltaic element or a compound photovoltaic element in which photovoltaic elements are connected in series or in parallel. Therefore, in the photovoltaic device 1, the unitary power generation section D is configured to exhibit necessary electrical characteristics by choosing (selecting or combining) proper photovoltaic elements. Note that the photovoltaic element produces unitary electromotive force determined by its inherent physical properties (characteristics) and is made of, for example, a silicon solar cell.

If silicon solar cells are used as individual photovoltaic elements (each pn junction forms a silicon solar cell), the unitary power generation section D achieves an approximately 0.5 V to 0.7 V output (voltage). Nine of such unitary power generation sections D, when connected in series (see embodiment 2 and FIGS. 2A and 2B), achieve an approximately 4 V to 6 V output (voltage).

If a plurality of silicon solar cells are connected in series to form a compound photovoltaic element, an output voltage which is proportional to the number of the series-connected silicon solar cells is obtained. By contrast, if a plurality of silicon solar cells are connected in parallel to form a compound photovoltaic element, the obtained output corresponds to an electric current proportional to the number of the parallel-connected silicon solar cells.

Note that the solar cell and the silicon solar cell are given as examples in the present invention. These examples are, however, by no means limiting the invention. The present invention is applicable to any photovoltaic element which produces a like effect.

The photovoltaic device 1 includes a cluster power generation section G11 in which a series circuit is formed by connecting the two unitary power generation sections D1 and D2 in series via a connection point CP12. The photovoltaic device 1 also includes cluster power generation sections G12, G21, and G22 each of which is configured identically to the cluster power generation section G11

(hereinafter, the cluster power generation sections G11, . . . , and G22 may be simply referred to as the "cluster power generation sections G" when it is not necessary to distinguish between them individually).

The cluster power generation sections G11, G12, G21, and G22 are connected to a device terminal T1 via connection wiring CW1 and also to a device terminal T2 via connection wiring CW2, so as to form a parallel circuit. The photovoltaic device 1 hence includes four (2 rows by 2 columns=4 as in a matrix) parallel-connected cluster power generation sections G in each of which there are provided two series-connected unitary power generation sections D as a power generation circuit (series circuit). The solar-generated electric power is taken out via the device terminals T1 and T2.

The unitary power generation sections D1 and D2 are arranged in the row direction DL of the cluster power generation sections G (planar arrangement). Alternatively, the unitary power generation sections D may be arranged in the column direction DR, not in the row direction DL, which provides another form of planar arrangement.

The cluster power generation sections G11, . . . , and G22 are arranged at least either in the row direction DL or in the column direction DR. Specifically, the cluster power generation sections G11 and G12 are arranged in the row direction DL (in the first row of the cluster power generation sections G), and the cluster power generation sections G21 and G22 are arranged in the row direction DL (in the second row of the cluster power generation sections G). Furthermore, the cluster power generation sections G11 and G21 are arranged in the column direction DR (in the first column of the cluster power generation sections G), and the cluster power generation sections G12 and G22 are arranged in the column direction DR (in the second column of the cluster power generation sections G).

In the present embodiment, the cluster power generation sections G are aligned both in the row direction DL and in the column direction DR as in a matrix. Alternatively, for example, those cluster power generation sections G which are adjacent to each other in the row direction (or in the column direction DR) may be slightly shifted relatively in position. In other words, the cluster power generation sections G may be aligned at least either in the row direction DL or in the column direction DR. Note that the same description applies to embodiments detailed below.

In the photovoltaic device 1, the connection point CP12 in the cluster power generation section G11 is connected to the connection points CP12 in the other cluster power generation sections G (G12, G21, and G22) via the connection wiring CW12. In other words, the connection point CP12 in each cluster power generation section G is designated as a specific connection point SP12 which is predetermined from among connection points CP12 (there is only one connection point CP12 in the present embodiment), and connected to the similarly designated specific connection points SP12 in the other cluster power generation sections G. In the photovoltaic device 1 in accordance with the present embodiment, since each cluster power generation section G has only one connection point CP12, the connection point CP12 is the connection point (between the unitary power generation sections D1 and D2) for that cluster power generation section G. Hence, all the connection points CP12 are designated as specific connection points SP12.

As described above, the photovoltaic device 1 in accordance with the present embodiment includes the parallel-connected cluster power generation sections G (G11, G12, G21, and G22) arranged at least either in the row direction DL or in the column direction DR. Each of the cluster power generation sections G in turn includes the unitary power generation sections D (D1 and D2), for converting light to electricity for power generation, which are connected in series via the connection point CP12. Furthermore, the cluster power generation sections G are each provided with a specific connection point SP12 which is predetermined from among connection points CP12, and the specific connection points SP12 are connected to link the cluster power generation sections G.

Hence, in the photovoltaic device 1 in accordance with the present embodiment, the cluster power generation sections G (G11, G12, G21, and G22) formed by the series-connected unitary power generation sections D (D1 and D2) are connected together in parallel at a specific stage (via the specific connection points SP, e.g., SP12), so that the unitary power generation sections D located at particular positions (e.g., the unitary power generation sections D1 in the leftmost cluster power generation sections G11 and G21 in FIG. 1A) can be in effect distributed (the other unitary power generation sections D1 than those in the leftmost cluster power generation sections G11 and G21). The configuration prevents the adverse effect of variation in light irradiation (sunlight) which may only occur at a specific series stage (e.g., a local reduction in light irradiation on the unitary power generation sections D (e.g., the leftmost unitary power generation sections D1 located at the same position in terms of the row direction DL) caused by a shadow). Furthermore, even if there occurs variation in the amount of light irradiation, the configuration restrains an imbalance between the irradiated area and the area taken up by the operating unitary power generation sections D. The configuration thus realizes efficient power generation. Note that as will be described at the end of the present embodiment, these functions and effects are similarly achieved with the cluster power generation sections G which are aligned neither in the row direction DL nor in the column direction DR.

Next will be described a power generation state (effect) when a very large variation in the amount of light irradiation is causing extremely low light irradiation on a unitary power generation section D at a certain position (e.g., the unitary power generation section D1 in the cluster power generation section G21). In other words, a power generation state for the case where the photovoltaic device 1 has its light-receiving face partly shielded by, for example, a sunlight-blocking obstacle and is thereby partly shaded (partial shadow) will be described.

A concrete example of partial shadow (shadow condition example 1) will be described where the light irradiation on the unitary power generation section D2 in the cluster power generation section G11 and the unitary power generation section D1 in the cluster power generation section G12 is too low for the unitary power generation sections D1 and D2 to operate (generate electric power) effectively. The unitary power generation sections D as a whole provide eight equal light-receiving areas (corresponding to the eight unitary power generation sections D), and six of them are actually receiving light (irradiated area). As a result, in shadow condition example 1, the irradiated area rate is equal to 6/8 (=0.75 or 75%) for the eight unitary power generation sections D.

In a power generation circuit formed by a conventional photovoltaic device in which there are provided four parallel-connected cluster power generation sections G in each of which there are provided two series-connected unitary power generation sections D with no connection wiring CW12 (comparative conventional example 1), one (unitary power generation section D2) of the two unitary power generation sections D1 and D2 which correspond to the cluster power generation section G11 does not operate. That limits the electric current in the entire series-connected circuits which correspond to the cluster power generation section G11, and hence limits the operation of the entire power generation circuit (cluster power generation section G11). The series circuit (power generation circuit) which corresponds to the cluster power generation section G11 practically does not operate. Similarly, the series circuit (power generation circuit) which corresponds to the cluster power generation section G12 practically does not operate.

In other words, in comparative conventional example 1, practically, only the cluster power generation sections G21 and G22 contribute to electric power generation. The unitary power generation section D1 in the cluster power generation section G11 and the unitary power generation section D2 in the cluster power generation section G12, despite being in the sun, make little contribution to electric power generation.

In the photovoltaic device 1 of shadow condition example 1, in contrast to comparative conventional example 1, the connection points CP12 provided between the unitary power generation sections D1 and D2 in the parallel-connected cluster power generation sections G11, G12, G21, and G22 are connected together via the connection wiring CW12. As a result, the unitary power generation section D1 in the cluster power generation section G11 and the unitary power generation section D2 in the cluster power generation section G12, which are in the sun, can contribute to electric power generation even if the unitary power generation section D2 in the cluster power generation section G11 and the unitary power generation section D1 in the cluster power generation section G12 do not operate due to partial shadow.

Figure 1C:
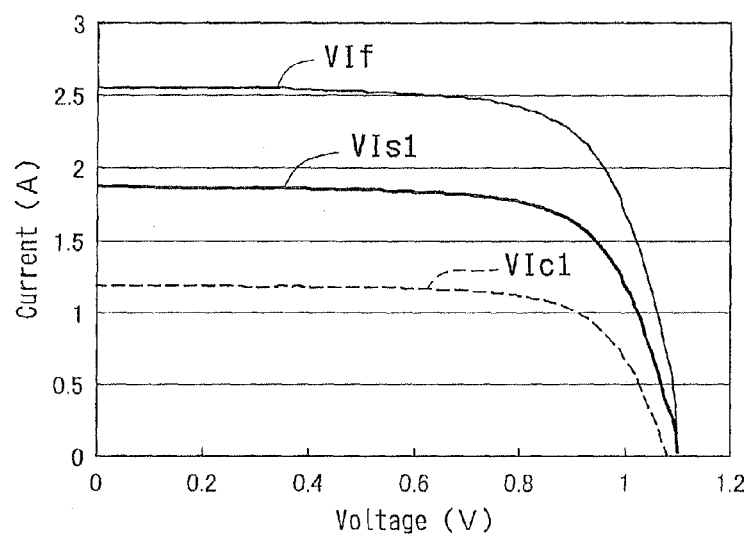
FIG. 1C is a graph, drawn by plotting current versus voltage, which represents an example of voltage dependency of output current of the photovoltaic device 1 shown in FIG. 1A. The graph shows a characteristic for the case where the entire face is in the sun as an entire-face-irradiated current characteristic and a characteristic for the case of shadow condition example 1 as a shadow condition current characteristic, as well as a characteristic for the case of comparative conventional example 1 as a comparative conventional current characteristic for comparative purposes.
Figure 1D:
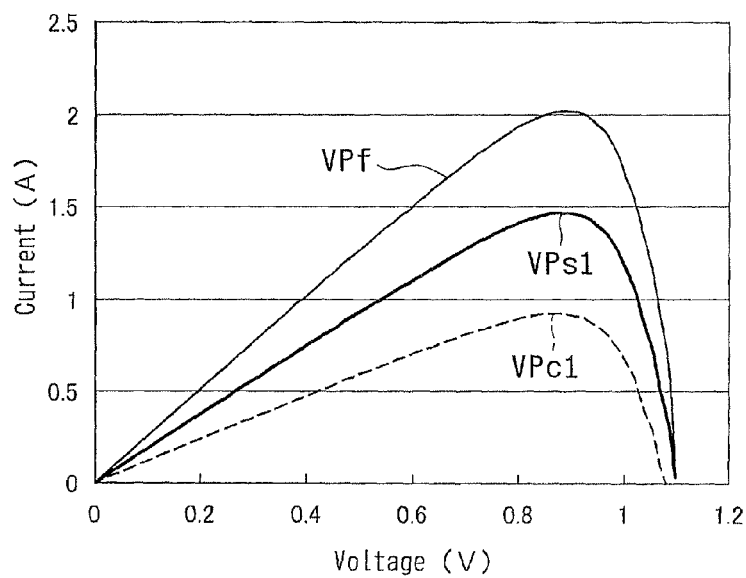
FIG. 1D is a graph prepared from the current versus voltage graph shown in FIG. 1C by plotting electric power versus voltage. The graph shows a characteristic for the case where the entire face is in the sun as an entire-face-irradiated power characteristic and a characteristic for the case of shadow condition example 1 as a shadow condition power characteristic, as well as a characteristic for the case of comparative conventional example 1 as a comparative conventional power characteristic for comparative purposes.

FIGS. 1C and 1D show exemplary results of measurement of output characteristics of the photovoltaic device 1 including the connection wiring CW12 in shadow condition example 1 and output characteristics in comparative conventional example 1 in which there is provided no connection wiring CW12.

FIG. 1C is a graph, drawn by plotting current versus voltage, which represents an example of voltage dependency of output current of the photovoltaic device 1 shown in FIG. 1A. The graph shows a characteristic for the case where the entire face is in the sun as an entire-face-irradiated current characteristic VIf and a characteristic for the case of shadow condition example 1 as a shadow condition current characteristic VIs1, as well as a characteristic for the case of comparative conventional example 1 as a comparative conventional current characteristic VIc1 for comparative purposes.

The horizontal axis indicates generated voltage, the vertical axis indicates generated current, and the three cases (entire face irradiation/shadow condition example 1/comparative conventional example 1) are represented by parameters. The current is large according to the entire-face-irradiated current characteristic VIf, small according to the comparative conventional current characteristic VIc1, and smaller according to the shadow condition current characteristic VIs1 than according to the entire-face-irradiated current characteristic VIf, but larger than according to the comparative conventional current characteristic VIc1.

Note that the short-circuit current value (current at zero voltage) in shadow condition example 1 (shadow condition current characteristic VIs1) is about ¾ that of the entire-face-irradiated current characteristic VIf because there are three irradiated equivalent parallel circuits in the cluster power generation sections G. By contrast, the short-circuit current value in comparative conventional example 1 (comparative conventional current characteristic VIc1) is about half (2/4) that of the entire-face-irradiated current characteristic VIf because there are two irradiated equivalent parallel circuits in the cluster power generation sections G.

FIG. 1D is a graph prepared from the current versus voltage graph shown in FIG. 1C by plotting electric power versus voltage. The graph shows a characteristic for the case where the entire face is in the sun as an entire-face-irradiated power characteristic VPf and a characteristic for the case of shadow condition example 1 as a shadow condition power characteristic VPs1, as well as a characteristic for the case of comparative conventional example 1 as a comparative conventional power characteristic VPc1 for comparative purposes.

The horizontal axis indicates generated voltage, the vertical axis indicates generated power, and the three cases (entire face irradiation/shadow condition example 1/comparative conventional example 1) are represented by parameters. The generated power is large according to the entire-face-irradiated power characteristic VPf, small according to the comparative conventional power characteristic VPc1, and smaller according to the shadow condition power characteristic VPs1 than according to the entire-face-irradiated power characteristic VPf, but larger than according to the comparative conventional power characteristic VPc1.

Specifically, the entire-face-irradiated power characteristic VPf has a peak output value of about 2.03 W. By contrast, the comparative conventional power characteristic VPc1 has a peak output value of only about 0.92 W, which is 46% of the electric power produced when the entire face is in the sun, despite of the fact that 75% of the light-receiving area is in the sun. This low peak output value is a result of the cluster power generation sections G11 and G12 failing to make any contribution in power generation. Practically, it is only the cluster power generation sections G21 and G22 which are generating electric power.

Note that the comparative conventional power characteristic VPc1 has an output which is somewhat lower than half the output produced when the entire face is in the sun, despite the fact that two of the four cluster power generation sections G are generating electric power. This is a result of the generated current partly flowing in the reverse direction from the cluster power generation sections G21 and G22 which are contributing to electric power generation to the cluster power generation sections G11 and G12 which are not contributing to electric power generation. This reverse flow is preventable if there is provided a reverse flow prevention diode at the output end of each cluster power generation section G. The provision of the diode would, however, cause a loss as generated current passes through the diode.

Meanwhile, the shadow condition power characteristic VPs1 has a peak output value of about 1.47 W, which is 59% larger than the peak output value (0.92 W) for the comparative conventional power characteristic VPc1. In addition, the about 1.47 W output is 73% (¾) of the peak value for the entire-face-irradiated power characteristic VPf, which is very close to the irradiated area rate.

In other words, because of the provision of the connection wiring CW12, the portions of the photovoltaic device 1 which are in the sun are composed, in the equivalent circuit, of the (three) parallel-connected unitary power generation sections D1 in the cluster power generation sections G11, G21, and G22 and the (three) parallel-connected unitary power generation sections D2 in the cluster power generation sections G12, G21, and G22, the unitary power generation section D1 being connected in series with the unitary power generation section D2. In other words, the portions are composed of the same number of unitary power generation sections D1 and D2 being connected in series. Therefore, none of the unitary power generation sections D in the sun is constrained in its output by the unitary power generation sections D which do not operate due to the partial shadow. The photovoltaic device 1 is thus capable of highly efficient power generation.

In other words, the provision of the connection wiring CW12 enables an output rate (a rate of actual output to the output produced when the entire face is in the sun) close to the irradiated area rate as long as the same number of unitary power generation sections D1 and D2 are in the sun, in whichever cluster power generation sections G the unitary power generation sections D are provided. Note that if many unitary power generation sections D are connected in parallel, the photovoltaic device 1 operates in a similar manner even when unequal numbers of unitary power generation sections D1 and D2 are in the sun (see, for example, embodiment 2).

Therefore, the photovoltaic device 1 is similarly capable of highly efficient power generation, for example, when the unitary power generation section D2 in the cluster power generation section G21 and the unitary power generation section D1 in the cluster power generation section G22 are shaded or when the unitary power generation section D1 in the cluster power generation section G11 and the unitary power generation section D2 in the cluster power generation section G12 are shaded.

Another concrete example of partial shadow (shadow condition example 2) will be described next where the light irradiation on the unitary power generation section D1 in the cluster power generation section G11 and the unitary power generation section D1 in the cluster power generation section G21 is too low for the unitary power generation sections D1 to operate (generate electric power) effectively. The unitary power generation sections D as a whole provide eight equal light-receiving areas (corresponding to the eight unitary power generation sections D), and six of them are actually receiving light (irradiated area). As a result, in shadow condition example 2, the irradiated area rate is equal to $6/8$ (=0.75 or 75%) for the eight unitary power generation sections D, similarly to the shadow condition example 1.

In a power generation circuit formed by a conventional photovoltaic device in which there are provided four parallel-connected cluster power generation sections G in each of which there are provided two series-connected unitary power generation sections D with no connection wiring CW12 (comparative conventional example 2), one (unitary power generation section D1) of the two unitary power generation sections D1 and D2 which correspond to the cluster power generation section G11 does not operate. That limits the electric current in the entire series-connected circuit which corresponds to the cluster power generation section G11, and hence limits the operation of the entire power generation circuit (cluster power generation section G11). The series circuit (power generation circuit) which corresponds to the cluster power generation section G11 practically does not operate. Similarly, the series circuit (power generation circuit) which corresponds to the cluster power generation section G21 practically does not operate.

In other words, in comparative conventional example 2, practically, only the cluster power generation sections G12 and G22 contribute to electric power generation. The unitary power generation section D2 in the cluster power generation section G11 and the unitary power generation section D2 in the cluster power generation section G21, despite being in the sun, make little contribution to electric power generation.

In the photovoltaic device 1 of shadow condition example 2, in contrast to comparative conventional example 2, the connection points CP12 provided between the unitary power generation sections D1 and D2 in the parallel-connected cluster power generation sections G11, G12, G21, and G22 are connected together via the connection wiring CW12. As a result, the unitary power generation section D2 in the cluster power generation section G11 and the unitary power generation section D2 in the cluster power generation section G21, which are in the sun, can contribute to electric power generation even if the unitary power generation section D1 in the cluster power generation section G11 and the unitary power generation section D1 in the cluster power generation section G21 do not operate due to partial shadow.

In shadow condition example 2, the portions in the sun are composed, in the equivalent circuit, of the four parallel-connected unitary power generation sections D2 and the two parallel-connected unitary power generation sections D1, the unitary power generation sections D2 and D1 being connected in series. Therefore, there is an imbalance in irradiated area between the series stages. Although the four unitary power generation sections D2 are all in the sun, they are limited in current by the unitary power generation sections D1 only two of which are in the sun. The power generation efficiency is therefore lower in shadow condition example 2 than in shadow condition example 1.

However, similarly to shadow condition example 1, the power generation efficiency is still higher in shadow condition example 2 than in comparative conventional example 2. In other words, since the unitary power generation section D2 in the cluster power generation section G11 and the unitary power generation section D2 in the cluster power generation section G21 contribute to electric power generation, the resultant amount of generated power is greater in shadow condition example 2 than in comparative conventional example 2 where there is provided no connection wiring CW12.

Figure 1E:
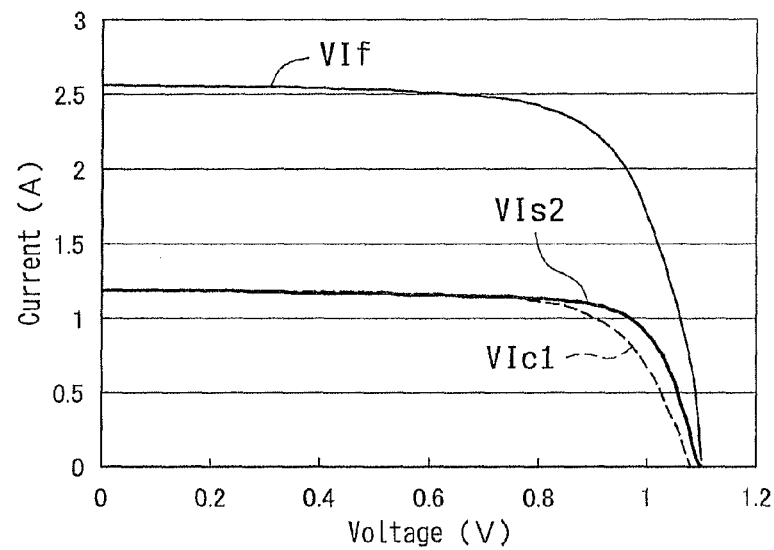
FIG. 1E is a graph, drawn by plotting current versus voltage, which represents an example of voltage dependency of output current of the photovoltaic device 1 shown in FIG. 1A. The graph shows a characteristic for the case where the entire face is in the sun as an entire-face-irradiated current characteristic and a characteristic for the case of shadow condition example 2 as a shadow condition current characteristic, as well as a characteristic for the case of comparative conventional example 2 as a comparative conventional current characteristic for comparative purposes.
Figure 1F:
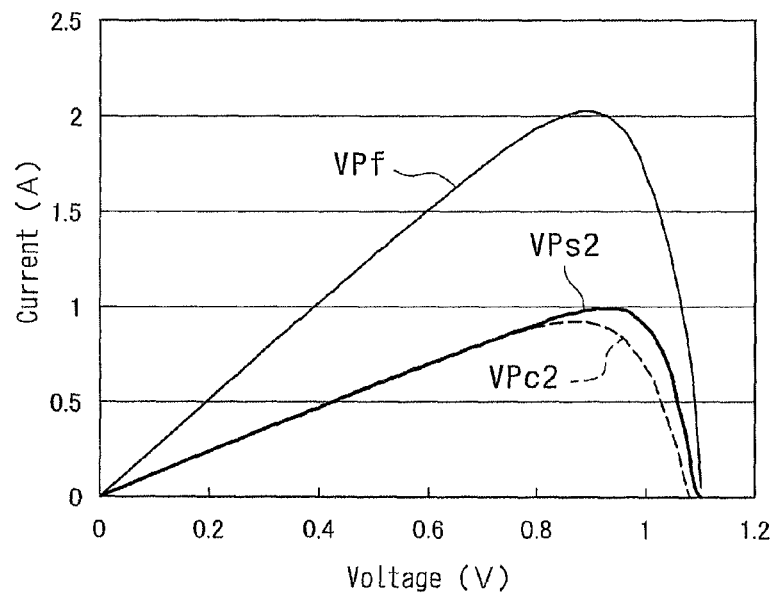
FIG. 1F is a graph prepared from the current versus voltage graph shown in FIG. 1E by plotting electric power versus voltage. The graph shows a characteristic for the case where the entire face is in the sun as an entire-face-irradiated power characteristic and a characteristic for the case of shadow condition example 2 as a shadow condition power characteristic, as well as a characteristic for the case of comparative conventional example 2 as a comparative conventional power characteristic for comparative purposes.

FIGS. 1E and 1F show exemplary results of measurement of output characteristics of the photovoltaic device 1 including the connection wiring CW12 in shadow condition example 2 and output characteristics in comparative conventional example 2 in which there is provided no connection wiring CW12.

FIG. 1E is a graph, drawn by plotting current versus voltage, which represents an example of voltage dependency of output current of the photovoltaic device 1 shown in FIG. 1A. The graph shows a characteristic for the case where the entire face is in the sun as an entire-face-irradiated current characteristic VIf and a characteristic for the case of shadow condition example 2 as a shadow condition current characteristic VIs2, as well as a characteristic for the case of comparative conventional example 2 as a comparative conventional current characteristic VIc2 for comparative purposes. Note that the entire-face-irradiated current characteristic VIf in FIG. 1E is similar to the entire-face-irradiated current characteristic VIf in FIG. 1C (substantially equal current values).

The horizontal axis indicates generated voltage, the vertical axis indicates generated current, and the three cases (entire face irradiation/shadow condition example 2/comparative conventional example 2) are represented by parameters. The current is large according to the entire-face-irradiated current characteristic VIf, small according to the comparative conventional current characteristic VIc2, and smaller according to the shadow condition current characteristic VIs2 than according to the entire-face-irradiated current characteristic VIf, but larger at some voltages according to the comparative conventional current characteristic VIc2 (differences in details will be described later).

Note that the comparative conventional current characteristic VIc2 in FIG. 1E and the comparative conventional current characteristic VIc1 in FIG. 1C show substantially equal current values because in comparative conventional example 2 where there is provided no connection wiring CW12, practically, only two of the cluster power generation sections G generate power similarly to comparative conventional example 1. In addition, the short-circuit current value in shadow condition example 2 (shadow condition current characteristic VIs2) is about half (¾) that produced when the entire face is in the sun, which is much similar to comparative conventional example 2 (comparative conventional current characteristic VIc2) where there is provided no connection wiring CW12, because there are only two unitary power generation sections D1 in the sun and the current is hence limited.

FIG. 1F is a graph prepared from the current versus voltage graph shown in FIG. 1E by plotting electric power versus voltage. The graph shows a characteristic for the case where the entire face is in the sun as an entire-face-irradiated power characteristic VPf and a characteristic for the case of shadow condition example 2 as a shadow condition power characteristic VPs2, as well as a characteristic for the case of comparative conventional example 2 as a comparative conventional power characteristic VPc2 for comparative purposes.

The horizontal axis indicates generated voltage, the vertical axis indicates generated power, and the three cases (entire face irradiation/shadow condition example 2/comparative conventional example 2) are represented by parameters. The generated power is large according to the entire-face-irradiated power characteristic VPf, small according to the comparative conventional power characteristic VPc2, and smaller according to the shadow condition power characteristic VPs2 than according to the entire-face-irradiated power characteristic VPf, but larger at some voltages than according to the comparative conventional power characteristic VPc2 (differences in details will be described later).

Specifically, where there is provided no connection wiring CW12, the unitary power generation section D2 in the cluster power generation section G11 and the unitary power generation section D2 in the cluster power generation section G21 make little contribution to electric power generation. In contrast, where there is provided connection wiring CW12, since the unitary power generation section D2 in the cluster power generation section G11 and the unitary power generation section D2 in the cluster power generation section G21 can contribute to electric power generation, the shadow condition current characteristic VIs2 shows larger electric current at approximately 0.8 V or greater voltages than in comparative conventional example 2 (comparative conventional current characteristic VIc2).

In addition, as a result of larger electric current on the shadow condition current characteristic VIs2, the shadow condition power characteristic VPs2 shows a greater peak electric power value than the comparative conventional power characteristic VPc2, achieving an electric power of 0.99 W. This is an approximately 8% higher output than the peak electric power value of the comparative conventional current characteristic VIc2.

A further concrete example of partial shadow (shadow condition example 3) will be described next where the unitary power generation sections D1 and D2 in the cluster power generation section G11 are shaded. In shadow condition example 3, since the cluster power generation sections G12, G21, and G22 are not shaded, the unitary power generation sections D in the cluster power generation sections G12, G21, and G22 are capable of ordinary output regardless of the presence/absence of the connection wiring CW12. The photovoltaic device 1 is thus capable of power generation using the three parallel-connected cluster power generation sections G. In other words, the power generation efficiency is substantially equal in the case where there is provided connection wiring CW12 and in the case where there is provided no connection wiring CW12, which enables a highly efficient output close to the irradiated area rate.

As described above, in the present embodiment (the present invention), the provision of the connection wiring CW12 enables comparable power generation efficiency in shadow condition example 3 and higher power generation efficiency in shadow condition examples 1 and 2 than in the case where there is provided no connection wiring CW12. In other words, a higher output is ensured for various states (shapes) of partial shadow, and higher power generation efficiency is achieved as an expected value.

A further description will be given to further explain the technical features of the present embodiment (the present invention).

A feature of the present embodiment (the present invention) is found where in connecting at least two unitary power generation sections (assume, for example, that one unitary power generation section D1 is provided in each cluster power generation section G11, G12, G21, and G22 (four unitary power generation sections D1 in total) and also that similarly, one unitary power generation section D2 is provided in each cluster power generation section G11, G12, G21, and G22 (four unitary power generation sections D2 in total)) in series so as to form a photovoltaic device (photovoltaic device 1), the unitary power generation sections are not simply series-connected to form a photovoltaic device, but connected in a unique manner. Specifically, in grouping the unitary power generation sections (into the unitary power generation section D1 in the cluster power generation sections G11, G12, G21, and G22 and the unitary power generation section D2 in the cluster power generation sections G11, G12, G21, and G22) for parallel connection and connecting unitary power generation sections (e.g., the unitary power generation sections D1 and D2 in the cluster power generation section G11) in series, multiple positions are employed in two-dimensionally arranging each series stage (e.g., the first stage and the second stage) of the unitary power generation sections (e.g., the unitary power generation sections D1 in the cluster power generation sections G11, G12, G21, and G22) which are connected in parallel in the equivalent circuit diagram according to the division.

Partial shadow, created by a sunlight-blocking obstacle, is more often cast over a specific part of a light-receiving face than the other parts. Therefore, if unitary power generation sections with a large area are connected in series without any modification, a particular series stage is more likely to be shaded than the other stages. In a series circuit, since the stage for the unitary power generation section with the smallest irradiated area (the stage for the unitary power generation section with the largest shaded area) limits current, partial shadow will likely cause a large reduction in the output of the series circuit.

In contrast, in the present embodiment, as described above, the series stages (e.g., two stages (two series-connected elements)) are divided (to form, for example, four parallel-connected elements), and multiple positions of the series stages is employed in the planar layout (e.g., the unitary power generation sections D1 in the first stage are arranged so as to be distributed to four positions). Therefore, it is less likely that a particular series stage is shaded more often than the other stages when general partial shadow is cast.

In other words, the configuration restrains difference in irradiated area (i.e., the sum area of the irradiated unitary power generation sections in a series stage) which could arise between the series stages. The configuration also restrains reductions in power generation efficiency which could arise from a difference (imbalance) in irradiated area between different series stages.

For a convenient description and better understanding of the present embodiment, FIG. 1A shows a photovoltaic device 1 including two by two cluster power generation sections G (two in lengthwise direction and two in widthwise direction), and relatively simple partial shadow (shadow condition examples 1, 2, and 3) is taken as examples. However, this is by no means intended to limit the photovoltaic device 1 of the present embodiment. Alternatively, more cluster power generation sections G can be accommodated by using unitary power generation sections D which are smaller than the area of the light-receiving section. For example, the size of the unitary power generation section D shown in FIG. 1A may be further divided in half both in the lengthwise direction and in the widthwise direction to replace the unitary power generation section D with four by four (=16) cluster power generation sections G.

If the photovoltaic device 1 includes many parallel-connected cluster power generation sections G as described above, it is more likely that the partial shadow, which may have various shapes, is cast equally covering multiple series stages. As a result, it is more likely that the irradiated area is more equalized across the series stages. The configuration restrains an imbalance in output between the series stages and increases the output rate (of actual output to the output produced when the entire face is in the sun) toward the irradiated area rate. In other words, the configuration improves expected output (generated power) for partial shadow of various shapes.

In the configuration, it is important to provide many parallel-connected cluster power generation sections G and provide connection wiring CW which connects the series connections (connection points CP) of the unitary power generation sections D in the cluster power generation sections G. According to the configuration, since all the unitary power generation sections D in the sun are connected both in series and in parallel, no part of the power generation circuit (output path, power generation path) is disconnected by a unitary power generation section D over which partial shadow is cast, over no matter which part of the light-receiving face the partial shadow may be cast and no matter what shape the partial shadow may have. Therefore, all the unitary power generation sections D can contribute to power generation output.

By increasing the number of parallel-connected cluster power generation sections G, the irradiated area of the series stages, i.e., the sum area of the unitary power generation sections D for the series stages, can be more equalized across the series stages. In addition, if the sum area of the unitary power generation sections D is not completely equal, the output is limited by the series stage with the smallest irradiated area; as described in relation to shadow condition example 2, however, the output can be made greater than in the case where there is provided no connection wiring CW.

To describe another effect (no bypass diode is needed) of the photovoltaic device 1, assume, as an example, that k unitary power generation sections D ("k" may be referred to as a "series-connected element count") are connected only in series (no parallel connection provided) to form a cluster power generation section G. Here, each unitary power generation section D is either a single photovoltaic element or parallel-connected photovoltaic elements. In a conventional cluster power generation section G in which unitary power generation sections D are connected only in series (no parallel connection provided) with one of the unitary power generation sections D being out of the sun and hence out of operation (no power being generated), a maximum sum output voltage of the operating (power generating) unitary power generation sections D is given as $(k-1) \times Voc$, where Voc is the open voltage of the unitary power generation section D, and Vp is the reverse withstand voltage of the unitary power generation section D.

In other words, if the reverse withstand voltage Vp exceeds $(k-1) \times Voc$, and the anode and cathode of the cluster power generation section G are short-circuited to eliminate any potential difference, the reverse voltage across the non-operating (non-power-generating) unitary power generation section D is given as $(k-1) \times Voc$. This is lower than the reverse withstand voltage Vp and does not cause breakdown. On the other hand, if the reverse withstand voltage Vp is less than or equal to $(k-1) \times Voc$, the voltage (output voltage) generated by the operating (power generating) unitary power generation sections D is applied across the non-operating (non-power-generating) unitary power generation section D as a reverse voltage which is greater than or equal to its reverse withstand voltage Vp. Therefore, the cluster power generation section G in this situation can generate power with an output voltage of less than or equal to $(k-1) \times Voc - Vp$. In this situation, a reverse current keeps flowing through the non-operating (non-power-generating) unitary power generation section D. The single non-power-generating unitary power generation section D may be damaged due to heating (hot spot) in the worst case scenario. Hot spots are more likely to occur with a greater series-connected element count k and pose a more serious problem with higher output voltage. A conventional technique to prevent hot spots from happening is to connect a bypass diode for every n series-connected unitary power generation sections D, where n satisfies a withstand voltage calculation formula, $Vp > (n-1) \times Voc$.

In the photovoltaic device 1 in accordance with the present embodiment, the connection points CP12 are designated as specific connection points SP12, and the unitary power generation sections D are connected in parallel to link the cluster power generation sections G, so that the unitary power generation sections D in each series stage are distributed in the planar layout over the light-receiving face. Each unitary power generation section D is located close to unitary power generation sections D in other series stages. If an obstacle blocks sunlight and partially shades the light-receiving face of the photovoltaic device 1, the resultant shadow typically falls more often on a particular part of the light-receiving face than on the other parts as a result of the shape of the obstacle. Therefore, it is less likely that only those unitary power generation sections D in a particular series stage are selectively shaded completely by the partial shadow.

Especially, if more cluster power generation sections G are provided, the unitary power generation sections D in the same series stage are more distributed and far less likely to be covered with the partial shadow. Therefore, the photovoltaic device 1 is practically free from hot spots and capable of, without using a bypass diode, preventing the unitary power generation sections D from being damaged by a hot spot.

The description related to bypass diodes has assumed that the unitary power generation section D is either a single photovoltaic element or parallel-connected photovoltaic elements. If photovoltaic elements are connected in series to form a unitary power generation section D, the series-connected element count n may be set to satisfy a condition which restrains hot spots in a simple series circuit (hot spot preventing condition): namely, $V_p > (n-1) \times V_{oc}$ (withstand voltage calculation formula). This configuration eliminates the need to provide a bypass diode and is hence capable of preventing damage due to a hot spot.

According to the configuration, the cluster power generation section G is formed by connecting photovoltaic elements in series and further connecting resultant unitary power generation sections D in series. Therefore, when the cluster power generation section G is composed of m series-connected unitary power generation sections D, even if the series-connected element count of each unitary power generation section D is reduced to n (to satisfy hot spot preventing condition), the actual output voltage of the photovoltaic device 1 is equal to that of n×m series-connected photovoltaic elements. The photovoltaic device 1 is hence capable of achieving high output voltage in accordance with its specifications.

In the photovoltaic device 1, all the connection points CP12 are designated as specific connection points SP12. In other words, the specific connection points SP12 coincide with the connection points CP12 in the present embodiment. Therefore, in the photovoltaic device 1, the directly connected unitary power generation sections D are all connected in parallel. In addition, the parallel-connected unitary power generation sections D in a series stage (e.g., the unitary power generation section D1 in the cluster power generation section G11 and the unitary power generation section D1 in the cluster power generation section G22) are distributed over the light-receiving face (e.g., the positions of the cluster power generation sections G11 and G22), and the unitary power generation sections D in different series stages (e.g., the unitary power generation sections D1 to D9 in the cluster power generation section G11) are located close to each other. Thus, the configuration more effectively restrains the adverse effect of light irradiation on a particular stage and more reliably prevents poor power generation efficiency which could otherwise be caused by variation in the amount of light irradiation.

In the photovoltaic device 1, the unitary power generation sections D in the cluster power generation sections G have the same planar arrangement in all the cluster power generation sections G. Therefore, in the photovoltaic device 1, the series-connected unitary power generation sections D have the same in-plane positions (e.g., the planar arrangement of the unitary power generation sections D1 and D2 in the cluster power generation section G11) in the cluster power generation sections G (e.g., G11, G12, G21, and G22). That realizes a simple layout for the cluster power generation sections G and facilitates the connection of the specific connection points SP between the cluster power generation sections G. In other words, the unitary power generation sections D in the same series stage have the same planar arrangement (planar layout) in all the cluster power generation sections G, regardless of the arrangement (positions) of the cluster power generation sections G.

In the photovoltaic device 1, the cluster power generation sections G, arranged at least either in the row direction DL or in the column direction DR, are mounted and sealed on a transparent substrate 1ts (e.g., glass substrate). Therefore, the photovoltaic device 1 provides an easy-to-handle module by collectively outputting the cluster power generation sections G arranged at least either in the row direction DL or in the column direction DR. The module may be, for example, a solar cell module provided on a single glass substrate.

The function and effect for variation in the amount of light irradiation (e.g., shaded area) will be described more specifically in embodiments 7 to 9.

The technical features of the photovoltaic device 1 in accordance with the present embodiment may be applied to photovoltaic devices 1 in accordance with other embodiments where appropriate.

The present embodiment has described, as an example, the cluster power generation sections G arranged either in the row direction DL or in the column direction DR. However, the cluster power generation sections G are not necessarily aligned linearly in a certain direction. The gist of the invention lies nowhere other than in the distributed arrangement of the cluster power generation sections G on the light-receiving face. When the cluster power generation sections G are to be arranged in a rectangular area as shown in FIG. 1A, the matrix-like arrangement has a secondary effect of achieving an efficient, tightly packed arrangement.

However, the solar cell system 1 (cluster power generation sections G) is not limited to the matrix-like arrangement. For example, when the cluster power generation sections G are to be arranged in an irregular polygonal area, the cluster power generation sections G may have a shape and arrangement which are selected suitably so as to efficiently fill the area.

The unitary power generation sections D1 and D2 belonging to the same cluster power generation section G preferably have a substantially equal light-receiving area, i.e., a substantially equal power generating capability. A difference, if any, is preferably reduced to less than or equal to 10%. Generally, when a plurality of unitary power generation sections D belong to a cluster power generation section G, it is preferable that one of the unitary power generation sections D which has the smallest area has an area not less than 90% of that of one of the unitary power generation sections D which has the largest area, so as to restrain imbalance in power generating capability between series stages and achieve efficient power generation when the photovoltaic device 1 is partly shaded.

That is because a shadow is often localized and the aforementioned configuration causes almost no imbalance between the areas of the series stages localized on the light-receiving face of the photovoltaic device 1 and hence almost no imbalance in irradiated area.

If the unitary power generation section D is composed of, for example, parallel-connected photovoltaic elements, the parallel-connected photovoltaic elements are not necessarily adjacent to each other. When that is the case, the sum area of the photovoltaic elements may be regarded as the area of the unitary power generation section D.

The description so far has primarily dealt with the cluster power generation sections G (G11, G12, G21, and G22) arranged at least either in the row direction DL or in the column direction DR. However, the cluster power generation sections G in the photovoltaic device 1 in accordance with the present embodiment are by no means limited to the linear arrangement. The technical features of the photovoltaic device 1 may be applied to cluster power generation sections G which are distributed not linearly, but two-dimensionally in a non-matrix manner.

In other words, the photovoltaic device 1 may be arranged as follows, in terms of the connections of cluster power generation sections G.

The photovoltaic device 1 in accordance with the present embodiment includes a plurality of cluster power generation sections G, each cluster power generation section G being composed of unitary power generation sections D connected in series via connection points CP, the cluster power generation sections G each having at least a predetermined one of the connection points CP designated as a specific connection point SP, the specific connection points SP being connected together to link the cluster power generation sections G. The photovoltaic device 1 thus defined achieves similar functions and effects to those achieved by the matrix-like arrangement.

In addition, in the photovoltaic device 1 in accordance with the present embodiment, the unitary power generation sections D have a substantially equal light-receiving area in all the cluster power generation sections G as described above.

Embodiment 2

A photovoltaic device 1 in accordance with the present embodiment will be described in reference to FIGS. 2A and 2B. The photovoltaic device 1 in accordance with the present embodiment has a basic configuration similar to that of the photovoltaic device 1 in accordance with embodiment 1 (see FIGS. 1A and 1B). Hence, the same reference numerals will be used where appropriate, and the description will focus on major technical differences.

Figure 2A:
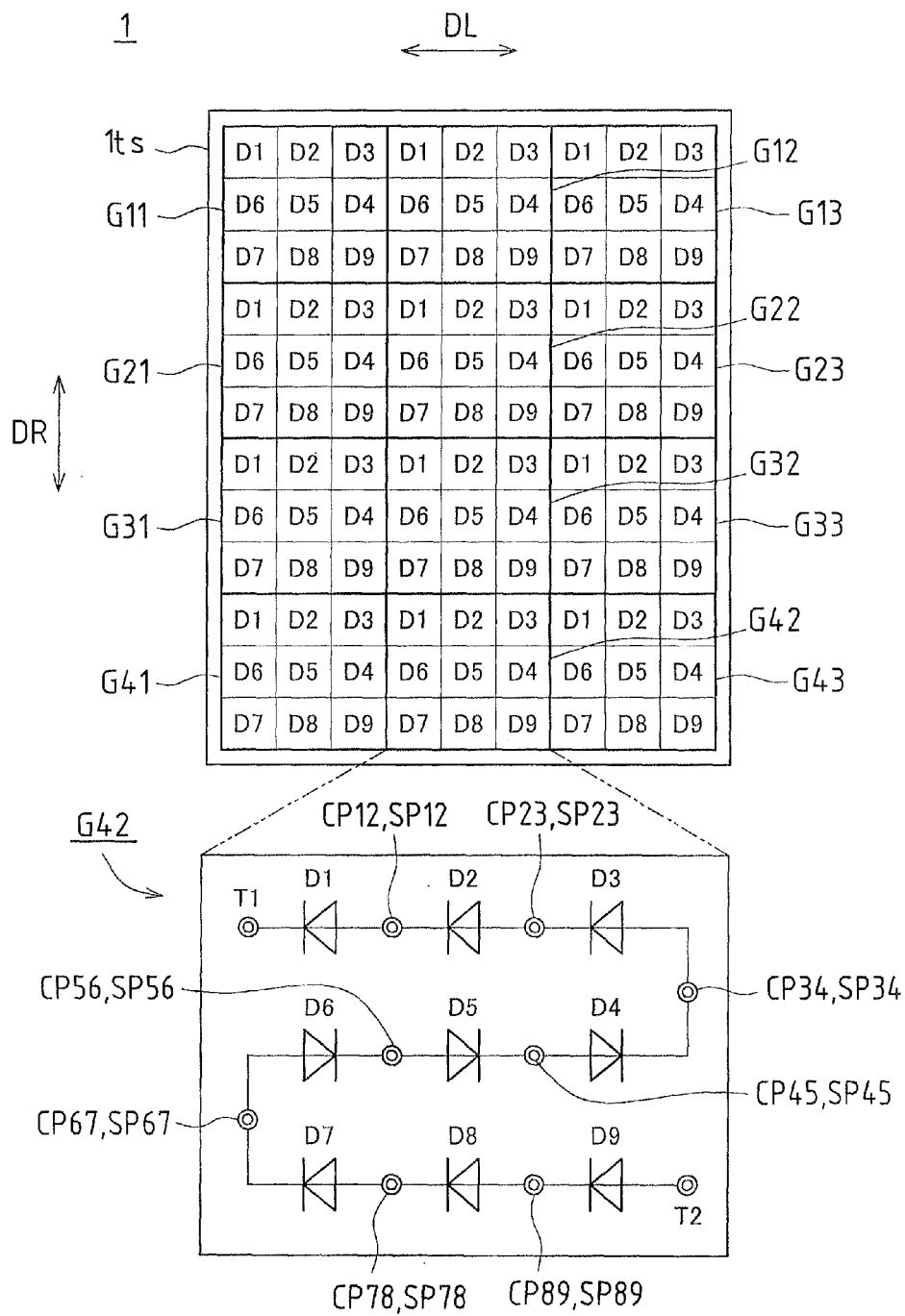
FIG. 2A is a plan view schematically illustrating the arrangement and connections of unitary power generation sections in a photovoltaic device according to embodiment 2 of the present invention.

FIG. 2A is a plan view schematically illustrating the arrangement and connections of unitary power generation sections in the photovoltaic device 1 in accordance with embodiment 2 of the present invention. Note that the connection wiring CW linking the specific connection points SP (connection points CP) may be omitted in the drawings for clarity throughout the rest of the description.

Figure 2B:
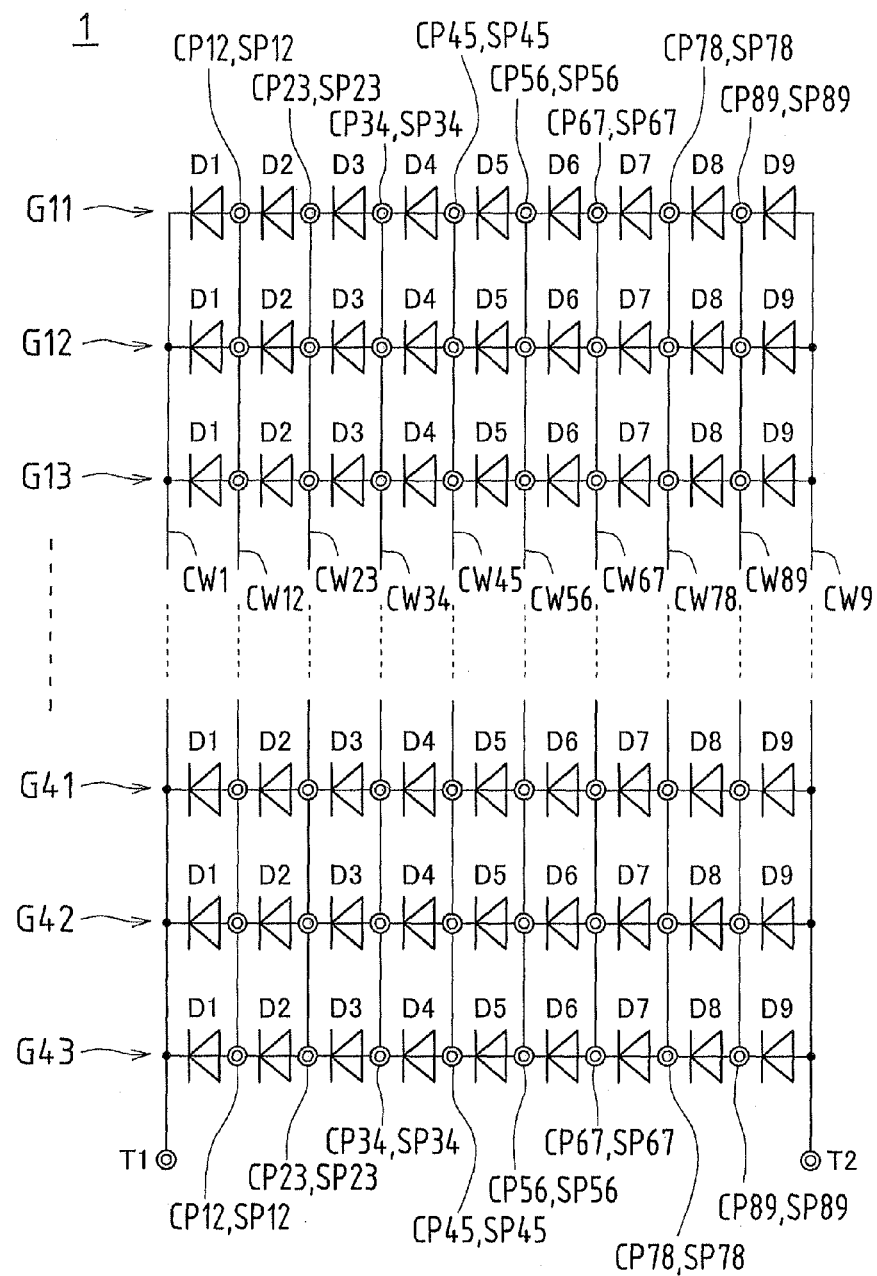
FIG. 2B is an equivalent circuit diagram illustrating, as an equivalent circuit, the connections of the unitary power generation sections in the photovoltaic device shown in FIG. 2A.

FIG. 2B is an equivalent circuit diagram illustrating, as an equivalent circuit, the connections of the unitary power generation sections in the photovoltaic device 1 shown in FIG. 2A.

The photovoltaic device 1 in accordance with the present embodiment includes unitary power generation sections D1, D2, D3, . . . , and D9 (hereinafter, may be simply referred to as "unitary power generation sections D" when it is not necessary to distinguish between them individually). The unitary power generation sections D are represented by diode symbols to indicate directionality.

Each unitary power generation section D is either a single photovoltaic element or a compound photovoltaic element in which photovoltaic elements are connected in series or in parallel, as described in embodiment 1.

The photovoltaic device 1 includes a cluster power generation section G11 in which a series circuit is formed by connecting the unitary power generation sections D1 to D9 in series in the order of their reference numerals. The photovoltaic device 1 also includes cluster power generation sections G12, G13, G21, G22, G23, G31, G32, G33, G41, G42, and G43 each of which is configured identically to the cluster power generation section G11 (hereinafter, the cluster power generation sections G11, . . . , and G43 may be simply referred to as the "cluster power generation sections G" when it is not necessary to distinguish between them individually).

FIG. 2A shows a scale-up view of the arrangement of the unitary power generation sections D in the cluster power generation section G42. The unitary power generation sections D in the other cluster power generation sections G has a similar arrangement. Specifically, in the cluster power generation section G11 (G42), the unitary power generation sections D1 and D2 are connected in series via a connection point CP12, the unitary power generation sections D2 and D3 are connected in series via a connection point CP23, the unitary power generation sections D3 and D4 are connected in series via a connection point CP34, the unitary power generation sections D4 and D5 are connected in series via a connection point CP45, the unitary power generation sections D5 and D6 are connected in series via a connection point CP56, the unitary power generation sections D6 and D7 are connected in series via a connection point CP67, the unitary power generation sections D7 and D8 are connected in series via a connection point CP78, and the unitary power generation sections D8 and D9 are connected in series via a connection point CP89, so as to form a series circuit composed of nine series-connected unitary power generation sections D (hereinafter, the connection points CP12, . . . , and CP89 may be simply referred to as the "connection points CP" when it is not necessary to distinguish between them individually). In other words, the photovoltaic device 1 includes cluster power generation sections G in each of which nine unitary power generation sections D are connected in series.

In the photovoltaic device 1, the unitary power generation sections D are arranged like a matrix (planar arrangement) in each cluster power generation section G. For example, as shown in the scale-up view of the cluster power generation section G42 (FIG. 2A), the unitary power generation sections D1 to D3 are arranged in the row direction DL (in the first row of the unitary power generation sections D), the unitary power generation sections D4 to D6 are arranged in the row direction DL (in the second row of the unitary power generation sections D), and the unitary power generation sections D7 to D9 are arranged in the row direction DL (in the third row of the unitary power generation sections D). Furthermore, the unitary power generation sections D1, D6, and D7 are arranged in the column direction DR (in the first column of the unitary power generation sections D), the unitary power generation sections D2, D5, and D8 are arranged in the column direction DR (in the second column of the unitary power generation sections D), and the unitary power generation sections D3, D4, and D9 are arranged in the column direction DR (in the third column of the unitary power generation sections D).

Since the unitary power generation sections D are arranged like a matrix in the photovoltaic device 1, the arrangement of the unitary power generation sections D in the photovoltaic device 1 is free from imbalance and hence uniform. The adverse effect of variation in the amount of light irradiation on a particular series stage (e.g., the leftmost unitary power generation sections D1, D6, and D7) is thereby further restrained.

The unitary power generation sections D3 and D4 are located close to each other with the connection point CP34 (specific connection point SP34) being provided between the unitary power generation sections D3 and D4, and the unitary power generation sections D6 and D7 are located close to each other with the connection point CP67 (specific connection point SP67) being provided between the unitary power generation sections D6 and D7, so as to simplify connections between the unitary power generation sections D in the cluster power generation sections G (e.g., between the unitary power generation sections D3 and D4 in the cluster power generation section G42).

In the photovoltaic device 1, the unitary power generation sections D in the cluster power generation sections G have the same planar arrangement in all the cluster power generation sections G. Therefore, in the photovoltaic device 1, the series-connected unitary power generation sections D have the same in-plane positions (e.g., the planar arrangement of the unitary power generation sections D1 to D9 in the cluster power generation section G11) in the cluster power generation sections G (e.g., G11, . . . , and G43). That realizes a simple layout for the cluster power generation sections G and facilitates the connection of the specific connection points SP between the cluster power generation sections G. In other words, the unitary power generation sections D in the same series stage have the same planar arrangement (planar layout) in all the cluster power generation sections G, regardless of the arrangement (positions) of the cluster power generation sections G.

The cluster power generation sections G11, . . . , and G43 are connected to a device terminal T1 via connection wiring CW1 and also to a device terminal T2 via connection wiring CW9, so as to form a parallel circuit.

The photovoltaic device 1 hence includes twelve (4 rows by 3 columns=12 as in a matrix) parallel-connected cluster power generation sections G in each of which there are provided nine series-connected unitary power generation sections D as a power generation circuit (series circuit). The solar-generated electric power is taken out via the device terminals T1 and T2.

The cluster power generation sections G11, . . . , and G43 are arranged at least either in the row direction DL or in the column direction DR. Specifically, the cluster power generation sections G11 to G13 are arranged in the row direction DL (in the first row of the cluster power generation sections G), the cluster power generation sections G21 to G23 are arranged in the row direction DL (in the second row of the cluster power generation sections G), the cluster power generation sections G31 to G33 are arranged in the row direction DL (in the third row of the cluster power generation sections G), and the cluster power generation sections G41 to G43 are arranged in the row direction DL (in the fourth row of the cluster power generation sections G). Furthermore, the cluster power generation sections G11, G21, G31, and G41 are arranged in the column direction DR (in the first column of the cluster power generation sections G), the cluster power generation sections G12, G22, G32, and G42 are arranged in the column direction DR (in the second column of the cluster power generation sections G), and the cluster power generation sections G13, G23, G33, and G43 are arranged in the column direction DR (in the third column of the cluster power generation sections G).

In the present embodiment, the cluster power generation sections G are aligned both in the row direction DL and in the column direction DR as in a matrix. Alternatively, for example, those cluster power generation sections G which are adjacent to each other in the row direction (or in the column direction DR) may be slightly shifted relatively in position. In other words, the cluster power generation sections G may be aligned at least either in the row direction DL or in the column direction DR. Note that the same description applies to embodiments detailed below.

In the photovoltaic device 1, the connection points CP12, CP23, CP34, CP45, CP56, CP67, CP78, and CP89 in each one of the cluster power generation sections G (e.g., G11) are connected respectively to the connection points CP12, CP23, CP34, CP45, CP56, CP67, CP78, and CP89 in the other cluster power generation sections G (e.g., G12, . . . , and G43, excluding G11).

Specifically, the connection points CP12, CP23, . . . , and CP89 are connected in parallel respectively via the connection wiring CW12, CW23, . . . , and CW89. In other words, the connection points CP (CP12, . . . , and CP89) in each cluster power generation section G are designated as specific connection points SP (SP12, SP23, SP34, SP45, SP56, SP67, SP78, and SP89) which are predetermined from among the connection points CP (there are eight connection points CP in the present embodiment), and connected to the similarly designated specific connection points SP in the other cluster power generation sections G (SP12, SP23, SP34, SP45, SP56, SP67, SP78, and SP89) respectively.

In the photovoltaic device 1 in accordance with the present embodiment, since each cluster power generation section G has eight connection points CP, and all the eight connection points CP are connection points for that cluster power generation section G, all these connection points CP are designated as specific connection points SP. That is, in the photovoltaic device 1 in accordance with the present embodiment, all the connection points CP are designated as specific connection points SP. Since the series-connected unitary power generation sections D are all connected in parallel, the photovoltaic device 1 more effectively restrains the adverse effect of light irradiation on a particular stage and more reliably prevents power generation efficiency from decreasing due to variation in the amount of light irradiation.

As described above, the photovoltaic device 1 in accordance with the present embodiment includes the parallel-connected cluster power generation sections G (G11, . . . , and G43) arranged at least either in the row direction DL or in the column direction DR, each of the cluster power generation sections G in turn including the unitary power generation sections D (D1, . . . , and D9), for converting light to electricity for power generation, which are connected in series via the connection points CP (CP12, . . . , and CP89). Furthermore, the cluster power generation sections G are each provided with specific connection points SP (SP12, . . . , and SP89) which are predetermined from among the connection points CP, and the specific connection points SP are connected to link the cluster power generation sections G.

Hence, in the photovoltaic device 1 in accordance with the present embodiment, the cluster power generation sections G (G11, . . . , and G43) formed by the series-connected unitary power generation sections D (D1, . . . , and D9) are connected in parallel at a specific stage (via the specific connection points SP, e.g., SP12, . . . , and SP89), so that the unitary power generation sections D located at particular positions (e.g., the unitary power generation sections D1, D6, and D7 in the leftmost cluster power generation sections G11, G21, G31, and G41 in FIG. 2A) can be in effect distributed (the other unitary power generation sections D1, D6, and D7 than those in the leftmost cluster power generation sections G11, G21, G31, and G41). The configuration prevents the adverse effect of variation in the amount of light irradiation which may only occur at a specific series stage (e.g., a local reduction in light irradiation on the unitary power generation sections D (e.g., the leftmost unitary power generation sections D1, D6, and D7 located at the same position in terms of the row direction DL) caused by a shadow). Furthermore, even if there occurs variation in the amount of light irradiation, the configuration restrains an imbalance between the irradiated area and the area taken up by the operating unitary power generation sections D. The configuration thus realizes efficient power generation.

In the photovoltaic device 1 in accordance with the present embodiment, the connection points CP (e.g., CP12) are designated as specific connection points SP (e.g., SP12), and the unitary power generation sections D are connected in parallel to link the cluster power generation sections G so that the series-connected element count k is essentially reduced to 1. Therefore, Vp>(k−1)×Voc (withstand voltage calculation formula) is rewritten as Vp>0. Therefore, the value of withstand voltage poses no problems.

Therefore, the photovoltaic device 1 (unitary power generation sections D) sufficiently prevents damage which could otherwise be caused by a hot spot even if the reverse withstand voltage is low (even if the reverse voltage Vop is in excess of the open voltage Voc). In other words, the photovoltaic device 1 in accordance with the present embodiment prevents reverse current from flowing through a unitary power generation section D (e.g., D1 in the cluster power generation section G21) receiving extremely low light irradiation. The photovoltaic device 1 thereby prevents hot spots from occurring without using a bypass diode which would generally be required. The photovoltaic device 1 thus prevents damage of the unitary power generation sections D.

A brief supplementary explanation will be given on the functions and effects of the photovoltaic device 1. The photovoltaic device 1, in the equivalent circuit, may be depicted as parallel-connected series circuits or series-connected parallel circuits. The photovoltaic device 1 is, however, more than that. The distribution of the unitary power generation sections D in the planar layout can achieve the following advantageous functions and effects which simple "parallel-connected series circuits (or series-connected parallel circuits)" cannot achieve.

The unitary power generation sections D (rectangular unitary power generation sections D) may be arranged, for example, so as to exactly match the planar arrangement of the unitary power generation sections D (planar arrangement of diode symbols) shown in the equivalent circuit diagram of FIG. 2B, instead of the layout (planar arrangement) shown in FIG. 2A. If a horizontal shadow (partial shadow stretching in the left/right directions) is created in FIG. 2B showing a layout as it is, and partial shadow is created, for example, on the unitary power generation sections D in the two bottom stages in FIG. 2B (i.e., the cluster power generation sections G42 and G43), there is no imbalance in irradiated area between the series stages. The irradiated area rate is $10/12=0.83$ (83%), whereas the power generated under these conditions is close to $10/12$ the power generated when the entire face is in the sun. High power generation efficiency is thus achieved.

In contrast, if a vertical shadow (partial shadow stretching in the up/down directions) is created in FIG. 2B, and partial shadow is created, for example, on the unitary power generation sections D in the two leftmost columns in FIG. 2B (i.e., the unitary power generation sections D1 and D2 between the connection wiring CW1 and CW23), the stage including the unitary power generation section D1 (additionally, the stage including the unitary power generation section D2) is affected by the partial shadow and does not operate despite the fact that seven out of the nine series circuits ($7/9=0.78$ (78%)) are in the sun. As a result, the photovoltaic device 1 produces almost no output, or in some cases, a hot spot could occur and cause damage.

Suppose that partial shadow is created on the 5×5 unitary power generation sections D located in the lower left part of FIG. 2B. For the unitary power generation sections D1 to D5, five out of the twelve parallel-connected unitary power generation sections D are shaded by the partial shadow, with the remaining seven of them being in the sun. Under the same conditions, for the other unitary power generation sections D6 to D9, all twelve of them are in the sun. There is hence a large imbalance in irradiated area between the series stages (between the series stages of the series circuits composed of twelve series-connected elements).

Since the output of the photovoltaic device 1 is roughly determined by the irradiated area rate of a parallel-connected series circuit (series stage) which has a minimum irradiated area, the total power output is as low as $7/12=0.58$ (58%) in terms of the irradiated area rate of the series circuit (series stage) with a minimum irradiated area (hereinafter, will be referred to as "area efficiency"). The output is low due to the imbalance between the series stages despite the fact that the photovoltaic device 1 as a whole has an irradiated area rate of $(9×12−5×5)/(9×12)=0.77$ (77%).

Now, in the layout of the photovoltaic device 1 shown in FIG. 2A, suppose that partial shadow is created on the unitary power generation sections D in the two bottom stages in FIG. 2A. For the unitary power generation sections D4 to D9, three (three cluster power generation sections G) out of the twelve unitary power generation sections (there is provided one unitary power generation section D1 in each of the twelve cluster power generation sections G in a distributed manner, and so are D2 to D9) are shaded by the partial shadow. The area efficiency is $9/12=0.75$ (75%). The power generation efficiency is only slightly lower (not much lower) in this layout than in the layout which exactly matches the planar arrangement shown in the equivalent circuit diagram of FIG. 2B.

Suppose that partial shadow is created on the unitary power generation sections D in the two leftmost columns in FIG. 2A. For the unitary power generation sections D1, D2, D5, D6, D7, and D8, four out of the twelve unitary power generation sections D are shaded, and the area efficiency is $8/12=67\%$. Next, suppose that partial shadow is created on the 5×5 unitary power generation sections D located in the lower left part. In this situation, four out of the twelve are shaded by the partial shadow for the unitary power generation sections D5, D6, D7, and D8, two out of the twelve are shaded by the partial shadow for the unitary power generation sections D1, D2, D4, and D9, and one out of the twelve are shaded by the partial shadow for the unitary power generation section D3. The area efficiency, as determined by unitary power generation sections which have a maximum shadow area (unitary power generation sections D5, D6, D7, and D8), is $8/12=0.67$ (67%).

The layout shown in the equivalent circuit diagram of FIG. 2B achieves high power generation efficiency when horizontal partial shadow is created on FIG. 2B. The layout is therefore suitable when only horizontal partial shadow (or similar partial shadow) is expected to occur. Meanwhile, the layout greatly reduces its power generation efficiency and in some cases may produce almost no output if partial shadow of a different shape is created. The layout is therefore not capable of restraining output reductions for general shadows.

In contrast, the photovoltaic device 1 shown in FIG. 2A in accordance with the present embodiment does not cause a large imbalance between the irradiated area rate and the area efficiency for any shape of shadow (partial shadow). The photovoltaic device 1 does not allow for large reductions in power generation efficiency for any shadow.

These effects are achieved because of the special configuration (planar layout). Specifically, the unitary power generation sections D in the same series circuit (series stage) are distributed in the planar layout, and the unitary power generation sections D in different series circuits (series stages) are located close to each other, so that if partial shadow of various shapes occurs as described above, the partial shadow is cast over the unitary power generation sections D in different series circuits (series stages), in other words, so that the partial shadow is not cast over the unitary power generation sections D in particular series circuits (series stages). In other words, in the photovoltaic device 1, the unitary power generation sections D located at the same position in the series stages in the equivalent circuit are distributed in the planar layout. The distribution equalizes the impact of partial shadow across the light-receiving face.

The planar layout shown in FIG. 2A achieves high power generation efficiency when partial shadow is created, for example, on three rows of unitary power generation sections in the horizontal direction, three columns of unitary power generation sections in the vertical direction, or 3×3 unitary power generation sections in the lower left because there is no imbalance in irradiated area between the series circuits (series stages) (i.e., the area efficiency matches the irradiated area rate).

As described above, the photovoltaic device 1 in accordance with the present embodiment restrains reductions in power generation efficiency for partial shadow of various shapes and achieves large power generation as an expected value.

In the photovoltaic device 1 in accordance with the present embodiment, the connection points CP (CP12, ..., and CP89) are designated as specific connection points SP (SP12, ..., and SP89), and the unitary power generation sections D (D1, ..., and D9) are connected in parallel to link the cluster power generation sections G, so that the unitary power generation sections D (e.g., D1) in each series stage are distributed in the planar layout over the light-receiving face (e.g., the unitary power generation sections D1 are found in all of the cluster power generation sections G11, ..., and G43).

Furthermore, each unitary power generation section D is located close to unitary power generation sections D in other series stages. If an obstacle blocks sunlight and partially shades the light-receiving face of the photovoltaic device 1, the resultant shadow typically falls more often on a particular part of the light-receiving face than on the other parts as a result of the shape of the obstacle. Therefore, it is less likely that only those unitary power generation sections D in a particular series stage are selectively shaded completely by the partial shadow.

Especially, if more cluster power generation sections G are provided, the unitary power generation sections D in the same series stage are more distributed and far less likely to be covered with the partial shadow. Therefore, the photovoltaic device 1 is practically free from hot spots and capable of, without using a bypass diode, preventing the unitary power generation sections D from being damaged by a hot spot.

The function and effect for variation in the amount of light irradiation (e.g., shaded area) will be described more specifically in embodiments 7 to 9.

The technical features of the photovoltaic device 1 in accordance with the present embodiment may be applied to photovoltaic devices 1 in accordance with other embodiments where appropriate.

Embodiment 3

A photovoltaic device 1 in accordance with the present embodiment will be described in reference to FIGS. 3A and 3B. The photovoltaic device 1 in accordance with the present embodiment has a basic configuration similar to that of the photovoltaic devices 1 in accordance with embodiment 1 (see FIGS. 1A and 1B) and embodiment 2 (see FIGS. 2A and 2B). Hence, the same reference numerals will be used where appropriate, and the description will focus on major technical differences.

Figure 3A:
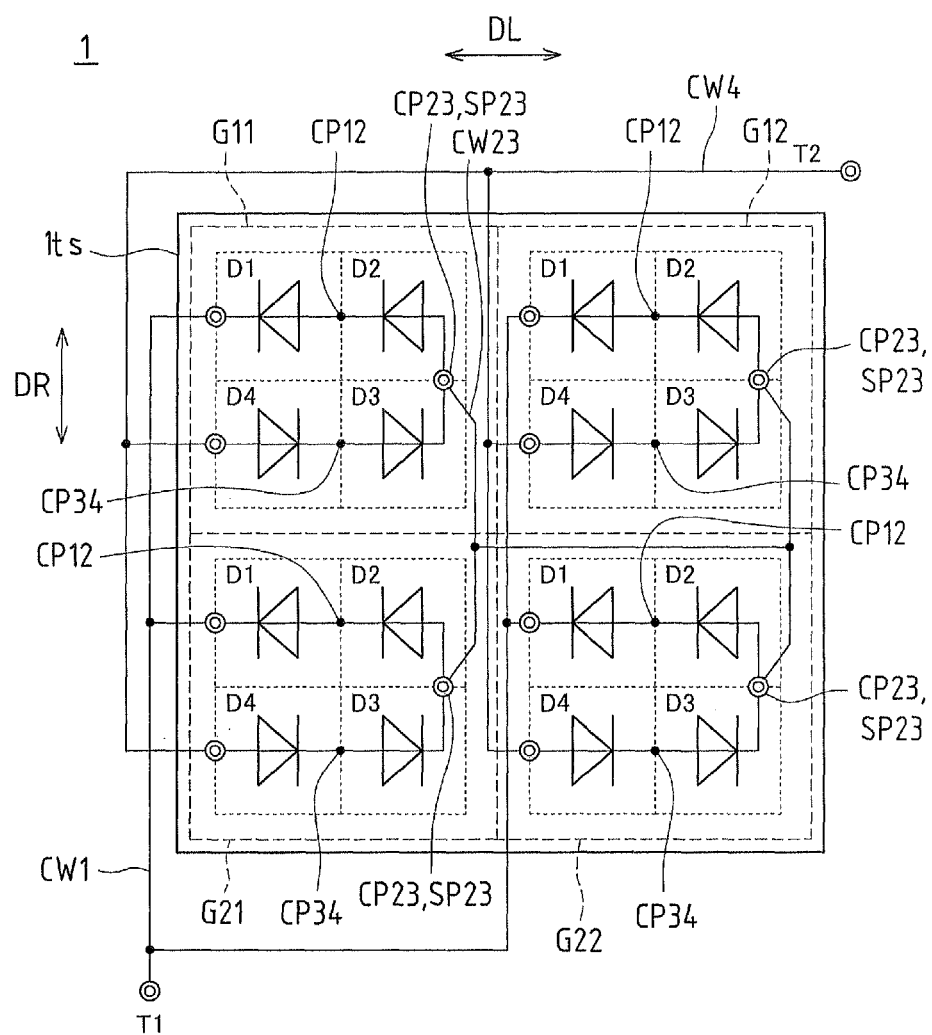
FIG. 3A is a plan view schematically illustrating the arrangement and connections of unitary power generation sections in a photovoltaic device according to embodiment 3 of the present invention.

FIG. 3A is a plan view schematically illustrating the arrangement and connections of unitary power generation sections in the photovoltaic device 1 in accordance with embodiment 3 of the present invention.

Figure 3B:
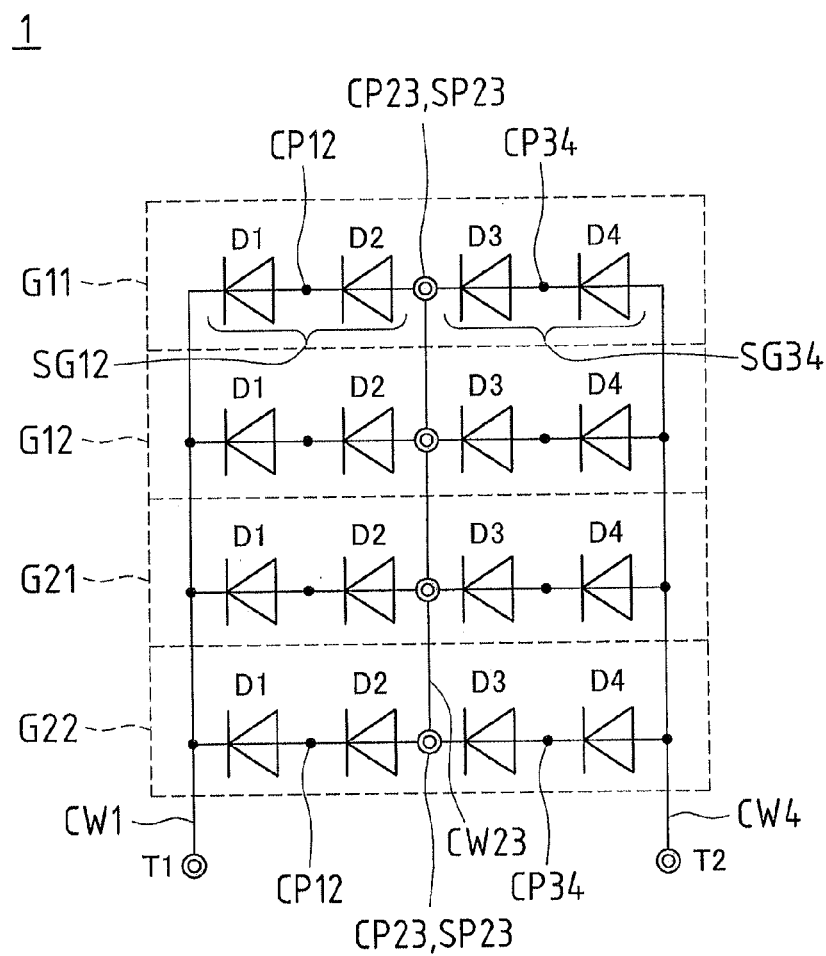
FIG. 3B is an equivalent circuit diagram illustrating, as an equivalent circuit, the connections of the unitary power generation sections in the photovoltaic device shown in FIG. 3A.

FIG. 3B is an equivalent circuit diagram illustrating, as an equivalent circuit, the connections of the unitary power generation sections in the photovoltaic device 1 shown in FIG. 3A.

The photovoltaic device 1 in accordance with the present embodiment includes unitary power generation sections D1, D2, D3, and D4 (hereinafter, may be simply referred to as "unitary power generation sections D" when it is not necessary to distinguish between them individually). The unitary power generation sections D are represented by diode symbols to indicate directionality. The individual unitary power generation section D has the structure described in embodiment 1, and its description is not repeated here.

The photovoltaic device 1 includes a cluster power generation section G11 in which a series circuit is formed by connecting the four unitary power generation sections D1 to D4 in series in the order of their reference numerals. The photovoltaic device 1 also includes cluster power generation sections G12, G21, and G22 each of which is configured identically to the cluster power generation section G11 (hereinafter, the cluster power generation sections G11, ..., and G22 may be simply referred to as the "cluster power generation sections G" when it is not necessary to distinguish between them individually).

In the cluster power generation section G11, the unitary power generation sections D1 and D2 are connected in series via a connection point CP12, the unitary power generation sections D2 and D3 are connected in series via a connection point CP23, and the unitary power generation sections D3 and D4 are connected in series via a connection point CP34, so as to form a series circuit in which there are provided four series-connected unitary power generation sections D (hereinafter, the connection points CP12, ..., and CP34 may be simply referred to as the "connection points CP" when it is not necessary to distinguish between them individually). In other words, the photovoltaic device 1 includes cluster power generation sections G in which there are provided four series-connected unitary power generation sections D. In the photovoltaic device 1, the unitary power generation sections D are arranged like a matrix (planar arrangement) in each cluster power generation section G. In the cluster power generation section G (e.g., G11), the unitary power generation sections D1 and D2 are provided in the row direction DL (in the first row of the unitary power generation sections D), and the unitary power generation sections D3 and D4 are provided in the row direction DL (in the second row of the unitary power generation sections D). Furthermore, the unitary power generation sections D1 and D4 are provided in the column direction DR (in the first column of the unitary power generation sections D), and the unitary power generation sections D2 and D3 are provided in the column direction DR (in the second column of the unitary power generation sections D).

Since the unitary power generation sections D are arranged like a matrix in the photovoltaic device 1, the arrangement of the unitary power generation sections D in the photovoltaic device 1 is free from imbalance and hence uniform. The adverse effect of variation in the amount of light irradiation on a particular series stage (e.g., the leftmost unitary power generation sections D1 and D4) is thereby further restrained.

To simplify the connection between the unitary power generation sections D in the cluster power generation section G (e.g., between the unitary power generation sections D2 and D3 in the cluster power generation section G11), the unitary power generation sections D2 and D3 are located close to each other, and the connection point CP23 (specific connection point SP23) is provided between the unitary power generation sections D2 and D3.

In the photovoltaic device 1, the unitary power generation sections D in the cluster power generation sections G have the same planar arrangement in all the cluster power generation sections G. Therefore, in the photovoltaic device 1, the series-connected unitary power generation sections D have the same in-plane positions (e.g., the planar arrangement of the unitary power generation sections D1 to D4 in the cluster power generation section G11) in the cluster power generation sections G (e.g., G12, G21, and G22). That realizes a simple layout for the cluster power generation sections G and facilitates the connection of the specific connection points SP (e.g., SP23) between the cluster power generation sections G. In other words, the unitary power generation sections D in the same series stage have the same planar arrangement (planar layout) in all the cluster power generation sections G, regardless of the arrangement (positions) of the cluster power generation sections G.

The cluster power generation sections G11, G12, G21, and G22 are connected to a device terminal T1 via connection wiring CW1 and also to a device terminal T2 via connection wiring CW4, so as to form a parallel circuit.

The photovoltaic device 1 hence includes four (2 rows by 2 columns=4 as in a matrix) parallel-connected cluster power generation sections G in each of which there are provided four series-connected unitary power generation sections D as a power generation circuit (series circuit). The solar-generated electric power is taken out via the device terminals T1 and T2.

The cluster power generation sections G11, . . . , and G22 are arranged at least either in the row direction DL or in the column direction DR. Specifically, the cluster power generation sections G11 and G12 are arranged in the row direction DL (in the first row of the cluster power generation sections G), and the cluster power generation sections G21 and G22 are arranged in the row direction DL (in the second row of the cluster power generation sections G). Furthermore, the cluster power generation sections G11 and G21 are arranged in the column direction DR (in the first column of the cluster power generation sections G), and the cluster power generation sections G12 and G22 are arranged in the column direction DR (in the second column of the cluster power generation sections G).

In the photovoltaic device 1, the connection point CP23, among the connection points CP12, CP23, and CP34 in each one of the cluster power generation sections G (e.g., G11), is connected to the connection point CP23, among the connection points CP12, CP23, and CP34 in the other cluster power generation sections G (e.g., G12, . . . , and G22, excluding G11).

Specifically, the connection points CP23 are connected in parallel via the connection wiring CW23, so that the associated unitary power generation sections D are connected in parallel. In other words, one of the connection points CP (CP12, CP23, and CP34) is designated as a specific connection point SP23 (there is one specific connection point in each cluster power generation section G in the present embodiment) which is predetermined from among the connection points CP (there are three connection points in each cluster power generation section G in the present embodiment), and connected to the similarly designated specific connection points SP23 in the other cluster power generation sections G.

In the photovoltaic device 1, the specific connection point SP23 is located at the boundary which divides the unitary power generation sections D (D1, D2, D3, and D4) in the cluster power generation section G into equal numbers of unitary power generation sections D (e.g., which divides them into groups each including two unitary power generation sections: namely, a group SG12 composed of the unitary power generation sections D1 and D2 and a group SG34 composed of the unitary power generation sections D3 and D4). The unitary power generation sections D in the same group (e.g., D1 and D2) are connected in series within the group and not connected in parallel with the unitary power generation sections D in the other cluster power generation sections G.

Therefore, the photovoltaic device 1 includes fewer specific connection points SP (one in each cluster power generation section G in the present embodiment (e.g., SP23)) that need to be connected between the cluster power generation sections than the connection points CP (three in each cluster power generation section G), thereby simplifying the connections.

The unitary power generation sections D do not need to be divided into equal numbers along both the rows and columns. For example, if a cluster power generation section G is composed of ten (2 rows by 5 columns) series-connected unitary power generation sections D, and the unitary power generation sections D are to be divided into five groups of two, each row may include two groups of two with a fifth group extending over the first and second rows.

Figure 5:
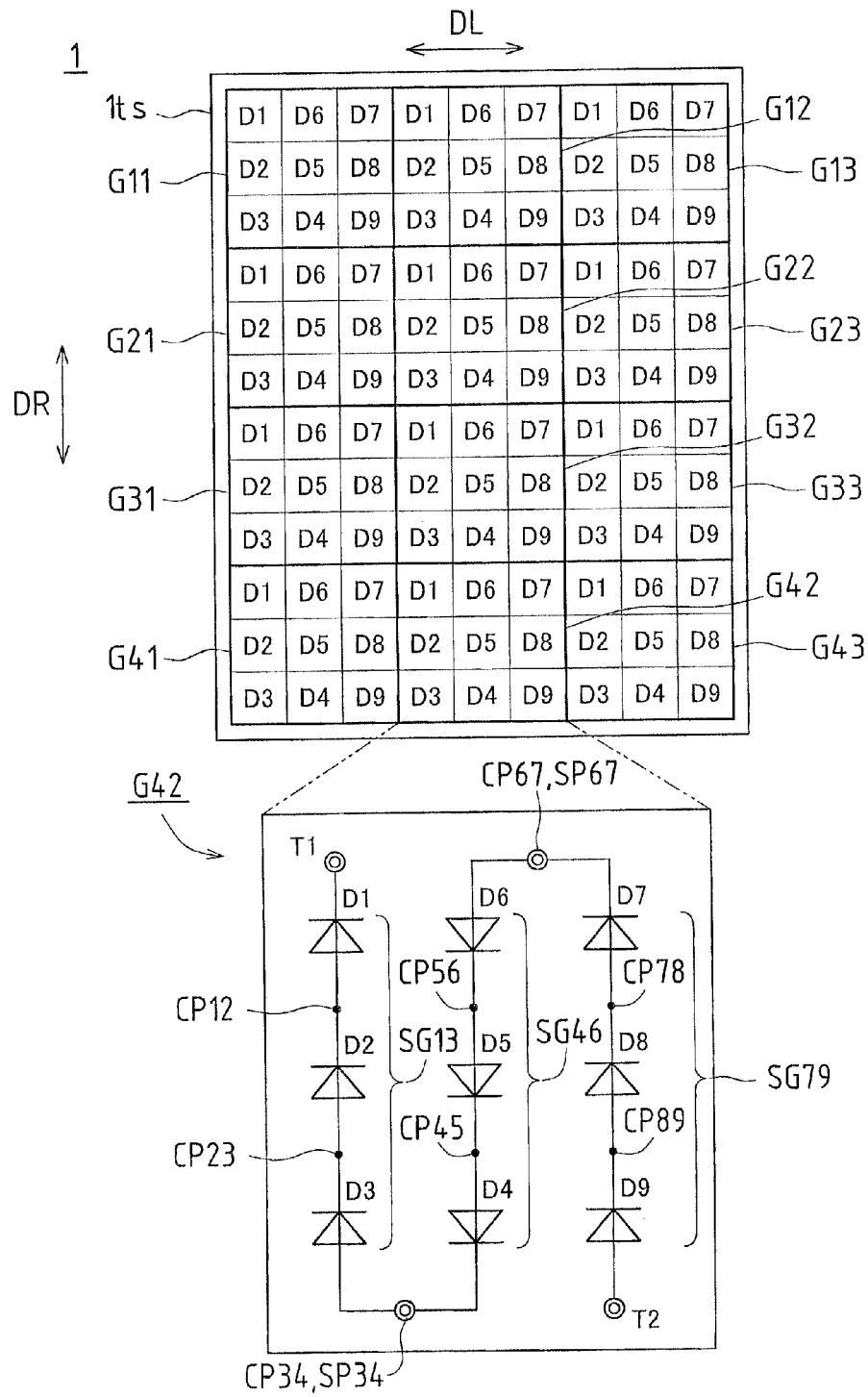
FIG. 5 is a plan view schematically illustrating the arrangement and connections of unitary power generation sections in a photovoltaic device according to embodiment 5 of the present invention.

In addition, it may be said about the photovoltaic device 1 that the unitary power generation sections D (e.g., D1, . . . , and D4) in each cluster power generation section G (e.g., G11) are divided (e.g., into the groups SG12 and SG34) along the rows (e.g., both the group SG12 composed of the unitary power generation sections D1 and D2 and the group SG34 composed of the unitary power generation sections D3 and D4 are arranged in the row direction DL) or along the columns (see FIG. 5). In the photovoltaic device 1, this division of the unitary power generation sections D along the rows or columns simplifies the arrangement and connections of the specific connection points SP (e.g., SP23).

The reverse withstand voltage Vp required with the unitary power generation sections D (the unitary power generation sections D1 and D2 in the group SG12 and the unitary power generation sections D3 and D4 in the group SG34) in each group (e.g., SG12 and SG34) may be determined using $Vp > (k-1) \times Voc$ (withstand voltage calculation formula), by substituting the number of the series-connected unitary power generation sections D in that group for k. Since each group SG12 and SG34 includes two series-connected unitary power generation sections D, k=2. Substituting k=2 into the withstand voltage calculation formula, we obtain $Vp > (2-1) \times Voc = Voc$. This indicates that the reverse withstand voltage Vp required with the unitary power generation sections D may be as low as slightly more than the open voltage Voc. No bypass diode is therefore necessary.

The series-connected unitary power generation sections D in each cluster power generation section G have been, so far in the present embodiment, divided into groups each including an equal number of them as an example. Alternatively, the unitary power generation sections D may be divided into groups each including unequal numbers of them. Note that in either case, the unitary power generation sections D are divided in the same manner in all the cluster power generation sections G.

In the photovoltaic device 1, the unitary power generation sections D are divided (e.g., the groups SG12 and SG34) along the rows (e.g., both the group SG12 composed of the unitary power generation sections D1 and D2 and the group SG34 composed of the unitary power generation sections D3 and D4 are arranged in the row direction DL) or columns (see FIG. 5) of the unitary power generation sections D (e.g., D1, . . . , and D4) in each cluster power generation section G (e.g., G11).

Since the unitary power generation sections D are divided along the rows or columns in the photovoltaic device 1 in accordance with the present invention, the arrangement and connections of the specific connection points SP (e.g., SP23) are simplified.

As described above, the photovoltaic device 1 in accordance with the present embodiment includes the parallel-connected cluster power generation sections G (G11, . . . , and G22) arranged at least either in the row direction DL or in the column direction DR, each of the cluster power generation sections G in turn including the unitary power generation sections D (D1, . . . , and D4), for converting light to electricity for power generation, which are connected in series via the connection points CP (CP12, . . . , and CP34). Furthermore, the cluster power generation sections G are each provided with a specific connection point SP (SP23) which is predetermined from among the connection points CP, and the specific connection points SP23 are connected to link the cluster power generation sections G.

Hence, in the photovoltaic device 1 in accordance with the present embodiment, the cluster power generation sections G (G11, . . . , and G22) formed by the series-connected unitary power generation sections D (D1, . . . , and D4) are connected in parallel at a specific stage (via the specific connection points SP, e.g., SP23), so that the unitary power generation sections D located at particular positions (e.g., the unitary power generation sections D1 and D4 in the leftmost cluster power generation sections G11 and G21 in FIG. 3A) can be in effect distributed (the other unitary power generation sections D1 and D4 than those in the leftmost cluster power generation sections G11 and G21). The configuration prevents the adverse effect of variation in the amount of light irradiation which may only occur at a specific series stage (e.g., a local reduction in light irradiation on the unitary power generation sections D (e.g., the leftmost unitary power generation sections D1 and D4 located at the same position in terms of the row direction DL) caused by a shadow). Furthermore, even if there occurs variation in the amount of light irradiation, the configuration restrains an imbalance between the irradiated area and the area taken up by the operating unitary power generation sections D. The configuration thus realizes efficient power generation.

The photovoltaic device 1 in accordance with the present embodiment differs from the photovoltaic device 1 in accordance with embodiment 1 in some respects including the following. Four unitary power generation sections D are connected in series to form a series circuit (power generation circuit). The four series-connected unitary power generation sections D are arranged like a matrix. The unitary power generation sections D are divided into equal numbers of them (e.g., into groups of two) (groups SG12 and SG34), and the connection point CP23 located at the boundary which divides the unitary power generation sections D into the groups (SG12 and SG34) is designated as the specific connection point SP23. The groups SG12 and SG34 are set up along the rows.

The function and effect for variation in the amount of light irradiation (e.g., shaded area) will be described more specifically in embodiments 7 to 9.

The technical features of the photovoltaic device 1 in accordance with the present embodiment may be applied to photovoltaic devices 1 in accordance with other embodiments where appropriate.

Embodiment 4

A photovoltaic device 1 in accordance with the present embodiment will be described in reference to FIGS. 4A and 4B. The photovoltaic device 1 in accordance with the present embodiment has a basic configuration similar to that of the photovoltaic device 1 in accordance with embodiment 2 (see FIGS. 2A and 2B). Hence, the same reference numerals will be used where appropriate, and the description will focus on major technical differences.

Figure 4A:
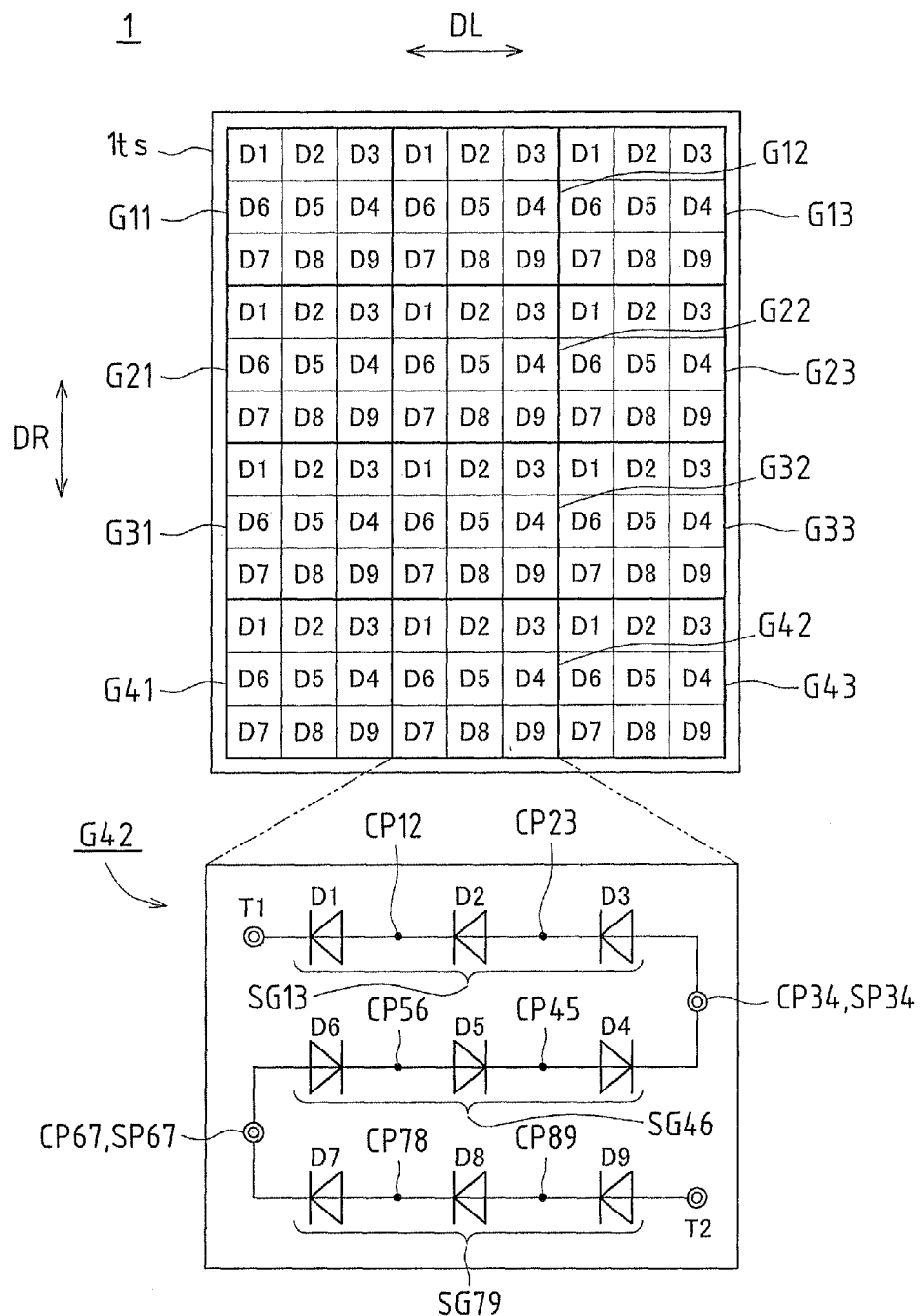
FIG. 4A is a plan view schematically illustrating the arrangement and connections of unitary power generation sections in a photovoltaic device according to embodiment 4 of the present invention.

FIG. 4A is a plan view schematically illustrating the arrangement and connections of unitary power generation sections in the photovoltaic device 1 in accordance with embodiment 4 of the present invention.

Figure 4B:
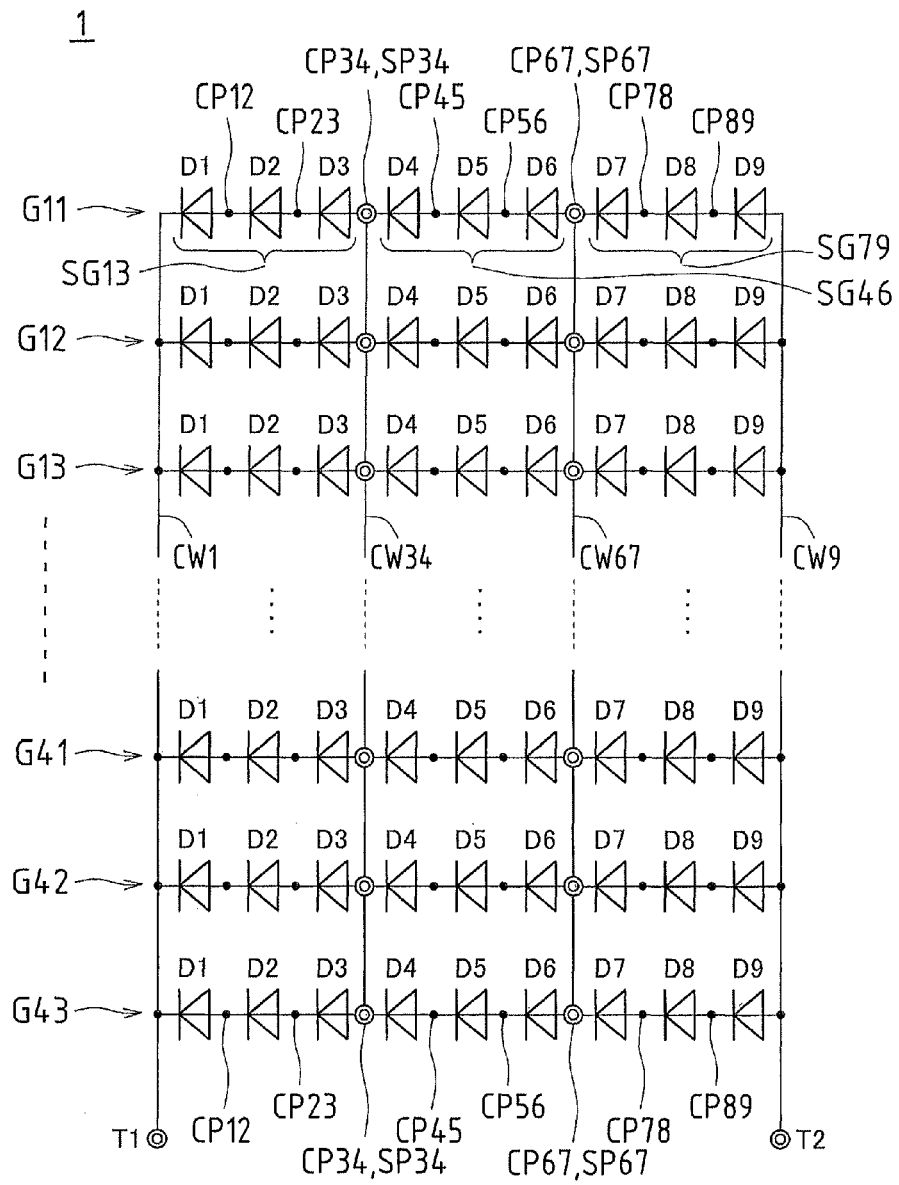
FIG. 4B is an equivalent circuit diagram illustrating, as an equivalent circuit, the connections of the unitary power generation sections in the photovoltaic device shown in FIG. 4A.

FIG. 4B is an equivalent circuit diagram illustrating, as an equivalent circuit, the connections of the unitary power generation sections in the photovoltaic device 1 shown in FIG. 4A.

The photovoltaic device 1 in accordance with the present embodiment includes unitary power generation sections D1, D2, D3, . . . , and D9 (hereinafter, may be simply referred to as "unitary power generation sections D" when it is not necessary to distinguish between them individually). The unitary power generation sections D are represented by diode symbols to indicate directionality.

Each unitary power generation section D is either a single photovoltaic element or a compound photovoltaic element in which photovoltaic elements are connected in series or in parallel, as described in embodiment 1.

The photovoltaic device 1 includes a cluster power generation section G11 in which a series circuit is formed by connecting the unitary power generation sections D1 to D9 in series in the order of their reference numerals. The photovoltaic device 1 also includes cluster power generation sections G12, G13, G21, G22, G23, G31, G32, G33, G41, G42, and G43 each of which is configured identically to the cluster power generation section G11 (hereinafter, the cluster power generation sections G11, . . . , and G43 may be simply referred to as the "cluster power generation sections G" when it is not necessary to distinguish between them individually).

FIG. 4A shows a scale-up view of the arrangement of the unitary power generation sections D in the cluster power generation section G42. The unitary power generation sections D in the other cluster power generation sections G has a similar arrangement. Specifically, in the cluster power generation section G11 (G42), the unitary power generation sections D1 and D2 are connected in series via a connection point CP12, the unitary power generation sections D2 and D3 are connected in series via a connection point CP23, the unitary power generation sections D3 and D4 are connected in series via a connection point CP34, the unitary power generation sections D4 and D5 are connected in series via a connection point CP45, the unitary power generation sections D5 and D6 are connected in series via a connection point CP56, the unitary power generation sections D6 and D7 are connected in series via a connection point CP67, the unitary power generation sections D7 and D8 are connected in series via a connection point CP78, and the unitary power generation sections D8 and D9 are connected in series via a connection point CP89, so as to form a series circuit composed of nine series-connected unitary power generation sections D (hereinafter, the connection points CP12, . . . , and CP89 may be simply referred to as the "connection points CP" when it is not necessary to distinguish between them individually). In other words, the photovoltaic device 1 includes cluster power generation sections G in each of which nine unitary power generation sections D are connected in series.

In the photovoltaic device 1, the unitary power generation sections D are arranged like a matrix (planar arrangement) in each cluster power generation section G similarly to those in embodiment 2 (see FIGS. 2A and 2B). Since the unitary power generation sections D are arranged like a matrix in the photovoltaic device 1, the arrangement of the unitary power generation sections D in the photovoltaic device 1 is free from imbalance and hence uniform. The adverse effect of variation in the amount of light irradiation on a particular series stage (e.g., the leftmost unitary power generation sections D1, D6, and D7) is thereby further restrained.

The connection point CP34 (specific connection point SP34) is located between the unitary power generation section D3 (in the first row of the unitary power generation sections D) and the unitary power generation section D4 (in the second row of the unitary power generation sections D). The connection point CP67 (specific connection point SP67) is located between the unitary power generation section D6 (in the second row of the unitary power generation sections D) and the unitary power generation section D7 (in the third row of the unitary power generation sections D). Hereinafter, the specific connection points SP34 and SP67 may be simply referred to as the "specific connection points SP" when it is not necessary to distinguish between them individually.

The unitary power generation sections D3 and D4 are located close to each other with the connection point CP34 (specific connection point SP34) being provided between the unitary power generation sections D3 and D4, and the unitary power generation sections D6 and D7 are located close to each other with the connection point CP67 (specific connection point SP67) being provided between the unitary power generation sections D6 and D7, so as to simplify connections between the unitary power generation sections D in the cluster power generation sections G (e.g., between the unitary power generation sections D3 and D4 in the cluster power generation section G42).

In the photovoltaic device 1, the unitary power generation sections D in the cluster power generation sections G have the same planar arrangement in all the cluster power generation sections G. Therefore, in the photovoltaic device 1, the series-connected unitary power generation sections D have the same in-plane positions (e.g., the planar arrangement of the unitary power generation sections D1 to D9 in the cluster power generation section G11) in the cluster power generation sections G (e.g., G11, . . . , and G43). That realizes a simple layout for the cluster power generation sections G and facilitates the connection of the specific connection points SP between the cluster power generation sections G. In other words, the unitary power generation sections D in the same series stage have the same planar arrangement (planar layout) in all the cluster power generation sections G, regardless of the arrangement (positions) of the cluster power generation sections G.

The cluster power generation sections G11, . . . , and G43 are connected to a device terminal T1 via connection wiring CW1 and also to a device terminal T2 via connection wiring CW9, so as to form a parallel circuit. The photovoltaic device 1 hence includes twelve (4 rows by 3 columns=12 as in a matrix) parallel-connected cluster power generation sections G in each of which there are provided nine series-connected unitary power generation sections D as a power generation circuit (series circuit). The solar-generated electric power is taken out via the device terminals T1 and T2.

The cluster power generation sections G11, . . . , and G43 are arranged at least either in the row direction DL or in the column direction DR, similarly to embodiment 2.

In the photovoltaic device 1, the connection points CP34 and CP67 out of the connection points CP12, . . . , and CP89 in each one of the cluster power generation sections G (e.g., G11) are connected respectively to the connection points CP34 and CP67 out of the connection points CP in the other cluster power generation sections G (e.g., G12, . . . , and G43 excluding G11).

Specifically, the connection points CP34 and CP67 are connected in parallel respectively via the connection wiring CW34 and CW67. In other words, the connection points CP (CP34 and CP67) in each cluster power generation section G are designated as specific connection points SP34 and SP67 which are predetermined from among the connection points CP (there are eight connection points CP in the present embodiment), and connected to the similarly designated specific connection points SP34 and SP67 in the other cluster power generation sections G respectively.

In the photovoltaic device 1, the specific connection points SP34 and SP67 are located at the boundary which divides the unitary power generation sections D (unitary power generation sections D1, . . . , and D9) in the cluster power generation section G into equal numbers of unitary power generation sections D (e.g., which divides them groups each including three unitary power generation sections: namely, a group SG13 composed of the unitary power generation sections D1 to D3, a group SG46 composed of the unitary power generation sections D4 to D6, and a group SG79 composed of the unitary power generation sections D7 to D9).

The unitary power generation sections D in the same group (e.g., D1, D2, and D3) are connected in series within the group and not connected in parallel with the unitary power generation sections D in the other cluster power generation sections G.

Therefore, the photovoltaic device 1 includes fewer specific connection points SP (two in each cluster power generation section G in the present embodiment (e.g., SP34 and SP67)) that need to be connected between the cluster power generation sections than the connection points CP (eight in each cluster power generation section G), thereby simplifying the connections.

In the photovoltaic device 1, the unitary power generation sections D are divided (e.g., the groups SG13, SG46, and SG79) along the rows (e.g., the group SG13 composed of the unitary power generation sections D1, D2, and D3, the group SG46 composed of the unitary power generation sections D4, D5, and D6, and the group SG79 composed of the unitary power generation sections D7, D8, and D9 are all arranged in the row direction DL) or columns (see FIG. 5) of the unitary power generation sections D (e.g., D1, ... , and D9) in each cluster power generation section G (e.g., G42).

Since the unitary power generation sections D are divided along the rows or columns in the photovoltaic device 1, the arrangement and connections of the specific connection points SP (e.g., SP34 and SP67) are simplified.

The reverse withstand voltage Vp required with the unitary power generation sections D (the unitary power generation sections D1 to D3 in the group SG13, the unitary power generation sections D4 to D6 in the group SG46, and the unitary power generation sections D7 to D9 in the group SG79) in each group (SG13, SG46, and SG79) may be determined using Vp>(k−1)×Voc (withstand voltage calculation formula), by substituting the number of the series-connected unitary power generation sections D in that group for k. Since each group SG13, SG46, and SG79 includes three series-connected unitary power generation sections D, k=3. Substituting k=3 into the withstand voltage calculation formula, we obtain Vp>(3−1)×Voc=2 Voc. This indicates that the reverse withstand voltage Vp required with the unitary power generation sections D may be as low as slightly more than twice the open voltage Voc. No bypass diode is therefore necessary.

The series-connected unitary power generation sections D in each cluster power generation section G have been, so far in the present embodiment, divided into groups each including an equal number of them as an example. Alternatively, the unitary power generation sections D may be divided into groups each including unequal numbers of them. Note that in either case, the unitary power generation sections D need to be divided in the same manner in all the cluster power generation sections G. For example, the same stages which correspond to each other have the same connection pattern. In other words, even if the unitary power generation sections D are not equally divided, the specific connection points SP have the same position in all the cluster power generation sections G.

As described above, the photovoltaic device 1 in accordance with the present embodiment includes the parallel-connected cluster power generation sections G (G11, ... , and G43) arranged at least either in the row direction DL or in the column direction DR, each of the cluster power generation sections G in turn including the unitary power generation sections D (D1, ... , and D9), for converting light to electricity for power generation, which are connected in series via the connection points CP (CP12, ... , and CP89). Furthermore, the cluster power generation sections G are each provided with specific connection points SP (SP34 and SP67) which are predetermined from among the connection points CP, and the specific connection points SP are connected to link the cluster power generation sections G.

Hence, in the photovoltaic device 1 in accordance with the present embodiment, the cluster power generation sections G (G11, ... , and G43) formed by the series-connected unitary power generation sections D (D1, ... , and D9) are connected in parallel at a specific stage (via the specific connection points SP, e.g., SP34 and SP67), so that the unitary power generation sections D located at particular positions (e.g., the unitary power generation sections D1, D6, and D7 in the leftmost cluster power generation sections G11, G21, G31, and G41 in FIG. 4A) can be in effect distributed (the other unitary power generation sections D1, D6, and D7 than those in the leftmost cluster power generation sections G11, G21, G31, and G41). The configuration prevents the adverse effect of variation in the amount of light irradiation which may only occur at a specific series stage (e.g., a local reduction in light irradiation on the unitary power generation sections D (e.g., the leftmost unitary power generation sections D1, D6, and D7 located at the same position in terms of the row direction DL) caused by a shadow). Furthermore, even if there occurs variation in the amount of light irradiation, the configuration restrains an imbalance between the irradiated area and the area taken up by the operating unitary power generation sections D. The configuration thus realizes efficient power generation.

The photovoltaic device 1 in accordance with the present embodiment differs from the photovoltaic device 1 in accordance with embodiment 2 in some respects including the following. The unitary power generation sections D are divided into equal numbers of them (e.g., into groups of three) (groups SG13, SG46, and SG79), and the connection points CP34 and CP67 located at the boundaries which divide the unitary power generation sections D into the groups (the boundary between the groups SG13 and SG46 and the boundary between the groups SG46 and SG79) are designated as the specific connection points SP34 and SP67. The groups SG13, SG46, and SG79 are set up along the rows.

The function and effect for variation in the amount of light irradiation (e.g., shaded area) will be described more specifically in embodiments 7 to 9. The technical features of the photovoltaic device 1 in accordance with the present embodiment may be applied to photovoltaic devices 1 in accordance with other embodiments where appropriate.

Embodiment 5

A photovoltaic device 1 in accordance with the present embodiment will be described in reference to FIG. 5. The photovoltaic device 1 in accordance with the present embodiment has a basic configuration similar to that of the photovoltaic device 1 in accordance with embodiment 4 (see FIGS. 4A and 4B). Hence, the same reference numerals will be used where appropriate, and the description will focus on major technical differences. The equivalent circuit for the present embodiment is the same as the one shown in FIG. 4B. FIG. 4B is hence used in the present embodiment.

FIG. 5 is a plan view schematically illustrating the arrangement and connections of unitary power generation sections in the photovoltaic device 1 in accordance with embodiment 5 of the present invention.

In the photovoltaic device 1 in accordance with the present embodiment, the unitary power generation sections D are arranged like a matrix (planar arrangement) in each cluster power generation section G. For example, as shown in the scale-up view of the cluster power generation section G42 (FIG. 5), the unitary power generation sections D1 to D3 are arranged in the column direction DR (in the first column of the unitary power generation sections D), the unitary power generation sections D4 to D6 are arranged in the column direction DR (in the second column of the unitary power generation sections D), and the unitary power generation sections D7 to D9 are arranged in the column direction DR (in the third column of the unitary power generation sections D). Furthermore, the unitary power generation sections D1, D6, and D7 are arranged in the row direction DL (in the first row of the unitary power generation sections D), the unitary power generation sections D2, D5, and D8 are arranged in the row direction DL (in the second row of the unitary power generation sections D), and the unitary power generation sections D3, D4, and D9 are arranged in the row direction DL (in the third row of the unitary power generation sections D).

Since the unitary power generation sections D are arranged like a matrix in the photovoltaic device 1, the arrangement of the unitary power generation sections D in the photovoltaic device 1 is free from imbalance and hence uniform. The adverse effect of variation in the amount of light irradiation on a particular series stage (e.g., the leftmost unitary power generation sections D1, D2, and D3) is thereby further restrained.

In the photovoltaic device 1, the connection points CP34 and CP67 out of the connection points CP12, . . . , and CP89 in each one of the cluster power generation sections G (e.g., G11) are connected respectively to the connection points CP34 and CP67 out of the connection points CP in the other cluster power generation sections G (e.g., G12, . . . , and G43 excluding G11).

Specifically, the connection points CP34 and CP67 are connected in parallel respectively via the connection wiring CW34 and CW67. In other words, the connection points CP (CP34 and CP67) in each cluster power generation section G are designated as specific connection points SP34 and SP67 which are predetermined from among the connection points CP (there are eight connection points CP in the present embodiment), and connected to the similarly designated specific connection points SP34 and SP67 in the other cluster power generation sections G respectively.

In the photovoltaic device 1, the unitary power generation sections D are divided (e.g., the groups SG13, SG46, and SG79) along the columns (e.g., the group SG13 composed of the unitary power generation sections D1, D2, and D3, the group SG46 composed of the unitary power generation sections D4, D5, and D6, and the group SG79 composed of the unitary power generation sections D7, D8, and D9 are all arranged in the column direction DR) of the unitary power generation sections D (e.g., D1, . . . , and D9) in each cluster power generation section G (e.g., G42).

Thus, the unitary power generation sections D in each cluster power generation section G are divided along the rows (embodiment 4) or columns. Since the unitary power generation sections G are divided along the rows and columns in the photovoltaic device 1, the arrangement and connections of the specific connection points SP are simplified.

As described above, the photovoltaic device 1 in accordance with the present embodiment includes the parallel-connected cluster power generation sections G (G11, . . . , and G43) arranged at least either in the row direction DL or in the column direction DR, each of the cluster power generation sections G in turn including the unitary power generation sections D (D1, . . . , and D9), for converting light to electricity for power generation, which are connected in series via the connection points CP (CP12, . . . , and CP89). Furthermore, the cluster power generation sections G are each provided with specific connection points SP (SP34 and SP67) which are predetermined from among the connection points CP, and the specific connection points SP are connected to link the cluster power generation sections G.

Hence, in the photovoltaic device 1 in accordance with the present embodiment, the cluster power generation sections G (G11, . . . , and G43) formed by the series-connected unitary power generation sections D (D1, . . . , and D9) are connected in parallel at a specific stage (via the specific connection points SP, e.g., SP34 and SP67), so that the unitary power generation sections D located at particular positions (e.g., the unitary power generation sections D1, D2, and D3 in the leftmost cluster power generation sections G11, G21, G31, and G41 in FIG. 5) can be in effect distributed (the other unitary power generation sections D1, D2, and D3 than those in the leftmost cluster power generation sections G11, G21, G31, and G41). The configuration prevents the adverse effect of variation in the amount of light irradiation which may only occur at a specific series stage (e.g., a local reduction in light irradiation on the unitary power generation sections D (e.g., the leftmost unitary power generation sections D1, D2, and D3 located at the same position in terms of the row direction DL) caused by a shadow). Furthermore, even if there occurs variation in the amount of light irradiation, the configuration restrains an imbalance between the irradiated area and the area taken up by the operating unitary power generation sections D. The configuration thus realizes efficient power generation.

The photovoltaic device 1 in accordance with the present embodiment differs from the photovoltaic device 1 in accordance with embodiment 4 in that the rows and columns of the unitary power generation sections D arranged like a matrix in the cluster power generation sections G are switched.

The function and effect for variation in the amount of light irradiation (shaded area) will be described more specifically in embodiments 7 to 9.

The technical features of the photovoltaic device 1 in accordance with the present embodiment may be applied to photovoltaic devices 1 in accordance with other embodiments where appropriate.

Embodiment 6

A photovoltaic device 1 in accordance with the present embodiment will be described in reference to FIGS. 6A to 6C. The photovoltaic device 1 in accordance with the present embodiment has a basic configuration similar to that of the photovoltaic device 1 in accordance with embodiment 1 (see FIGS. 1A and 1B). Hence, the same reference numerals will be used where appropriate, and the description will focus on major technical differences.

Figure 6A:
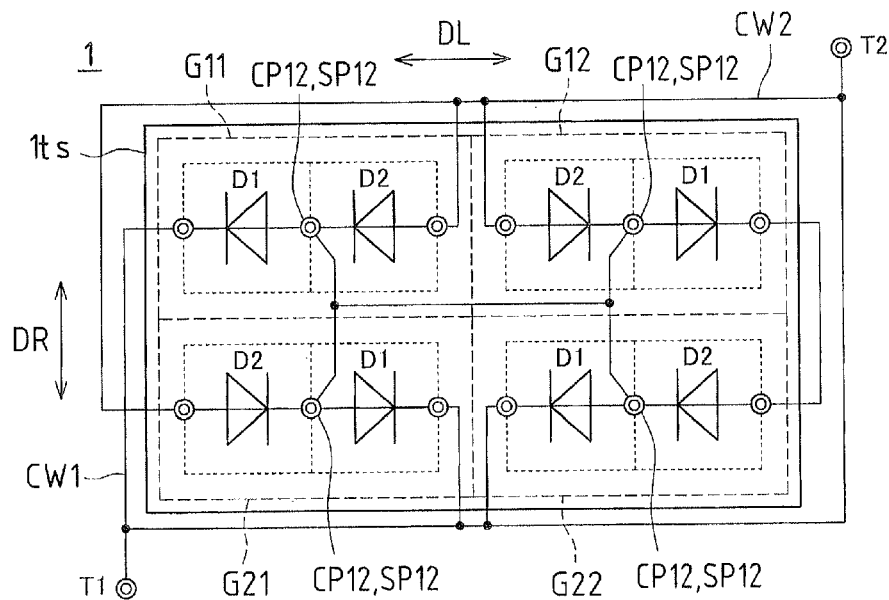
FIG. 6A is a plan view schematically illustrating the arrangement and connections of unitary power generation sections in a photovoltaic device according to embodiment 6 of the present invention.

FIG. 6A is a plan view schematically illustrating the arrangement and connections of unitary power generation sections in the photovoltaic device 1 in accordance with embodiment 6 of the present invention.

Figure 6B:
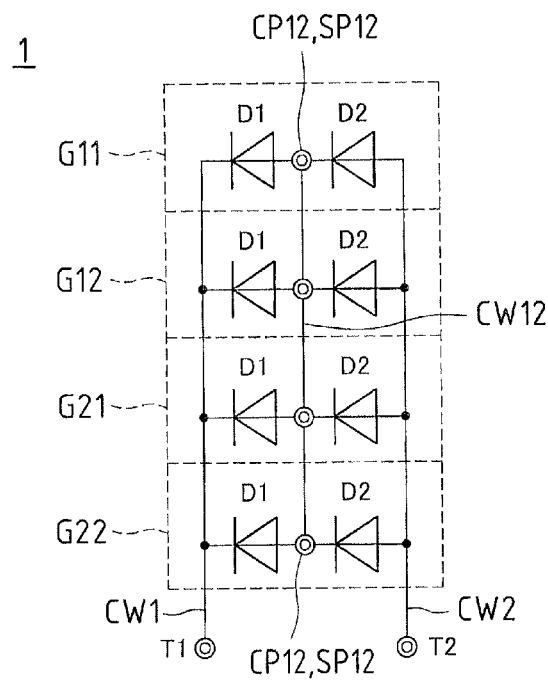
FIG. 6B is an equivalent circuit diagram illustrating, as an equivalent circuit, the connections of the unitary power generation sections in the photovoltaic device shown in FIG. 6A.

FIG. 6B is an equivalent circuit diagram illustrating, as an equivalent circuit, the connections of the unitary power generation sections in the photovoltaic device 1 shown in FIG. 6A. The equivalent circuit in FIG. 6B is identical to that in FIG. 1B.

The photovoltaic device 1 in accordance with the present embodiment includes unitary power generation sections D1 and D2 (hereinafter, may be simply referred to as "unitary power generation sections D" when it is not necessary to distinguish between them individually).

The photovoltaic device 1 includes a cluster power generation section G11 in which a series circuit is formed by connecting the two unitary power generation sections D1 and D2 in series via a connection point CP12. The photovoltaic device 1 also includes cluster power generation sections G12, G21, and G22 each of which is configured identically to the cluster power generation section G11 (hereinafter, the cluster power generation sections G11, . . . , and G22 may be simply referred to as the "cluster power generation sections G" when it is not necessary to distinguish between them individually).

The cluster power generation sections G11, G12, G21, and G22 are connected to a device terminal T1 via connection wiring CW1 and also to a device terminal T2 via connection wiring CW2, so as to form a parallel circuit.

The photovoltaic device 1 hence includes four (2 rows by 2 columns=4 as in a matrix) parallel-connected cluster power generation sections G in each of which there are provided two series-connected unitary power generation sections D as a power generation circuit (series circuit). The solar-generated electric power is taken out via the device terminals T1 and T2.

The unitary power generation sections D1 and D2 are arranged in the row direction DL of the cluster power generation sections G (planar arrangement). Alternatively, the unitary power generation sections D may be arranged in the column direction DR, not in the row direction DL, which is another form of planar arrangement.

The cluster power generation sections G11, ..., and G22 are arranged at least either in the row direction DL or in the column direction DR. In the photovoltaic device 1, the connection point CP12 in the cluster power generation section G11 is connected to the connection points CP12 in the other cluster power generation sections G (G12, G21, and G22) via connection wiring CW12.

In the photovoltaic device 1 in accordance with the present embodiment, the unitary power generation sections D in the cluster power generation sections G have different planar arrangements between the cluster power generation sections G. For example, the unitary power generation section D1 (first column) and the unitary power generation section D2 (second column) in the cluster power generation section G11 are arranged in the row direction DL, the unitary power generation section D2 (first column) and the unitary power generation section D1 (second column) in the cluster power generation section G12 are arranged in the row direction DL, the unitary power generation section D2 (first column) and the unitary power generation section D1 (second column) in the cluster power generation section G21 are arranged in the row direction DL, and the unitary power generation sections D1 and D2 in the cluster power generation section G22 are arranged in the row direction DL.

The unitary power generation sections D1 and D2 in the cluster power generation section G11 has a different planar arrangement from that of the unitary power generation sections D2 and D1 in the cluster power generation section G12 in the row direction DL in which the cluster power generation sections G are arranged. In other words, one of the cluster power generation sections G11 and G12 (e.g., G12) is rotated by 2×90° (=180°) from the other one (e.g., G11).

In the photovoltaic device 1, a cluster power generation section G (e.g., G12) is rotated by 180° from an adjacent cluster power generation section G (e.g., G11) which is in the original position. In the present embodiment, since the cluster power generation sections G are wider in the row direction DL than they are long in the column direction DR, no adjoining cluster power generation sections G are rotated by 90° relative to each other.

The unitary power generation sections D1 and D2 in the cluster power generation section G11 has a different planar arrangement from that of the unitary power generation sections D2 and D1 in the cluster power generation section G21 in the column direction DR in which the cluster power generation sections G are arranged. In other words, one of the cluster power generation sections G11 and G21 (e.g., G21) is rotated by 2×90° (=180°) from the other one (e.g., G11).

If a cluster power generation section G is to be rotated by 90° for a planar arrangement, the cluster power generation section G needs to be a square to achieve a tightly packed arrangement. If a cluster power generation section G is to be rotated by 180° for a planar arrangement, the cluster power generation section G may not be a square; it may be rectangle to achieve a tightly packed arrangement.

In the photovoltaic device 1, the unitary power generation sections D in the cluster power generation sections G have different planar arrangements both in the row direction DL and in the column direction DR in which the cluster power generation sections G are arranged. Alternatively, the unitary power generation sections D may have different planar arrangements either in the row direction DL or in the column direction DR. For example, the cluster power generation section G11 (the planar arrangement of the unitary power generation sections D1 and D2) may have the same arrangement as the cluster power generation section G12 (the planar arrangement of the unitary power generation sections D1 and D2) in the row direction DL, and the arrangement of the unitary power generation sections D in the cluster power generation sections G21 and G22 may be different from the arrangement of the unitary power generation sections D in the cluster power generation sections G11 and G12.

In the photovoltaic device 1, the unitary power generation sections D in those cluster power generation sections G which are adjacent to each other at least either in the row direction DL or in the column direction DR in which the cluster power generation sections G (e.g., the cluster power generation section G12 with respect to the cluster power generation section G11, and the cluster power generation section G21 with respect to the cluster power generation section G11) preferably have different planar arrangements (planar layouts) between the adjoining cluster power generation sections G. In the photovoltaic device, since the unitary power generation sections D in those cluster power generation sections G which are adjacent to each other at least either in the row direction DL or in the column direction DR have different planar arrangements between the adjoining cluster power generation sections G, the regularity of the arrangement of the unitary power generation sections D is restrained as much as possible. The configuration thereby realizes a distributed arrangement. Thus, the configuration further restrains the adverse effect of variation in the amount of light irradiation and prevents poor power generation efficiency.

In addition, the planar arrangement (planar layout) of the unitary power generation sections D in the cluster power generation sections G is preferably rotated by a multiple of 90° (e.g., 90° or 180°) between adjoining cluster power generation sections G. Thus, the photovoltaic device 1 enables the planar arrangement of the unitary power generation sections D to be readily different from one cluster power generation section G to another.

As described above, the photovoltaic device 1 in accordance with the present embodiment includes the parallel-connected cluster power generation sections G (G11, G12, G21, and G22) arranged at least either in the row direction DL or in the column direction DR, each of the cluster power generation sections G in turn including the unitary power generation sections D (D1 and D2) which are connected in series via the connection point CP12. Furthermore, the cluster power generation sections G are each provided with a specific connection point SP12 which is predetermined from among the connection points CP12, and the specific connection points SP12 are connected to link the cluster power generation sections G.

Hence, in the photovoltaic device 1 in accordance with the present embodiment, the cluster power generation sections G (G11, G12, G21, and G22) formed by the series-connected unitary power generation sections D (D1 and D2) are connected together in parallel at a specific stage (via the specific connection points SP, e.g., SP12), so that the unitary power generation sections D located at particular positions (e.g., the unitary power generation section D1 in the leftmost cluster power generation section G11 and the unitary power generation section D2 in the leftmost cluster power generation section G21 in FIG. 6A) can be in effect distributed (the other unitary power generation sections D1 and D2 than those in the leftmost cluster power generation sections G11 and G21). The configuration prevents the adverse effect of variation in the amount of light irradiation which may only occur at a specific series stage (e.g., a local reduction in light irradiation on the unitary power generation sections D (e.g., the leftmost unitary power generation sections D1 and D2 located at the same position in terms of the row direction DL) caused by a shadow). Furthermore, even if there occurs variation in the amount of light irradiation, the configuration restrains an imbalance between the irradiated area and the area taken up by the operating unitary power generation sections D. The configuration thus realizes efficient power generation.

The present embodiment has been so far described assuming that the cluster power generation sections G are adjacent to each other at least either in the row direction DL or in the column direction DR. Alternatively, the present embodiment may be applied to the mutually adjoining cluster power generation sections G which are not linearly arranged. In other words, in the photovoltaic device 1, the planar arrangement of the unitary power generation sections D may be at least partially different between the mutually adjoining cluster power generation sections G. In either case, similar effects are obtained.

Figure 6C:
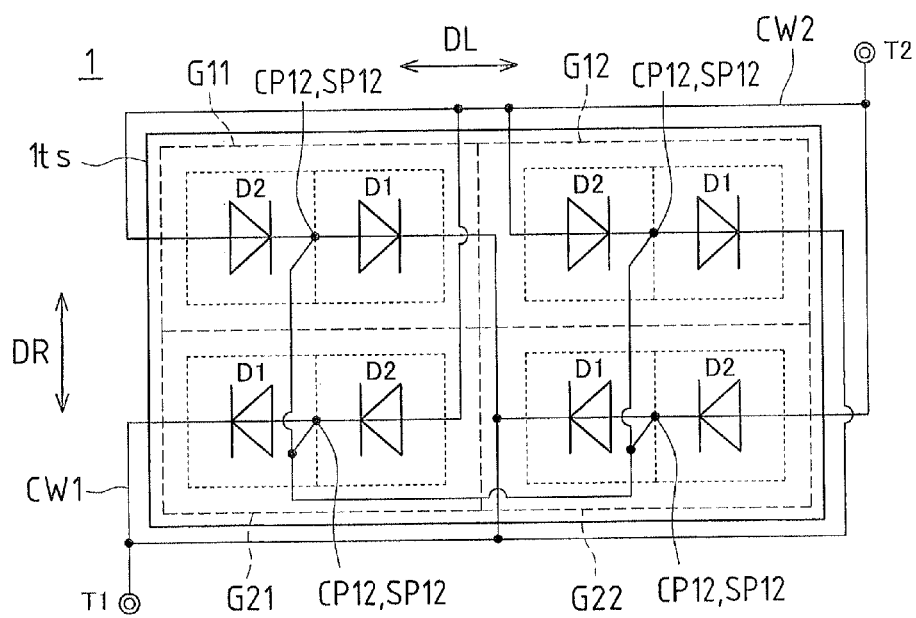
FIG. 6C is a plan view of a variation of the arrangement of the unitary power generation sections in the photovoltaic device 1 shown in FIG. 6A.

FIG. 6C is a plan view illustrating a variation example of the arrangement of the unitary power generation sections in the photovoltaic device 1 shown in FIG. 6A.

The photovoltaic device 1 shown in FIG. 6C differs from the arrangement of the unitary power generation sections D (cluster power generation sections G) in FIG. 6A in that the planar arrangements of the unitary power generation sections D are switched (in directionality) in the cluster power generation sections G11 and G21. Its equivalent circuit is shown in FIG. 6B, similarly to FIG. 6A. FIG. 6C shows the same basic configuration as FIG. 6A. Hence, the description will focus on major differences.

Because of the arrangement, the portions in the sun are composed, in the equivalent circuit, of three parallel-connected unitary power generation sections D1 and three parallel-connected unitary power generation sections D2, the unitary power generation sections D1 and D2 being connected in series, in any of shadow condition examples 1, 2, and 3 (see embodiment 1). Therefore, there is no imbalance in output between the series stages. The arrangement thus enables an output rate close to the irradiated area rate to the output produced when the entire face is in the sun, similarly to the shadow condition current characteristic VIs1 and the shadow condition power characteristic VPs1 shown in FIGS. 1C and 1D.

All the cluster power generation sections G in embodiment 1 are arranged in the same direction. In contrast, the present embodiment is characterized in that not all the cluster power generation sections G are arranged in the same direction. Some cluster power generation sections G are rotated by 180° (e.g., the cluster power generation section G12 is rotated from the cluster power generation section G11 in FIG. 6A, and the cluster power generation section G21 is rotated from the cluster power generation section G11 in FIG. 6C). Hence, the unitary power generation sections D in each series stage are, in the planar layout, more distributed, so that it is more likely that the partial shadow, which typically falls more often on a particular part of the light-receiving face than on the other parts, is cast more equally covering the stages of the series circuit. Thus, the configuration more effectively restrains an imbalance in irradiated area between the series stages and increases expected output for partial shadow of various shapes.

The function and effect for variation in the amount of light irradiation (e.g., shaded area) will be described more specifically in embodiments 7 to 9.

The technical features of the photovoltaic device 1 in accordance with the present embodiment may be applied to photovoltaic devices 1 in accordance with other embodiments where appropriate.

Embodiment 7

The functions and effects of the photovoltaic device 1 described in embodiments 1 to 6 will be described as the present embodiment in reference to FIGS. 7A to 7E. The photovoltaic devices 1 described in embodiment 2 (see FIGS. 2A and 2B) and embodiment 4 (see FIGS. 4A and 4B) will be taken as examples for convenience.

For convenience of description, it is assumed in the present embodiment that each unitary power generation section D is composed of a single photovoltaic element.

Figure 7A:
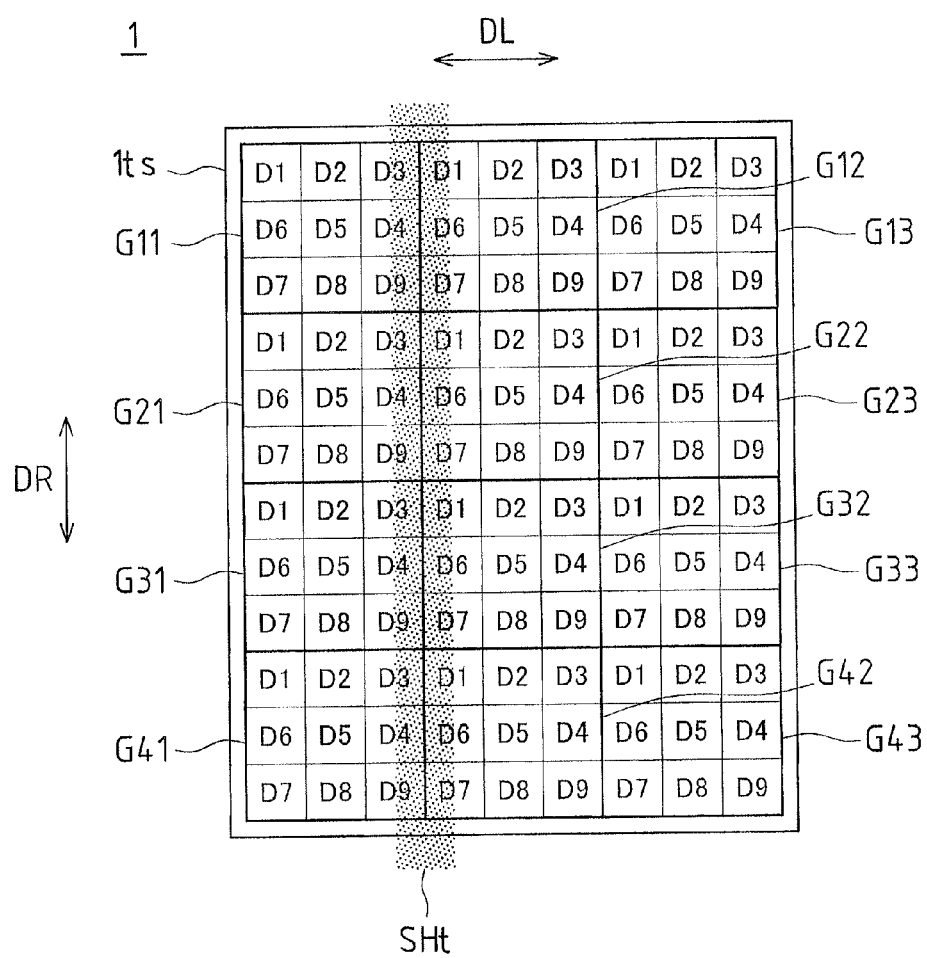
FIG. 7A is a plan view schematically illustrating the condition of a shadow (lengthwise shadow) cast in a column direction over the arrangement of the unitary power generation sections in the photovoltaic device shown in FIG. 2A or 4A.

FIG. 7A is a plan view schematically illustrating the condition of a shadow (lengthwise shadow) cast in the column direction over the arrangement of the unitary power generation sections in the photovoltaic device 1 shown in FIG. 2A or 4A.

Figure 7B:
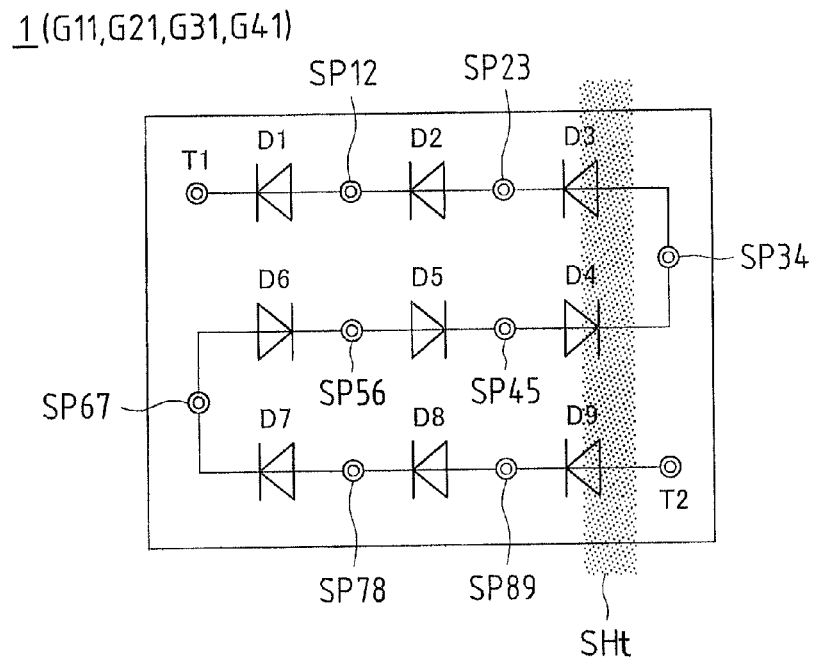
FIG. 7B is an equivalent circuit diagram schematically depicting the influence of a shadow (lengthwise shadow) cast in the column direction on the equivalent circuit of the connections of the unitary power generation sections in the photovoltaic device shown in FIG. 2B.
Figure 7C:
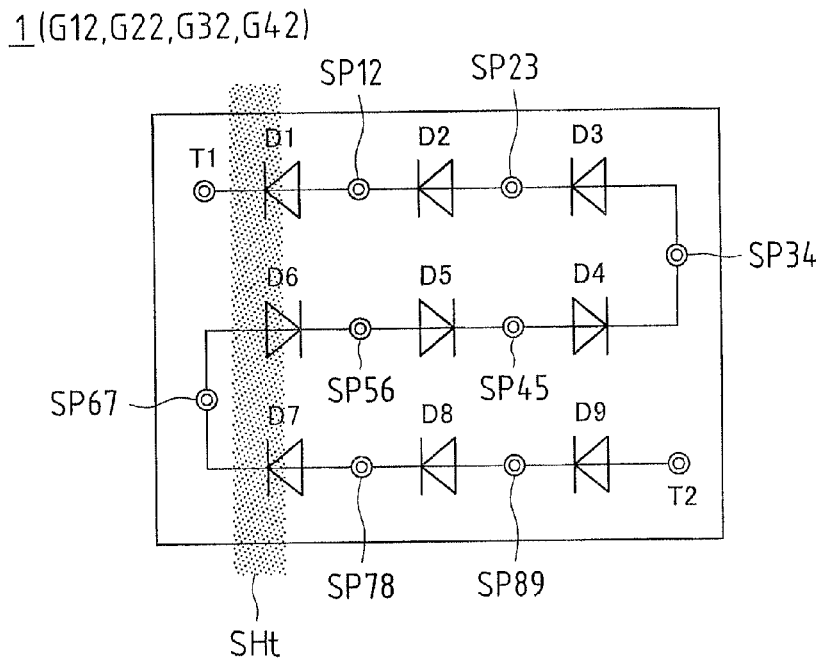
FIG. 7C is an equivalent circuit diagram schematically depicting the influence of a shadow (lengthwise shadow) cast in the column direction on the equivalent circuit of the connections of the unitary power generation sections in the photovoltaic device shown in FIG. 2B.

FIGS. 7B and 7C are each an equivalent circuit diagram schematically depicting the influence of a shadow (lengthwise shadow) cast in the column direction on the equivalent circuit of the connections of the unitary power generation sections in the photovoltaic device 1 shown in FIG. 2B.

Figure 7D:
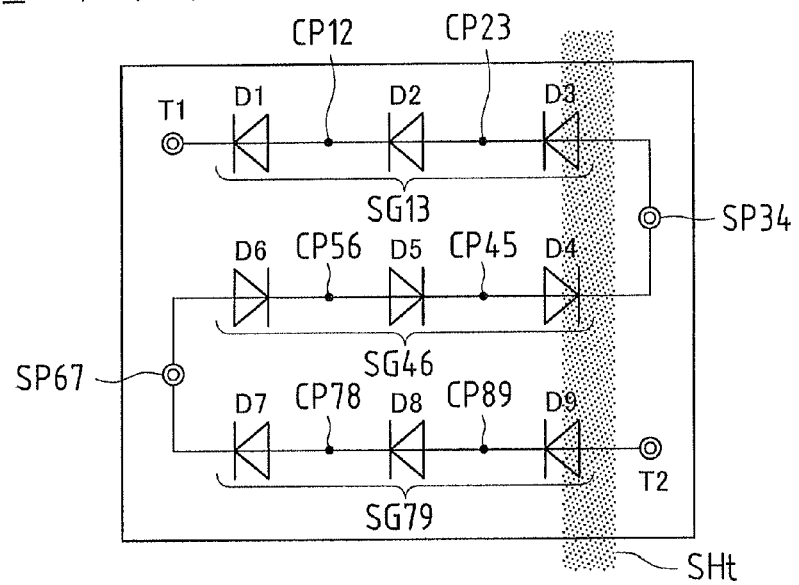
FIG. 7D is an equivalent circuit diagram schematically depicting the influence of a shadow (lengthwise shadow) cast in the column direction on the equivalent circuit of the connections of the unitary power generation sections in the photovoltaic device shown in FIG. 4B.
Figure 7E:
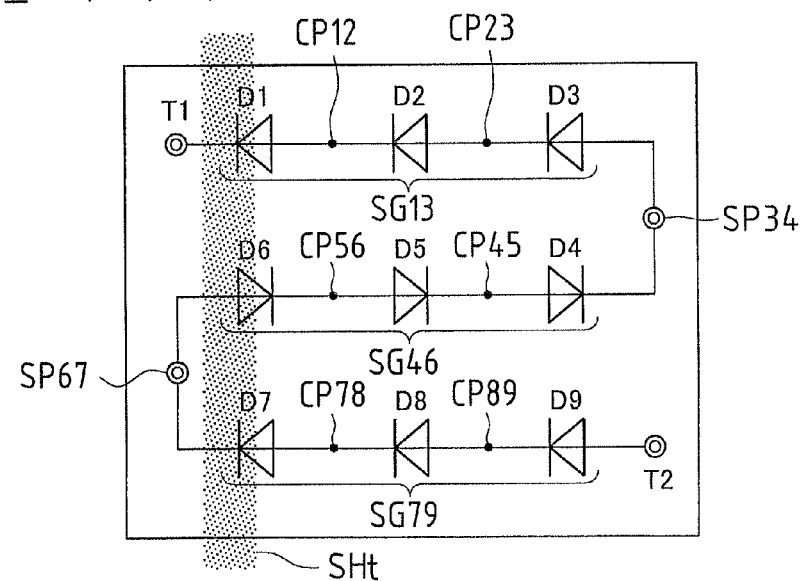
FIG. 7E is an equivalent circuit diagram schematically depicting the influence of a shadow (lengthwise shadow) cast in the column direction on the equivalent circuit of the connections of the unitary power generation sections in the photovoltaic device shown in FIG. 4B.

FIGS. 7D and 7E are each an equivalent circuit diagram schematically depicting the influence of a shadow (lengthwise shadow) cast in the column direction on the equivalent circuit of the connections of the unitary power generation sections in the photovoltaic device 1 shown in FIG. 4B.

First, the influence of a shadow cast in the column direction on the photovoltaic device 1 (embodiment 2) shown in FIG. 2A (FIG. 2B) will be described in reference to FIGS. 7A, 7B, and 7C. Then, the influence of a shadow cast in the column direction on the photovoltaic device 1 (embodiment 4) shown in FIG. 4A (FIG. 4B) will be described in reference to FIGS. 7A, 7D, and 7E.

In the photovoltaic device 1 shown in FIG. 7A, the row direction DL generally corresponds to the horizontal direction, and the column direction DR generally corresponds to the vertical direction. In actual practice, the column direction DR is adjusted to tilt at a certain angle to the ground according to the altitude of the shining sun (the latitude at which the photovoltaic device 1 is installed) and other factors. For example, if the photovoltaic device 1 is installed on, for example, a vehicle roof which is substantially flat with respect to the ground, the photovoltaic device 1 can be safely regarded as being installed on a horizontal face which is hardly affected by the row direction DL or the column direction DR.

For convenience of description, it is assumed, as a variation of light irradiation (sunlight) in the present embodiment, that a shadow SHt (lengthwise shadow, which is longer in the column direction DR than it is wide in the row direction DL) is cast on the photovoltaic device 1 (see FIGS. 7A, 7B, 7C, 7D, and 7E).

In other words, in the photovoltaic device 1, it is assumed that an elongated shadow SHt is cast covering from the unitary power generation sections D3, D4, and D9 located along the right edge (third column) of the cluster power generation sections G11, G21, G31, and G41 to the unitary power generation sections D1, D6, and D7 located along the left edge (first column) of the cluster power generation sections G12, G22, G32, and G42.

The irradiated area rate is determined by selectively focusing on the nine unitary power generation sections D (e.g., those in the first row) arranged in the row direction DL (the three unitary power generation sections D1, the three unitary power generation sections D2, and the three unitary power generation sections D3). Specifically, since the shadow SHt is cast on the right half of the first unitary power generation section D3 and the left half of the second unitary power generation section D1 (see FIG. 7A) in the nine unitary power generation sections D, the irradiated area rate is $1-(0.5\times2)/9=1-1/9=8/9=0.8889$ (88.89%).

Embodiment 7-1: All Series Stages are Individually Connected in Parallel.

All the unitary power generation sections D1 to D9 constituting the nine series stages are individually connected in parallel (see FIGS. 7B, 7C, and 2B).

In the nine series stages (the unitary power generation sections D1 to D9), the unitary power generation sections D2, D5, and D8 (twelve each are arranged as in a matrix) are all operable. The unitary power generation sections D1, D3, D4, D6, D7, and D9 are partly operable: eight out of the twelve arranged as in a matrix are operable, and the remaining four of them are in the shadow SHt and inoperable. However, the latter four are regarded as half functional and thus counted as two fully operable unitary power generation sections. Therefore, as a whole, ten unitary power generation sections D1, D3, D4, D6, D7, and D9 are operable.

The area efficiency of a series stage with low efficiency dictates the area efficiency of the photovoltaic device 1. Hence, assuming that twelve (not ten) are operable, the area efficiency is 10 (operable)/12 (installed)=0.8333 (83.33%).

Therefore, the area efficiency/irradiated area rate is $0.8333/0.8889=0.9375$ (93.75%). This result shows that the power generation efficiency is higher than when the nine series stages are not individually connected in parallel.

Embodiment 7-2: Series Stages Are Connected In Parallel In Groups.

The unitary power generation sections D1 to D9 in the nine series stages are connected in parallel in groups of three (see FIGS. 7D, 7E, and 4B).

The cluster power generation sections G11, G21, G31, and G41 are divided into the groups SG13, SG46, SG79 in the column direction DR (see FIG. 7D). In the group SG13 which corresponds to the shadow SHt, since the unitary power generation section D3 is affected by the shadow SHt, the unitary power generation sections D1 and D2 are also affected. The three unitary power generation sections D1, D2, and D3 are thus counted as one and half fully operable unitary power generation sections. Likewise, the groups SG46 and SG79 each provide one and half fully operable unitary power generation sections.

In the group SG13 arranged in the column direction DR in the cluster power generation sections G12, G22, G32, and G42 (see FIG. 7E), since the unitary power generation section D1 is affected by the shadow SHt, the unitary power generation sections D2 and D3 are also affected. The three unitary power generation sections D1, D2, and D3 are thus counted as one and half fully operable unitary power generation sections. Likewise, the groups SG46 and SG79 each provide one and half fully operable unitary power generation sections D.

Out of the twelve cluster power generation sections G, the four cluster power generation sections G13, G23, G33, and G43 are all operable. The remaining eight cluster power generation sections G11, G12, G21, G22, G31, G32, G41, and G41 are each counted as 0.5 fully operable cluster power generation sections G, providing four fully operable cluster power generation sections G. Therefore, as a whole, eight cluster power generation sections G are operable.

The area efficiency is 8 (operable)/12 (installed)=0.6667 (66.67%).

Therefore, the area efficiency/irradiated area rate is $0.6667/0.8889=0.7500$ (75.0%). This result shows that the area efficiency is comparable to the conventional case where the nine series stages are not individually connected in parallel. However, the power generation efficiency is higher than when a shadow (e.g., a widthwise shadow; see embodiment 8-2) is assumed which is different from the shadow (lengthwise shadow) of the present embodiment. Therefore, expected power generation efficiency is improved.

Embodiment 8

The functions and effects of the photovoltaic device 1 described in embodiments 1 to 6 will be described as the present embodiment in reference to FIGS. 8A to 8E. The photovoltaic device 1 described in embodiment 2 (see FIGS. 2A and 2B) and embodiment 4 (see FIGS. 4A and 4B) will be taken as examples for convenience.

For convenience of description, it is assumed in the present embodiment that each unitary power generation section D is composed of a single photovoltaic element.

Figure 8A:
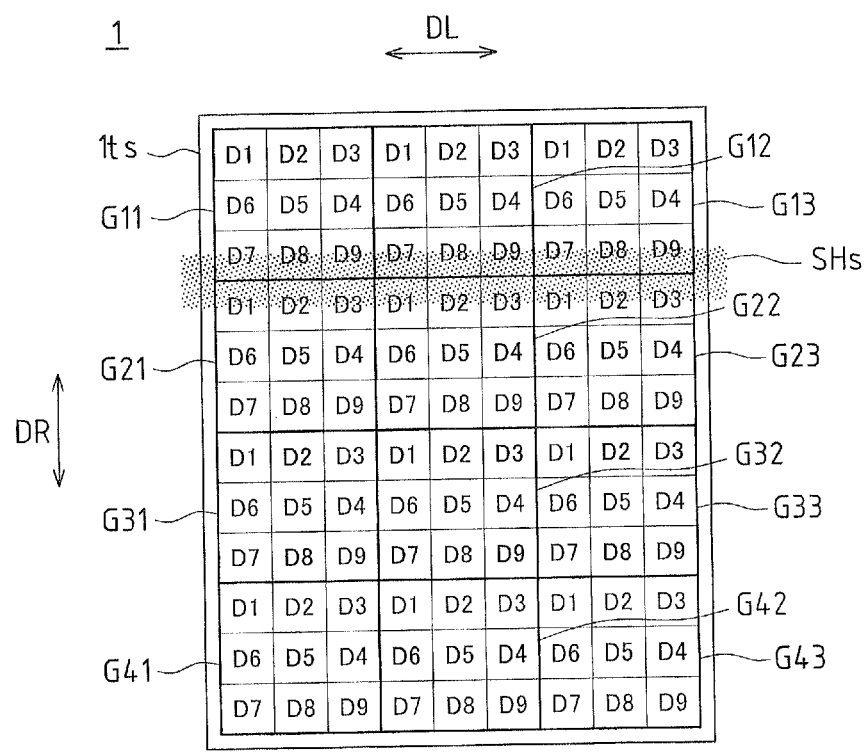
FIG. 8A is a plan view schematically illustrating the condition of a shadow (widthwise shadow) cast in a row direction over the arrangement of the unitary power generation sections in the photovoltaic device shown in FIG. 2A or 4A.

FIG. 8A is a plan view schematically illustrating the condition of a shadow (widthwise shadow) cast in the row direction over the arrangement of the unitary power generation sections in the photovoltaic device 1 shown in FIG. 2A or 4A.

Figure 8B:
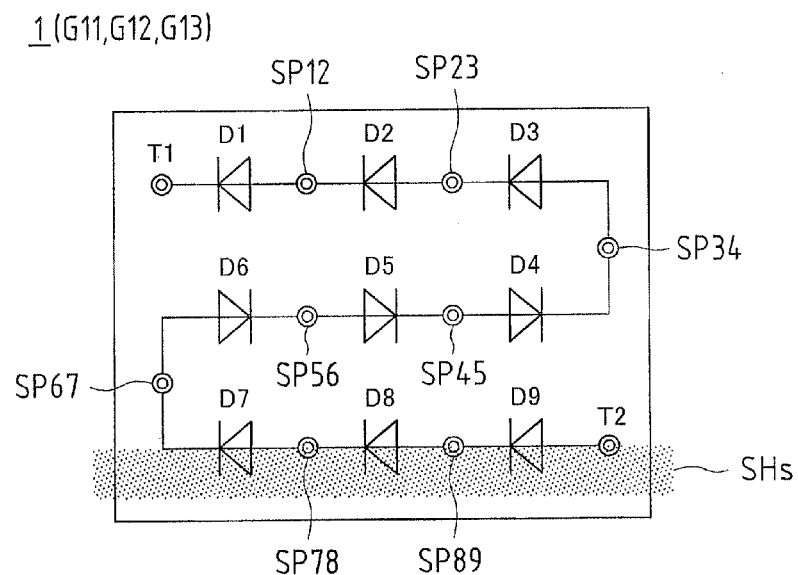
FIG. 8B is an equivalent circuit diagram schematically depicting the influence of a shadow (widthwise shadow) cast in the row direction on the equivalent circuit of the connections of the unitary power generation sections in the photovoltaic device shown in FIG. 2B.
Figure 8C:
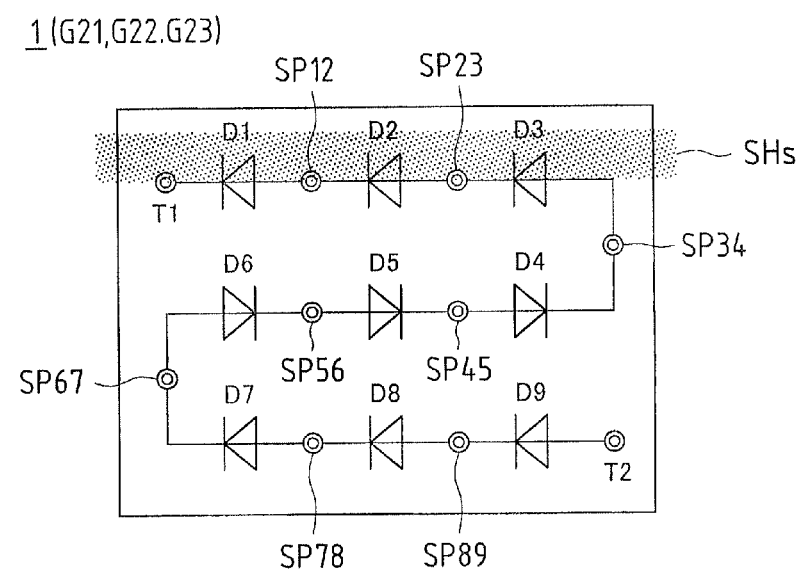
FIG. 8C is an equivalent circuit diagram schematically depicting the influence of a shadow (widthwise shadow) cast in the row direction on the equivalent circuit of the connections of the unitary power generation sections in the photovoltaic device shown in FIG. 2B.

FIGS. 8B and 8C are each an equivalent circuit diagram schematically depicting the influence of a shadow (widthwise shadow) cast in the row direction on the equivalent circuit of the connections of the unitary power generation sections in the photovoltaic device 1 shown in FIG. 2B.

Figure 8D:
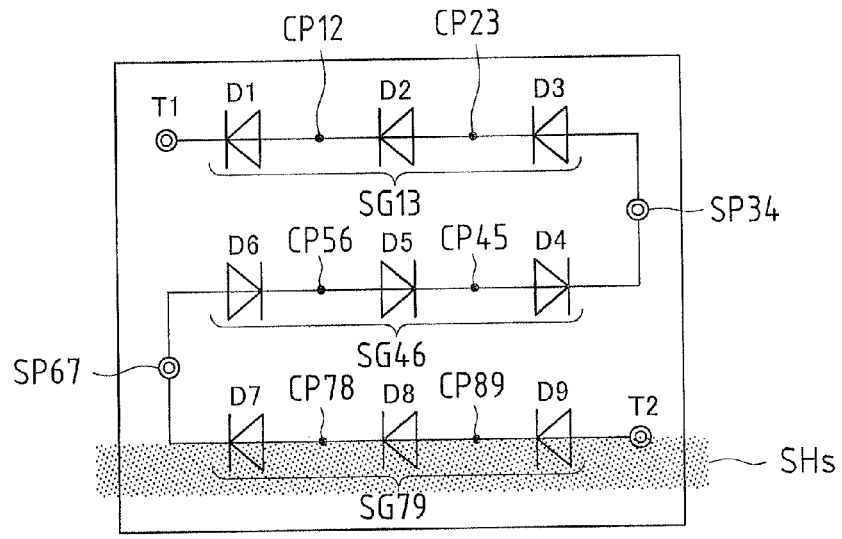
FIG. 8D is an equivalent circuit diagram schematically depicting the influence of a shadow (widthwise shadow) cast in the row direction on the equivalent circuit of the connections of the unitary power generation sections in the photovoltaic device shown in FIG. 4B.
Figure 8E:
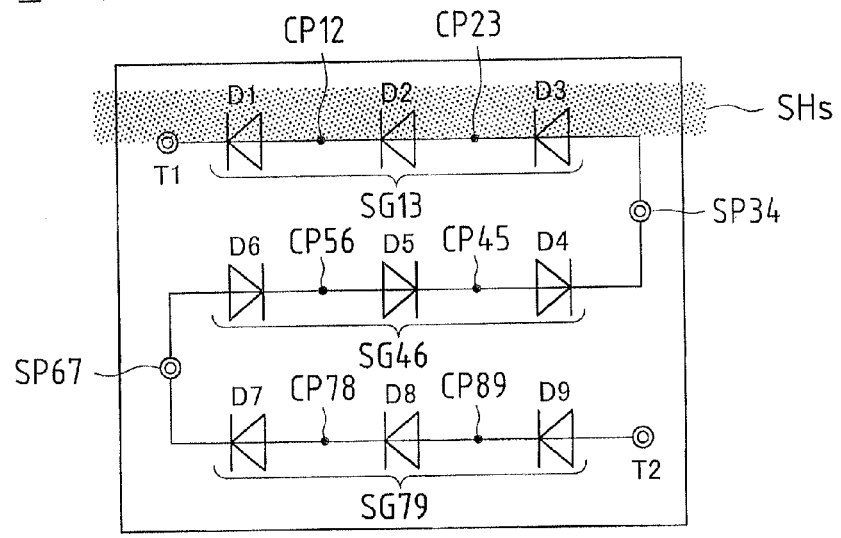
FIG. 8E is an equivalent circuit diagram schematically depicting the influence of a shadow (widthwise shadow) cast in the row direction on the equivalent circuit of the connections of the unitary power generation sections in the photovoltaic device shown in FIG. 4B.

FIGS. 8D and 8E are each an equivalent circuit diagram schematically depicting the influence of a shadow (widthwise shadow) cast in the row direction on the equivalent circuit of the connections of the unitary power generation sections in the photovoltaic device 1 shown in FIG. 4B.

First, the influence of a shadow cast in the column direction on the photovoltaic device 1 (embodiment 2) shown in FIG. 2A (FIG. 2B) will be described in reference to FIGS. 8A 8B, and 8C. Then, the influence of a shadow cast in the column direction on the photovoltaic device 1 (embodiment 4) shown in FIG. 4A (FIG. 4B) will be described in reference to FIGS. 8A, 8D, and 8E.

The photovoltaic device 1 shown in FIG. 8A is similar to the photovoltaic device 1 shown in FIG. 7A, and its detailed description is not repeated here.

For convenience of description, it is assumed, as a variation of light irradiation (sunlight) in the present embodiment, that a shadow SHs (widthwise shadow, which is wider in the row direction DL than it is long in the column direction DR) is cast on the photovoltaic device 1 (see FIGS. 8A, 8B, 8C, 8D, and 8E).

In other words, in the photovoltaic device 1, it is assumed that an elongated shadow SHs is cast covering from the unitary power generation sections D7, D8, and D9 located along the bottom edge of the cluster power generation sections G11, G12, and G13 (the third row of unitary power generation sections D) to the unitary power generation sections D1, D2, and D3 located along the top edge of the cluster power generation sections G21, G22, and G23 (the first row of unitary power generation sections D).

The irradiated area rate is determined by selectively focusing on the twelve unitary power generation sections D (e.g., those in the first column of unitary power generation sections D in the cluster power generation sections G11, G21, G31, and G41) arranged in the column direction DR (the four unitary power generation sections D1, the four unitary power generation sections D6, and the four unitary power generation sections D7). Specifically, since the shadow SHt is cast on the bottom half of the first unitary power generation section D7 and the top half of the first unitary power generation section D1 (FIG. 8A) in the twelve unitary power generation sections D, the irradiated area rate is $1-(0.5\times2)/12=1-\frac{1}{12}=\frac{11}{12}=0.9167$ (91.67%).

Embodiment 8-1: All Series Stages are Individually Connected in Parallel.

All the unitary power generation sections D1 to D9 constituting the nine series stages are individually connected in parallel (see FIGS. 8B, 8C, and 2B).

In the nine series stages (the unitary power generation sections D1 to D9), the unitary power generation sections D1 to D3 (nine each) in the cluster power generation sections G11, G12, G13, G31, G32, G33, G41, G42, and G43 are all operable. The unitary power generation sections D1 to D3 (three each) in the cluster power generation sections G21, G22, and G23 are affected by the shadow SHs and regarded as only half functional in terms of area. Therefore, in the cluster power generation sections G21, G22, and G23, 1.5 each of the unitary power generation sections D1 to D3 are regarded as operable.

In the nine series stages, the unitary power generation sections D4 to D6 (twelve each) in the cluster power generation sections G11 to G43 are all operable.

In addition, in the nine series stages, the unitary power generation sections D7 to D9 (nine each) in the cluster power generation sections G21, G22, G23, G31, G32, G33, G41, G42, and G43 are all operable. The unitary power generation sections D7 to D9 (three each) in the cluster power generation sections G11, G12, and G13 are affected by the shadow SHs and regarded as only half functional in terms of area. Therefore, in the cluster power generation sections G11, G12, and G13, 1.5 each of the unitary power generation sections D7 to D9 are regarded as operable.

In other words, for the unitary power generation sections D1, D2, D3, D7, D8, and D9 (twelve each are arranged as in a matrix in the cluster power generation sections G), 9+1.5=10.5 each are regarded as operable. Meanwhile, for the unitary power generation sections D4, D5, and D6 (twelve each are arranged as in a matrix in the cluster power generation sections G), 12 each are regarded as operable.

The area efficiency of a series stage with low efficiency dictates the area efficiency of the photovoltaic device 1. Hence, assuming that the series stage with 10.5 operable unitary power generation sections (not the series stage with twelve operable unitary power generation sections) is dictating, the area efficiency is 10.5 (operable)/12 (installed)= 0.875 (87.5%).

Therefore, the area efficiency/irradiated area rate is $^{87.5}/_{91.67}=0.9545$ (95.45%). This result shows that the power generation efficiency is higher than when the nine series stages are not individually connected in parallel.

Embodiment 8-2: Series Stages are Connected in Parallel in Groups.

The unitary power generation sections D1 to D9 in the nine series stages are connected in parallel in groups of three (see FIGS. 8D, 8E, and 4B). In the nine series stages (the unitary power generation sections D1 to D9), the unitary power generation sections D1 to D3 (nine each) in the cluster power generation sections G11, G12, G13, G31, G32, G33, G41, G42, and G43 are all operable. The unitary power generation sections D1 to D3 (three each) forming the individual groups SG13 in the cluster power generation sections G21, G22, and G23 are affected by the shadow SHs and regarded as only half functional in terms of area. Therefore, in the cluster power generation sections G21, G22, and G23, 1.5 each of the unitary power generation sections D1 to D3 are regarded as operable in each group SG13.

In the nine series stages, the unitary power generation sections D4 to D6 (twelve each) in the cluster power generation sections G11 to G43 are all operable.

In addition, in the nine series stages, the unitary power generation sections D7 to D9 (nine each) in the cluster power generation sections G21, G22, G23, G31, G32, G33, G41, G42, and G43 are all operable. The unitary power generation sections D7 to D9 (three each) forming the individual groups SG79 in the cluster power generation sections G11, G12, and G13 are affected by the shadow SHs and regarded as only half functional in terms of area. Therefore, in the cluster power generation sections G11, G12, and G13, 1.5 each of the unitary power generation sections D7 to D9 are regarded as operable in each group SG13.

In other words, for the unitary power generation sections D1, D2, D3, D7, D8, and D9 (twelve each are arranged as in a matrix in the cluster power generation sections G), 1.5 out of three unitary power generation sections are regarded operable in each group SG13 and SG79, and as a whole, 9+1.5=10.5 each are regarded as operable. For the unitary power generation sections D4, D5, and D6 (twelve each are arranged as in a matrix in the cluster power generation sections G), all twelve of them are operable regardless of the group SG.

The area efficiency of a series stage with low efficiency dictates the area efficiency of the photovoltaic device 1. Hence, assuming that the series stage with 10.5 operable unitary power generation sections (not the series stage with twelve operable unitary power generation sections) is dictating, the area efficiency is 10.5 (operable)/12 (installed)= 0.875 (87.5%).

Therefore, the area efficiency/irradiated area rate is $^{87.5}/_{91.67}=0.9545$ (95.45%). This result, similarly to embodiment 8-1, shows that the power generation efficiency is higher than when the nine series stages are not individually connected in parallel.

As described in embodiments 7 and 8, the solar cell system 1 of embodiments 1 to 6 achieves a higher power generation efficiency as an expected value for partial shadow of various unpredictable shapes when the series stages are connected in parallel in groups (embodiment 8-2) than, for example, when the nine series stages are not individually connected in parallel. The solar cell system 1 achieves an even higher expected power generation efficiency when all the series stages are connected in parallel (embodiments 7-1 and 8-1).

Embodiment 9

A photovoltaic device 1 in accordance with the present embodiment will be described in reference to FIGS. 9A and 9B. The photovoltaic device 1 in accordance with the present embodiment has a basic configuration similar to that of the photovoltaic devices 1 in accordance with embodiment 2 (see FIGS. 2A and 2B) and embodiment 4 (see FIGS. 4A and 4B). Hence, the same reference numerals will be used where appropriate, and the description will focus on major technical differences. The unitary power generation sections D1 to D9 are connected as described in embodiments 2 and 4 (nine unitary power generation sections D1 to D9 are connected to form a series circuit). Alternatively, they may be connected as in embodiment 5.

Figure 9A:
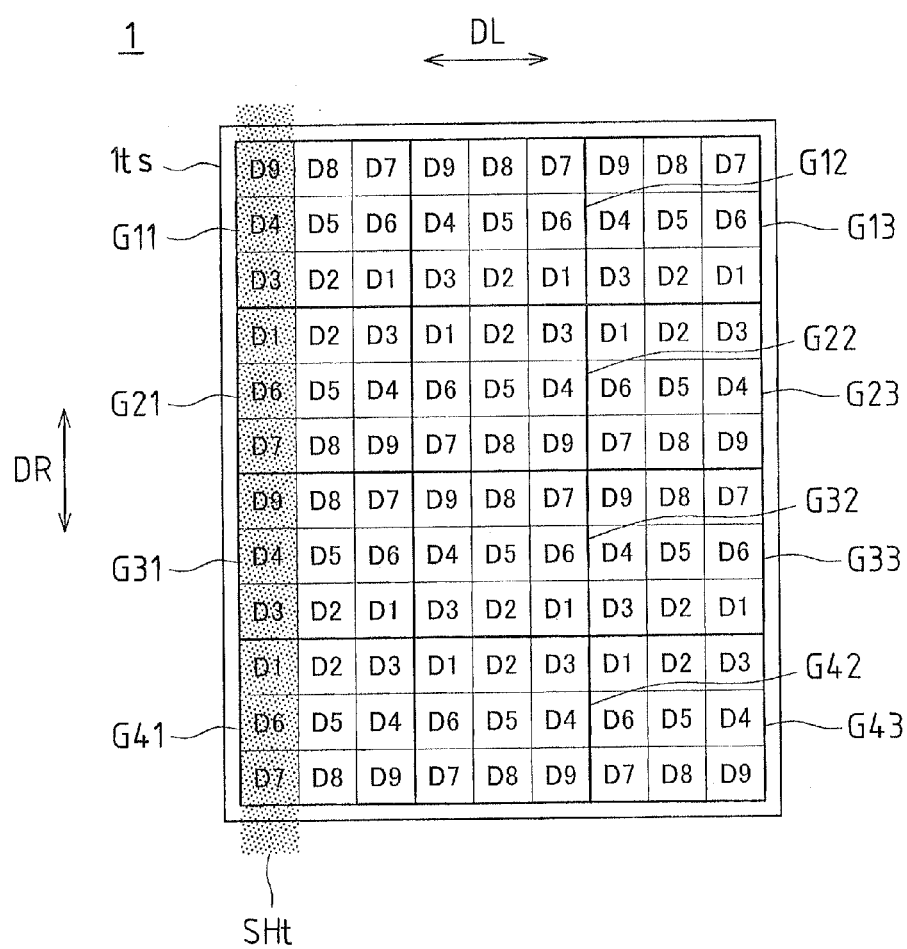
FIG. 9A is a plan view schematically illustrating the arrangement of unitary power generation sections in a photovoltaic device according to embodiment 9 of the present invention (the arrangement of the unitary power generation sections differs from one cluster power generation section to another either in the rows or columns).

FIG. 9A is a plan view schematically illustrating the arrangement of unitary power generation sections in the photovoltaic device 1 in accordance with embodiment 9 of the present invention (the arrangement of the unitary power generation sections D differs from one cluster power generation section to another either in the rows or columns).

In the photovoltaic device 1 shown in FIG. 9A, the unitary power generation sections D (D1 to D9) in the cluster power generation sections G11, G12, and G13 arranged in the row direction DL (the first row of the cluster power generation sections G) are arranged differently from the unitary power generation sections D (D1 to D9) in the cluster power generation sections G21, G22, and G23 arranged in the row direction DL (the second row of the cluster power generation sections G). Likewise, the unitary power generation sections D in the cluster power generation sections G31, G32, and G33 in the row direction DL (the third row of the cluster power generation sections G) are arranged differently from the unitary power generation sections D in the cluster power generation sections G41, G42, and G43 in the row direction DL (the fourth row of the cluster power generation sections G). Again, the unitary power generation sections D in the second row of the cluster power generation sections G are arranged differently from the unitary power generation sections D in the third row of the cluster power generation sections G.

In other words, the planar arrangement of the unitary power generation sections D in the cluster power generation sections G is rotated by 180° between the cluster power generation sections G that are adjacent to each other in the column direction DR, so that the unitary power generation sections D in the column direction DR can be arranged in multiple manners.

Thus, the leftmost unitary power generation sections D are arranged alternately between the cluster power generation sections G (e.g., the unitary power generation sections D9, D4, and D3 in the cluster power generation section G11, the unitary power generation sections D1, D6, and D7 in the cluster power generation section G21, the unitary power generation sections D9, D4, and D3 in the cluster power generation section G31, and the unitary power generation sections D1, D6, and D7 in the cluster power generation section G41). When a shadow SHt is cast along the left edge (first column of the unitary power generation sections D) in terms of the row direction DL, for example, the configuration enables the photovoltaic device 1 to distribute the influence of the shadow SHt on the unitary power generation sections D and restrain poor power generation efficiency which could be caused by the shadow SHt.

As a comparative example which illustrates the functions and effects of the photovoltaic device 1 shown in FIG. 9A, assume a photovoltaic device 1 (embodiments 2 and 4) in which the planar arrangement of the cluster power generation section G21 is commonly applied to the other cluster power generation sections G and a condition in which the shadow SHt is cast on the leftmost unitary power generation sections D (D1, D6, and D7).

In the photovoltaic devices 1 in accordance with embodiments 2 and 4 as a comparative example, the unitary power generation sections D1, D6, and D7 (twelve each) in the cluster power generation sections G11 to G43 are connected in parallel, and eight (those in the cluster power generation sections G12, G13, G22, G23, G32, G33, G42, and G43) of the twelve are operable. The area efficiency is $8/12=0.6667$ (66.67%).

Since eight of the nine unitary power generation sections D are in the sun in each row in terms of the column direction DR, the irradiated area rate is $8/9=0.8889$ (88.89%). Therefore, the area efficiency is as low as 66.67% for the irradiated area rate of 88.89%.

In contrast to the comparative example, in the photovoltaic device 1 shown in FIG. 9A, the leftmost unitary power generation sections D in the shadow SHt are composed of the unitary power generation sections D9, D4, and D3 in the cluster power generation sections G11 and G31 and the unitary power generation sections D1, D6, and D7 in the cluster power generation sections G21 and G41. Therefore, ten each of the unitary power generation sections D1, D3, D4, D6, D7, and D9 are fully functional unitary power generation sections D, and the area efficiency is $10/12=0.8333$ (83.33%).

Therefore, the area efficiency/irradiated area rate is $83.33/88.89=0.9375$ (93.75%). This result shows that the alternate arrangement of the unitary power generation sections D in the cluster power generation sections G prevents poor power generation efficiency which could be caused by variation in the amount of light irradiation.

The cluster power generation sections G21 and G41 are rotated by 180° from the cluster power generation sections G11 and G31 in the present embodiment (FIG. 9A). Alternatively, since each cluster power generation section G is a square, the cluster power generation sections G21 and G41 may be rotated by 90° from the cluster power generation sections G11 and G31. In either case, similar effects are obtained.

The cluster power generation sections G are arranged at least either in the row direction DL or in the column direction DR. Therefore, each cluster power generation section G may be rotated by a multiple of 90° from the cluster power generation section G which is adjacent to it either in the row direction DL or in the column direction DR.

Since the photovoltaic device 1 shown in FIG. 9A includes more cluster power generation sections G in the column direction DR, the photovoltaic device 1 is more effective to lengthwise shadows SHt when the cluster power generation sections G which are adjacent in the column direction DR are rotated relative to each other.

Specifically, the photovoltaic device 1 includes more cluster power generation sections G in the column direction DR than in the row direction DL and has some of the cluster power generation sections G which are adjacent in the column direction DR being rotated by 180° (a multiple of 90°). Therefore, the photovoltaic device 1 is effective to a light irradiation irregularity which extends in the column direction DR and restrains reductions in power generation efficiency. In addition, since the cluster power generation sections G which are adjacent in the row direction DL have a common arrangement, the photovoltaic device 1 enables the cluster power generation sections G to be readily arranged like a matrix.

In addition, in the photovoltaic device 1 shown in FIG. 9A, the unitary power generation sections D in the cluster power generation sections G which are adjacent in the row direction DL have a common arrangement. Specifically, the unitary power generation sections D in the cluster power generation sections G11, G12, and G13 have a common planar arrangement. So do those in the cluster power generation sections G21, G22, and G23, those in the unitary power generation sections D31, D32, and D33, and those in the cluster power generation sections G41, G42, and G43.

As described above, in the photovoltaic device 1 shown in FIG. 9A, the unitary power generation sections D in the cluster power generation sections G which are adjacent in the column direction DR are rotated by 180°. Specifically, the cluster power generation section G21 (the planar arrangement of the unitary power generation sections D) is rotated by 180° from the cluster power generation section G11, the cluster power generation section G31 is rotated by 180° from the cluster power generation section G21, and the cluster power generation section G41 is rotated by 180° from the cluster power generation section G31. The cluster power generation sections G12, G22, G32, and G42 are similarly rotated from each other. So are the cluster power generation sections G13, G23, G33, and G43.

Figure 9B:
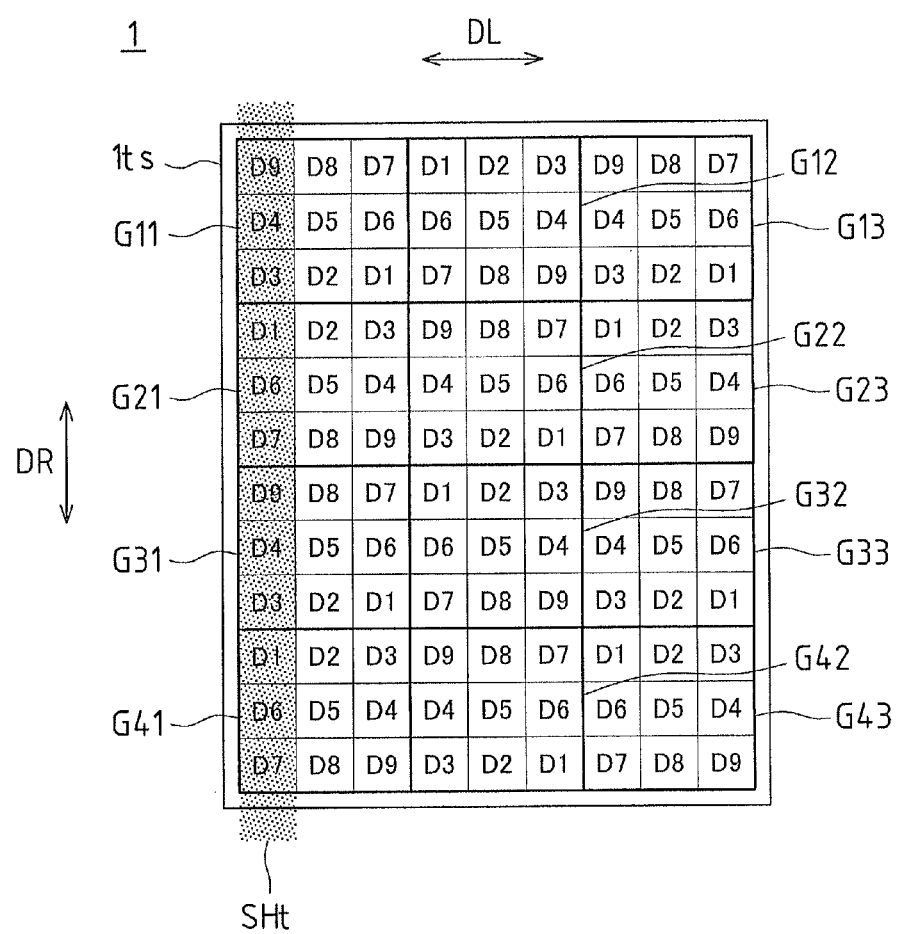
FIG. 9B is a plan view schematically illustrating the arrangement of unitary power generation sections in a photovoltaic device according to embodiment 9 of the present invention (the arrangement of the unitary power generation sections differs from one cluster power generation section to another both in the rows and columns).

FIG. 9B is a plan view schematically illustrating the arrangement of unitary power generation sections in the photovoltaic device in accordance with embodiment 9 of the present invention (the arrangement of the unitary power generation sections D differs from one cluster power generation section to another both in the rows and columns).

In contrast to the photovoltaic device 1 shown in FIG. 9A, in the photovoltaic device 1 shown in FIG. 9B, the planar arrangement of the unitary power generation sections D differs both between the cluster power generation sections G which are adjacent in the row direction DL and between those which are adjacent in the column direction DR. Specifically, the planar arrangement of the unitary power generation sections D in the cluster power generation section G12, which is adjacent to the cluster power generation section G11 in the row direction DL, and the planar arrangement of the unitary power generation sections D in the cluster power generation section G21, which is adjacent to the cluster power generation section G11 in the column direction DR, are rotated by 180° (a multiple of 90°) from the planar arrangement of those in the cluster power generation section G11. In addition, the cluster power generation section G22 has a planar arrangement rotated by 180° from that of the cluster power generation section G12 or that of the cluster power generation section G21. In other words, the cluster power generation sections G are arranged so that the unitary power generation sections D in the cluster power generation sections G can form a checkerboard pattern.

Owing to the alternate planar arrangements of the unitary power generation sections D between the cluster power generation sections G which are adjacent in the row direction DL and between those which are adjacent in the column direction DR, the photovoltaic device 1 shown in FIG. 9B achieves even better effects than the photovoltaic device 1 shown in FIG. 9A.

As illustrated in FIG. 9A, in the photovoltaic device 1 in accordance with the present embodiment, the planar arrangement of the unitary power generation sections D preferably differs at least either between the cluster power generation sections G which are adjacent in the row direction DL or between those which are adjacent in the column direction DR. In the photovoltaic device 1, since the unitary power generation sections D in those cluster power generation sections G which are adjacent to each other at least either in the row direction DL or in the column direction DR have different planar arrangements between the adjoining cluster power generation sections G, the regularity of the arrangement of the unitary power generation sections D is restrained as much as possible. The configuration thereby realizes a distributed arrangement of the unitary power generation sections D. Thus, the configuration further restrains the adverse effect of variation in the amount of light irradiation and prevents poor power generation efficiency.

In addition, as illustrated in FIG. 9B, in the photovoltaic device 1 in accordance with the present embodiment, the unitary power generation sections D in the cluster power generation sections G may have different planar arrangements both in the row direction DL and in the column direction DR.

In addition, the planar arrangement of the unitary power generation sections D in the cluster power generation sections G is preferably rotated by a multiple of 90° between adjoining cluster power generation sections G. Thus, the photovoltaic device 1 enables the planar arrangement of the unitary power generation sections D to be readily different from one cluster power generation section G to another. If the cluster power generation section G is a square, the unitary power generation sections D may be rotated by 90°, 180°, or 270°. If the cluster power generation section G is a rectangle, the unitary power generation sections D may be rotated by 180°.

The cluster power generation sections G are preferably arranged so that they are either wider in the row direction DL than they are long in the column direction DR or longer in the column direction DR than they are wide in the row direction DL so that the unitary power generation sections D in the cluster power generation sections G can have different planar arrangements in the row direction DL or in the column direction DR, in whichever direction the photovoltaic device 1 has a greater dimension. The configuration of the photovoltaic device 1 enables the alternate planar arrangements of the unitary power generation sections D, which is effective to a light irradiation irregularity extending in the direction in which the photovoltaic device 1 has a greater dimension. The configuration also effectively restrains poor power generation efficiency.

The cluster power generation sections G are wider in the row direction DL than they are long in the column direction DR or vice versa when there are provided more cluster power generation sections G in either direction or when each cluster power generation section G is rectangular due to the arrangement (or shape) of the unitary power generation sections D. The present embodiment is applicable to either case.

The technical features of the photovoltaic device 1 in accordance with the present embodiment may be applied to photovoltaic devices 1 in accordance with other embodiments where appropriate.

Embodiment 10

A photovoltaic device 1 in accordance with the present embodiment will be described in reference to FIGS. 10A to 10C. The photovoltaic device 1 in accordance with the present embodiment has a basic configuration similar to that of the photovoltaic devices 1 in accordance with embodiment 2 (see FIGS. 2A and 2B), embodiment 4 (see FIGS. 4A and 4B), embodiment 5 (see FIG. 5), and embodiment 9 (see FIGS. 9A and 9B). Hence, the same reference numerals will be used where appropriate, and the description will focus on major technical differences. The unitary power generation sections D1 to D9 are connected as described in embodiments 2 and 4 (nine unitary power generation sections D1 to D9 are connected to form a series circuit).

Figure 10A:
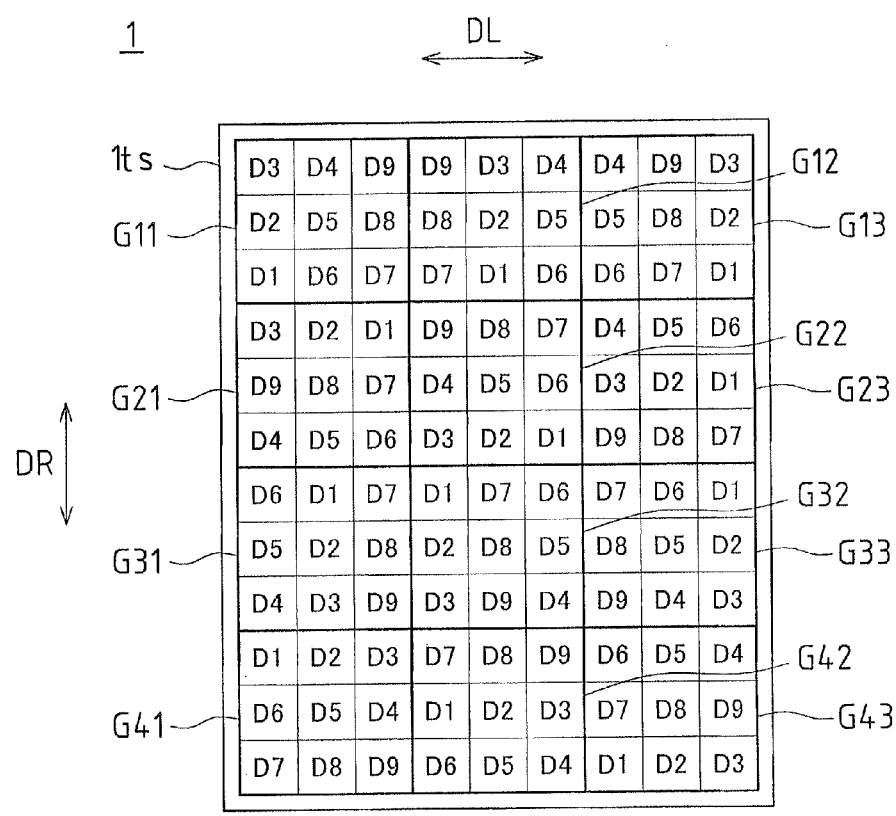
FIG. 10A is a plan view schematically illustrating the arrangement of unitary power generation sections in a photovoltaic device according to embodiment 10 of the present invention.

FIG. 10A is a plan view schematically illustrating the arrangement of unitary power generation sections in the photovoltaic device 1 in accordance with embodiment 10 of the present invention.

Figure 10B:
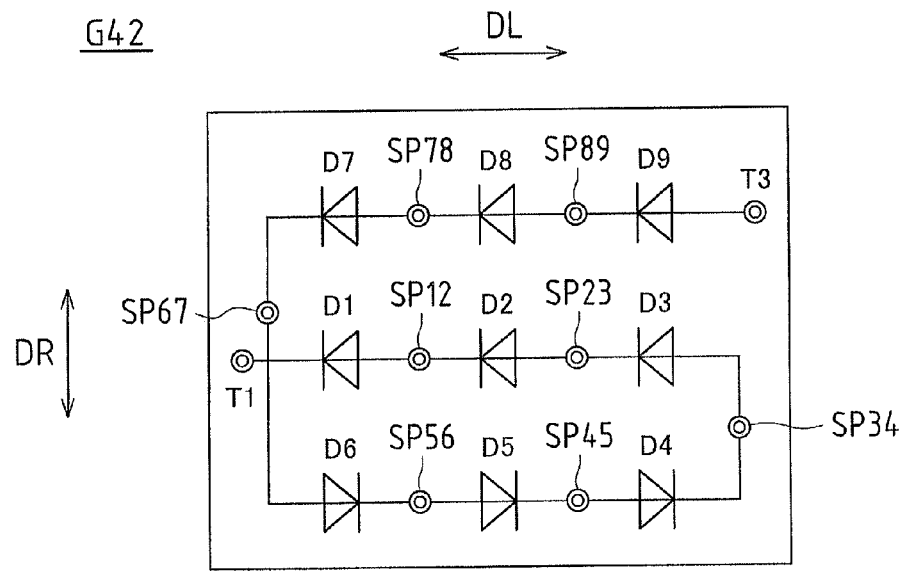
FIG. 10B is a plan view schematically illustrating an exemplary arrangement of the unitary power generation sections in the photovoltaic device shown in FIG. 10A.

FIG. 10B is a plan view schematically illustrating an exemplary arrangement of the unitary power generation sections in the photovoltaic device 1 shown in FIG. 10A.

Figure 10C:
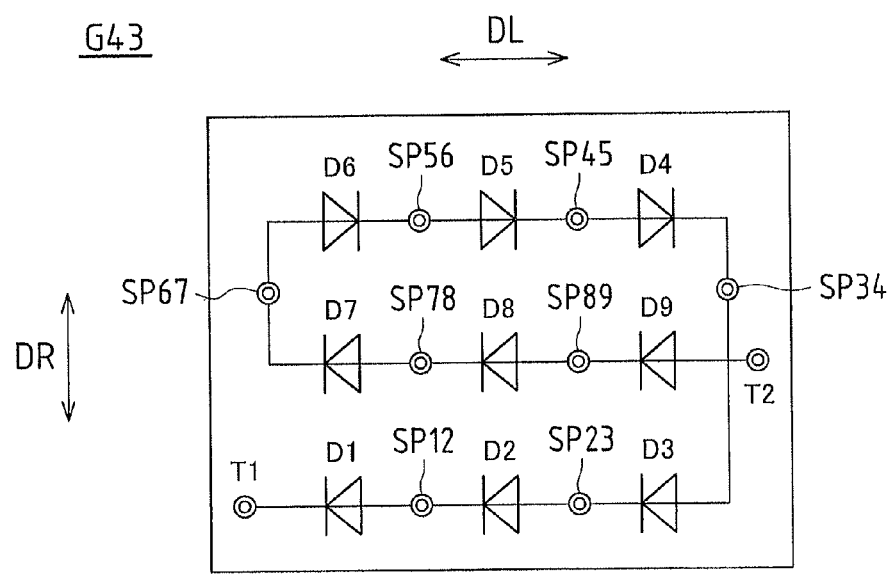
FIG. 10C is a plan view schematically illustrating an exemplary arrangement of the unitary power generation sections in the photovoltaic device shown in FIG. 10A.

FIG. 10C is a plan view schematically illustrating an exemplary arrangement of the unitary power generation sections in the photovoltaic device 1 shown in FIG. 10A.

In the photovoltaic device 1 in accordance with the present embodiment, the unitary power generation sections D in the cluster power generation sections G are further modified in its arrangement in the row direction DL and in the column direction DR.

For example, in the cluster power generation section G11, the unitary power generation sections D1 to D3 are arranged in the column direction DR in the first column (leftmost column in the figure) of the cluster power generation section G11, the unitary power generation sections D4 to D6 are arranged in the column direction DR in the second column (middle column in the figure) of the cluster power generation section G11, and the unitary power generation sections D7 to D9 are arranged in the column direction DR in the third column (rightmost column in the figure) of the cluster power generation section G11. In the cluster power generation section G12, the unitary power generation sections D1 to D3 are arranged in the column direction DR in the second column of the cluster power generation section G12, the unitary power generation sections D4 to D6 are arranged in the column direction DR in the third column of the cluster power generation section G12, and the unitary power generation sections D7 to D9 are arranged in the column direction DR in the first column of the cluster power generation section G12.

In the cluster power generation section G13, the unitary power generation sections D1 to D3 are arranged in the column direction DR in the third column of the cluster power generation section G13, the unitary power generation sections D4 to D6 are arranged in the column direction DR in the first column of the cluster power generation section G13, and the unitary power generation sections D7 to D9 are arranged in the column direction DR in the second column of the cluster power generation section G13.

In other words, the planar arrangements of the unitary power generation sections D in adjoining cluster power generation sections G differ from one column to another.

As an example, in the cluster power generation section G21, the unitary power generation sections D1 to D3 are arranged in the row direction DL in the first row (top row in the figure) of the cluster power generation section G21, the unitary power generation sections D4 to D6 are arranged in the row direction DL in the third row (bottom row in the figure) of the cluster power generation section G21, and the unitary power generation sections D7 to D9 are arranged in the row direction DL in the second row (middle row in the figure) of the cluster power generation section G21.

In the cluster power generation section G22, the unitary power generation sections D1 to D3 are arranged in the row direction DL in the third row of the cluster power generation section G22, the unitary power generation sections D4 to D6 are arranged in the row direction DL in the second row of the cluster power generation section G22, and the unitary power generation sections D7 to D9 are arranged in the row direction DL in the first row of the cluster power generation section G22.

In the cluster power generation section G23, the unitary power generation sections D1 to D3 are arranged in the row direction DL in the second row of the cluster power generation section G23, the unitary power generation sections D4 to D6 are arranged in the row direction DL in the first row of the cluster power generation section G23, and the unitary power generation sections D7 to D9 are arranged in the row direction DL in the third row of the cluster power generation section G23.

In other words, the planar arrangements of the unitary power generation sections D in adjoining cluster power generation sections G differ from one row to another.

As another example, in the cluster power generation section G42 (FIG. 10B), the unitary power generation sections D1 to D3 are arranged in the row direction DL in the second row of the cluster power generation section G42, the unitary power generation sections D4 to D6 are arranged in the row direction DL in the third row of the cluster power generation section G42, and the unitary power generation sections D7 to D9 are arranged in the row direction DL in the first row of the cluster power generation section G42.

Furthermore, in the cluster power generation section G43 (FIG. 10C), the unitary power generation sections D1 to D3 are arranged in the row direction DL in the third row of the cluster power generation section G43, the unitary power generation sections D4 to D6 are arranged in the row direction DL in the first row of the cluster power generation section G43, and the unitary power generation sections D7 to D9 are arranged in the row direction DL in the second row of the cluster power generation section G43.

As another example, the unitary power generation sections D (e.g., D1 to D3) are arranged in the column direction DR in the cluster power generation section G11 (in the first column of the cluster power generation section G11). In contrast, in the cluster power generation section G21, the same unitary power generation sections D (e.g., D1 to D3) are arranged in the row direction DL (in the first row of the cluster power generation section G21).

The photovoltaic device 1 in accordance with the present embodiment further restrains the directional influence of the widthwise shadow and the lengthwise shadow described in embodiments 7 to 9 and further improves power generation efficiency.

As described above, in the photovoltaic device 1 in accordance with the present embodiment, the planar arrangement of the unitary power generation sections D (D1 to D9) in a cluster power generation section G (e.g., G11) preferably differs from that of the unitary power generation sections D (D1 to D9) in an adjacent cluster power generation section G (e.g., G12 or G21) at least either from one row to another (the unitary power generation sections D1 to D3, D4 to D6, and D7 to D9 in the cluster power generation section G21 with respect to those in the cluster power generation section G11) or from one column to another (the unitary power generation sections D1 to D3, D4 to D6, and D7 to D9 in the cluster power generation section G12 with respect to those in the cluster power generation section G11).

According to that configuration, the planar arrangement of the unitary power generation sections D differs between adjoining cluster power generation sections G at least either from one row of the unitary power generation sections D in the cluster power generation sections G to another or from one column thereof to another. Thus, in the photovoltaic device 1, the regularity of the arrangement of the unitary power generation sections D is restrained as much as possible. The configuration thereby realizes a distributed arrangement. Hence, the configuration further restrains the adverse effect of variation in the amount of light irradiation and prevents poor power generation efficiency.

The technical features of the photovoltaic device 1 in accordance with the present embodiment may be applied to photovoltaic devices 1 in accordance with other embodiments where appropriate.

Embodiment 11

A photovoltaic system 10 in accordance with the present embodiment will be described in reference to FIGS. 11A and 11B. The photovoltaic system 10 in accordance with the present embodiment is an application of the photovoltaic device 1 in accordance with embodiments 1 to 10. Hence, the same reference numerals will be used where appropriate, and the description will focus on major technical differences.

Figure 11A:
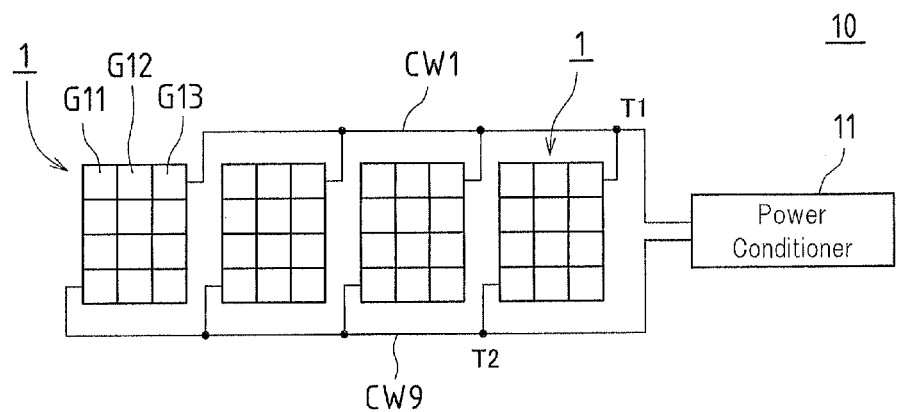
FIG. 11A is a plan view schematically illustrating a (parallel) connection of photovoltaic devices in a photovoltaic system according to embodiment 11 of the present invention.

FIG. 11A is a plan view schematically illustrating a (parallel) connection of photovoltaic devices 1 in the photovoltaic system 10 in accordance with embodiment 11 of the present invention.

Figure 11B:
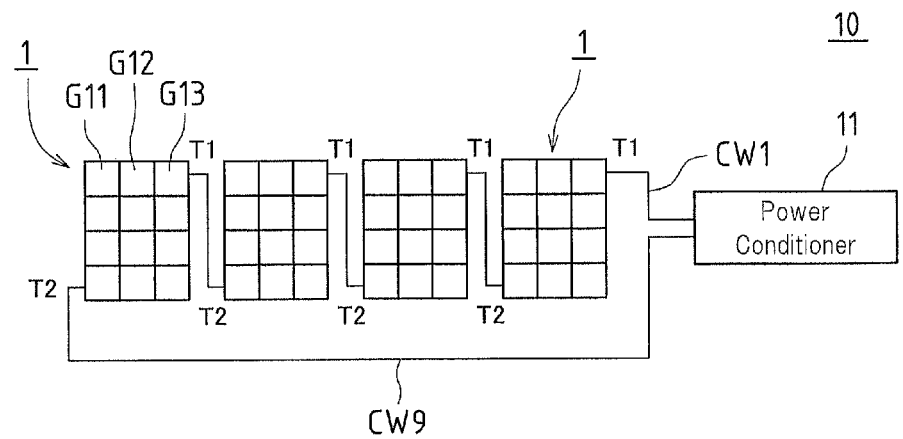
FIG. 11B is a plan view schematically illustrating an exemplary (series) connection of photovoltaic devices in a photovoltaic system according to embodiment 11 of the present invention.

FIG. 11B is a plan view schematically illustrating an exemplary (series) connection of photovoltaic devices 1 in the photovoltaic system 10 in accordance with embodiment 11 of the present invention.

The photovoltaic system 10 in accordance with the present embodiment includes photovoltaic devices 1 and a power conditioner 11 for converting electric power supplied by the photovoltaic devices 1 to a specified mode of electric power.

Therefore, the photovoltaic system 10 prevents the adverse effect of variation in the amount of light irradiation from one photovoltaic device 1 to another. Even if there occurs variation in the amount of light irradiation, the photovoltaic system 10 restrains an imbalance between the irradiated area and the area taken up by the operating unitary power generation sections D (the cluster power generation sections G, the photovoltaic devices 1). The photovoltaic system 10 thus realizes efficient power generation.

The power conditioner 11 performs a suitable electric power conversion process on the electric power supplied by the photovoltaic devices 1 for conversion to a required mode of electric power which is specified in advance as a specification. The power conditioner 11 performs, for example, a voltage-boosting process and series/parallel conversion on the electric power supplied by the photovoltaic devices 1 for conversion to a required mode of electric power which is specified in advance as a specification. Although multiple connected photovoltaic devices 1 are shown, the present embodiment is applicable to at least one or more photovoltaic devices 1. Furthermore, although photovoltaic devices 1 connected in series and in parallel in advance are shown, the parallel and series connections may be provided inside the power conditioner 11.

The photovoltaic system 10 shown in FIG. 11A includes multiple (e.g., four) parallel-connected photovoltaic devices 1 to obtain, at a constant voltage, an electric current which corresponds to the number of the connected photovoltaic devices 1. The obtained electric power is supplied to a load (not shown) through a suitable means.

If the unitary power generation sections D are, for example, composed of silicon solar cells each of which generates a voltage of 0.6 V, a photovoltaic device 1 (e.g., embodiment 2) including twelve parallel-connected cluster power generation sections G in each of which nine unitary power generation sections D are connected in series yields an output voltage of 5.4 V.

Therefore, in the photovoltaic system 10, the input voltage of the power conditioner 11 is 5.4 V. If the power conditioner 11 boosts the voltage by, for example, 5 times, the obtained output is 27 V.

The photovoltaic system 10 shown in FIG. 11B includes multiple (e.g., four) series-connected photovoltaic devices 1 to obtain, at a constant current, an electric voltage which corresponds to the number of the connected photovoltaic devices 1. The obtained electric power is supplied to a load (not shown) through a suitable means.

If the unitary power generation sections D are, for example, composed of silicon solar cells each of which generates a voltage of 0.6 V, a photovoltaic device 1 (e.g., embodiment 2) including twelve parallel-connected cluster power generation sections G in each of which nine unitary power generation sections D are connected in series yields an output voltage of 5.4 V.

Therefore, in the photovoltaic system 10, the input voltage of the power conditioner 11 is 5.4×4=21.6 V. If the power conditioner 11 boosts the voltage by, for example, 5 times, the obtained output is 108 V.

FIGS. 11A and 11B show the photovoltaic devices 1 being connected in parallel and in series respectively. Series and parallel connection may be used together.

Embodiment 12

A photovoltaic system 10 in accordance with the present embodiment will be described in reference to FIGS. 12A and 12B. The photovoltaic system 10 in accordance with the present embodiment is a variation of the photovoltaic system 10 in accordance with embodiment 11. In other words, the photovoltaic system 10 in accordance with the present embodiment is an application of the photovoltaic device 1 in accordance with embodiments 1 to 10 and has a common basic configuration with the photovoltaic system 10 in accordance with embodiment 11. Hence, the same reference numerals will be used where appropriate, and the description will focus on major technical differences.

Figure 12A:
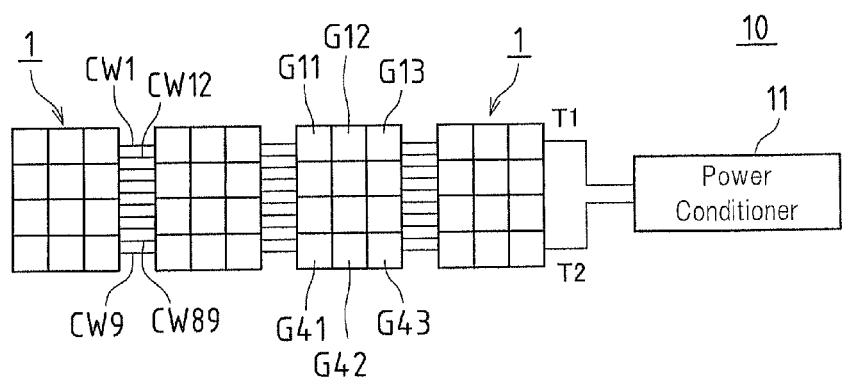
FIG. 12A is a plan view schematically illustrating an exemplary connection of photovoltaic devices in a photovoltaic system according to embodiment 12 of the present invention.

FIG. 12A is a plan view schematically illustrating an exemplary connection of photovoltaic devices 1 in the photovoltaic system 10 in accordance with embodiment 12 of the present invention.

Figure 12B:
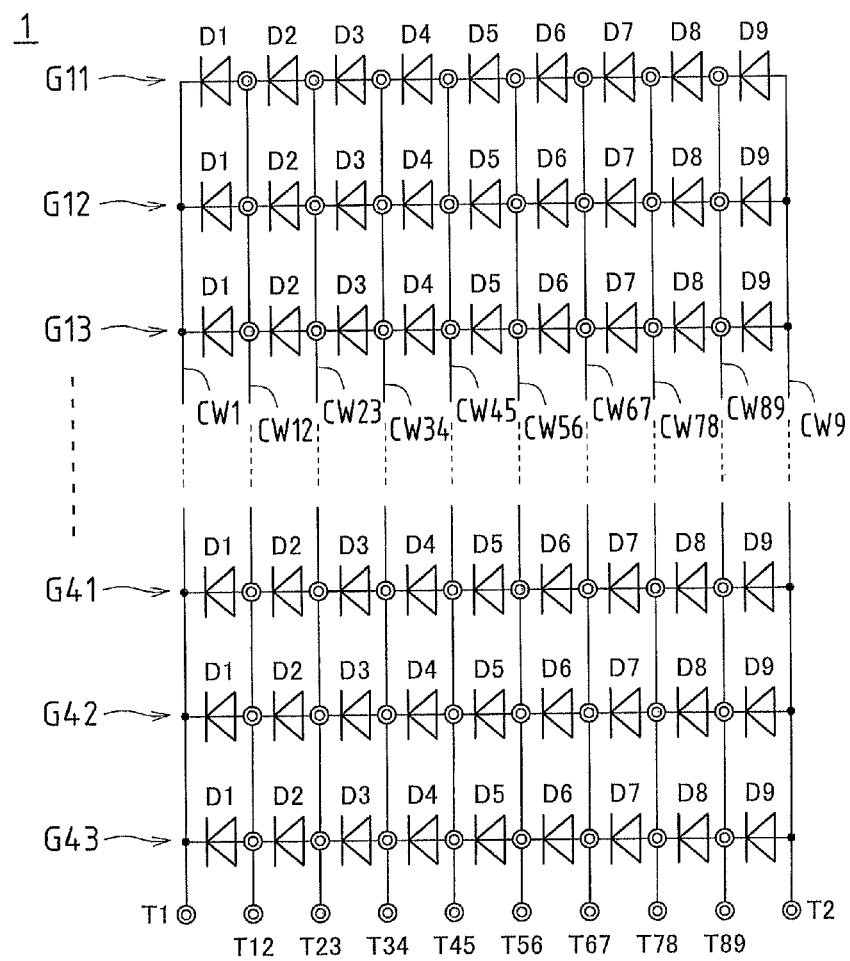
FIG. 12B is an equivalent circuit diagram illustrating, as an equivalent circuit, the connections of unitary power generation sections in the photovoltaic devices shown in FIG. 12A.

FIG. 12B is an equivalent circuit diagram illustrating, as an equivalent circuit, the connections of unitary power generation sections in the photovoltaic devices 1 shown in FIG. 12A.

The photovoltaic system 10 in accordance with the present embodiment includes photovoltaic devices 1 and a power conditioner 11 for converting electric power supplied by the photovoltaic devices 1 to a specified mode of electric power.

Therefore, the photovoltaic system 10 prevents the adverse effect of variation in the amount of light irradiation from one photovoltaic device 1 to another. Even if there occurs variation in the amount of light irradiation, the photovoltaic system 10 restrains an imbalance between the irradiated area and the area taken up by the operating unitary power generation sections D (the cluster power generation sections G, the photovoltaic devices 1). The photovoltaic system 10 thus realizes efficient power generation.

At least two (e.g., four) photovoltaic devices 1 are connected in parallel. Each photovoltaic device 1 has specific connection points SP (SP12 to SP89) which are designated commonly in all the photovoltaic devices 1. The specific connection points SP are connected to link the photovoltaic devices 1.

Therefore, the photovoltaic system 10 restrains the adverse effect of variation in the amount of light irradiation on the unitary power generation sections D provided between the specific connection points SP.

FIGS. 12A and 12B show an example of all the connection points CP being connected together to provide the specific connection points SP. Alternatively, as described in another embodiment, the connection points CP may be suitably divided and specified so that only a limited set of specific connection points SP is connected.

Embodiment 13

A vehicle 20 in accordance with the present embodiment will be described in reference to FIGS. 13A and 13B. A vehicle 20 in accordance with the present embodiment is an application of the photovoltaic device 1 in accordance with embodiments 1 to 10. Hence, the same reference numerals will be used where appropriate, and the description will focus on major technical differences.

Figure 13A:
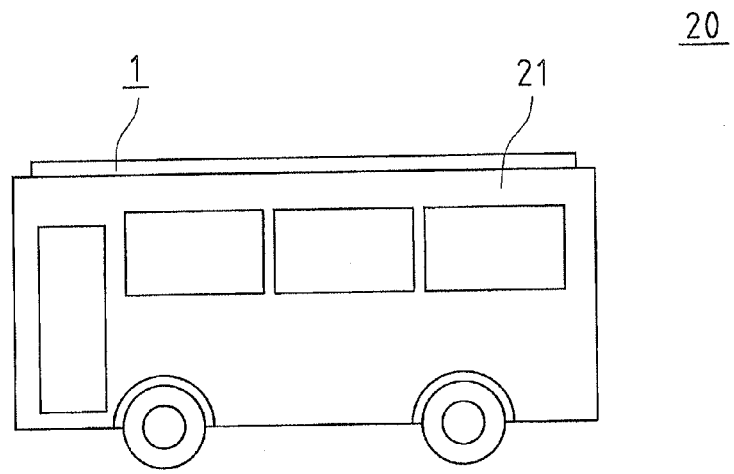
FIG. 13A is side view schematically illustrating an exemplary installation condition of a photovoltaic device on a vehicle (e.g., bus) according to embodiment 13 of the present invention.

FIG. 13A is a plan view schematically illustrating an exemplary installation of photovoltaic devices 1 on a vehicle 20 (e.g., bus) in accordance with embodiment 13 of the present invention.

Figure 13B:
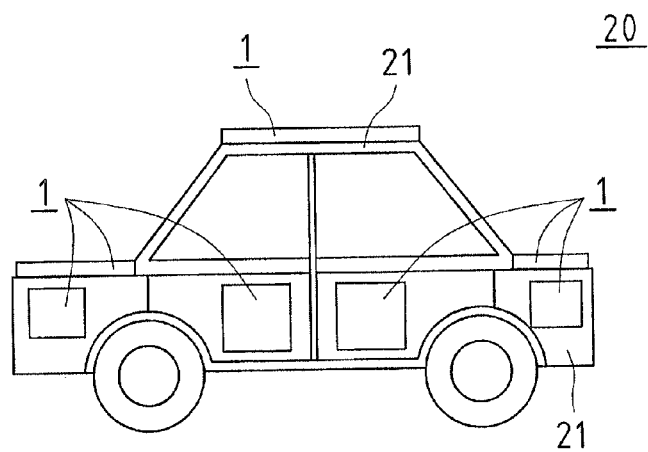
FIG. 13B is side view schematically illustrating an exemplary installation condition of photovoltaic devices on a vehicle (e.g., passenger car) according to embodiment 13 of the present invention.

FIG. 13B is a plan view schematically illustrating an exemplary installation of photovoltaic devices 1 on a vehicle 20 (e.g., passenger car) in accordance with embodiment 13 of the present invention.

The vehicle 20 in accordance with the present embodiment includes a body 21 and photovoltaic devices 1 installed on a surface of the body 21, where the photovoltaic devices 1 are the photovoltaic devices 1 in accordance with embodiments 1 to 10. The vehicle 20 supplies the electric power generated from light (sunlight) to a vehicle power supply system (not shown). The vehicle power supply system includes an electric battery which stores the electric power supplied by the photovoltaic device 1.

The vehicle 20 in accordance with the present embodiment prevents the adverse effect of variation in the amount of light irradiation (sunlight) on the photovoltaic devices 1. Even if there occurs variation in the amount of light irradiation on the photovoltaic devices 1, the vehicle 20 restrains an imbalance between the irradiated area and the area taken up by the operating unitary power generation sections D (the cluster power generation sections G, the photovoltaic devices 1). The vehicle 20 thus realizes efficient power generation. The vehicle 20 supplies the generated electric power to the vehicle power supply system while restraining the adverse effect of variation in the amount of light irradiation.

Especially, as in the present embodiment, if the photovoltaic devices 1 are installed on the vehicle 20, the photovoltaic devices 1 are not always in abundant sunlight and will likely be shadowed by buildings and other vehicles. The configuration of the present embodiment enables efficiently acquisition of light energy by preventing large reduction in power generation efficiency even if the light-receiving faces of the photovoltaic devices 1 are partly shaded.

Embodiment 14

A photovoltaic device 1 in accordance with the present embodiment will be described in reference to FIGS. 14A to 14D. The photovoltaic device 1 in accordance with the present embodiment has a basic configuration similar to that of the photovoltaic device 1 in accordance with embodiment 2 (see FIGS. 2A and 2B). Hence, the same reference numerals will be used where appropriate, and the description will focus on major technical differences.

Figure 14A:
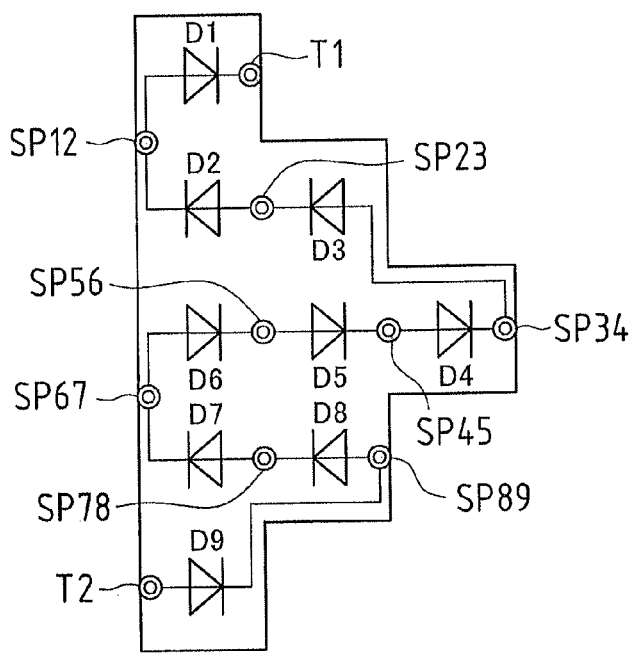
FIG. 14A is a plan view schematically illustrating the arrangement and connections of unitary power generation sections in a cluster power generation section applied to a photovoltaic device according to embodiment 14 of the present invention.

FIG. 14A is a plan view schematically illustrating the arrangement and connections of unitary power generation sections D in a cluster power generation section Ga applied to a photovoltaic device 1 in accordance with embodiment 14 of the present invention. The cluster power generation sections G in embodiment 2, arranged as in a matrix, were numbered (e.g., G11) to indicate their positions in the matrix. In the present embodiment, the cluster power generation sections G are suffixed with an alphabetic letter (e.g., Ga) to indicate that they are not arranged as in a matrix.

Figure 14B:
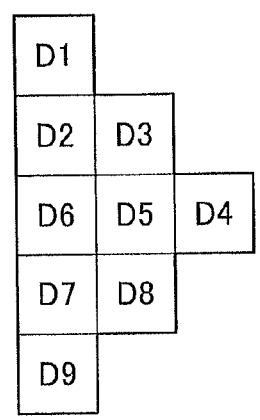
FIG. 14B is a plan view illustrating, in a simplified manner, the arrangement of the unitary power generation sections in the cluster power generation sections shown in FIG. 14A.

FIG. 14B is a plan view illustrating, in a simplified manner, the arrangement of unitary power generation sections D in a cluster power generation section Ga shown in FIG. 14A.

Figure 14C:
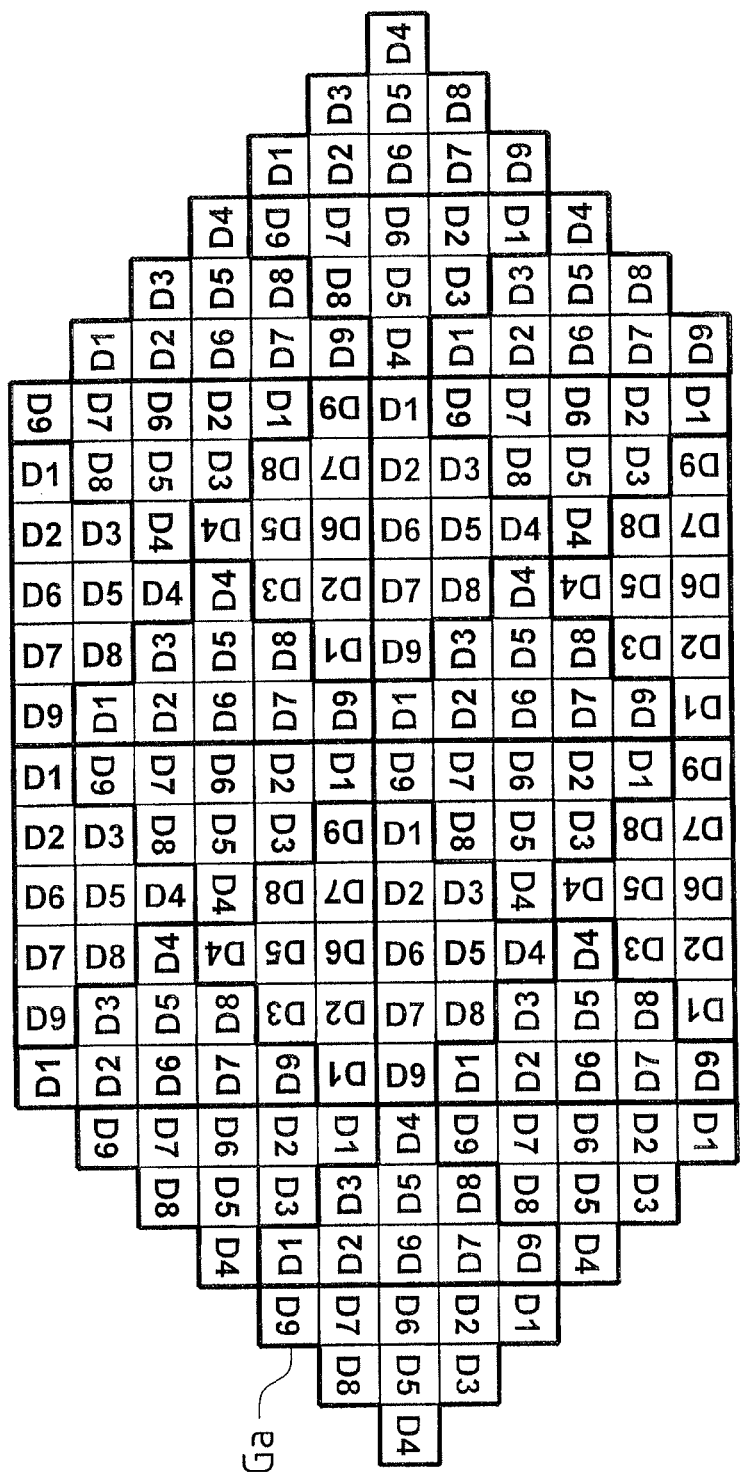
FIG. 14C is a plan view schematically illustrating the arrangement of the cluster power generation sections and the unitary power generation sections in the photovoltaic device according to embodiment 14 of the present invention.

FIG. 14C is a plan view schematically illustrating the arrangement of cluster power generation sections Ga and unitary power generation sections D in the photovoltaic device 1 in accordance with embodiment 14 of the present invention.

Figure 14D:
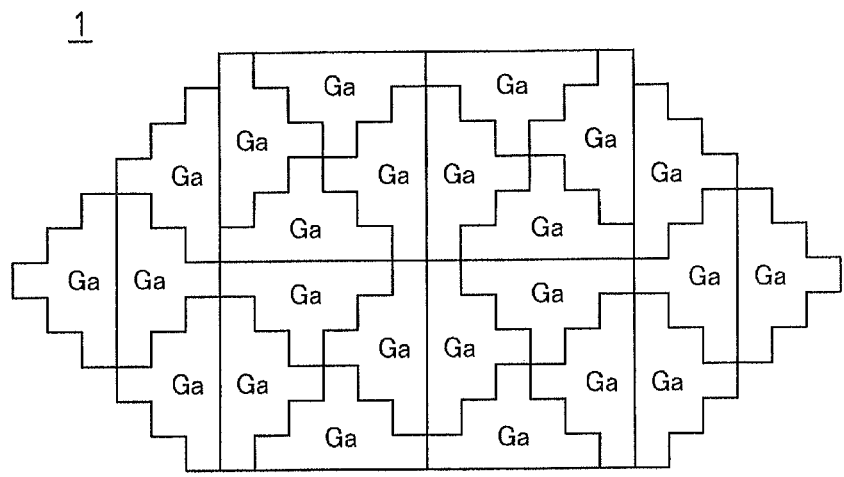
FIG. 14D is a plan view illustrating, in a simplified manner, the arrangement of the cluster power generation sections in the photovoltaic device shown in FIG. 14C.

FIG. 14D is a plan view illustrating, in a simplified manner, the arrangement of cluster power generation sections Ga in the photovoltaic device 1 shown in FIG. 14C.

The photovoltaic device 1 described in embodiment 2 includes a matrix-like set of cluster power generation sections G in each of which unitary power generation sections D1 to D9 are arranged as in a matrix. In contrast, in the photovoltaic device 1 in accordance with the present embodiment, the unitary power generation sections D1 to D9 in each cluster power generation section Ga are arranged in a non-matrix shape (e.g., not a rectangle, but a polygon, e.g., a pentagon).

In the cluster power generation section Ga, as can be seen in the figure, five of the unitary power generation sections D (D1 to D9) are arranged on the left side in the lengthwise direction, one of them is arranged on the right side, and the unitary power generation sections D1, . . . , and D9 are arranged in this order along a wobbling path starting at the top of the five unitary power generation sections D.

In the photovoltaic device 1 in accordance with the present embodiment, each cluster power generation section Ga includes nine unitary power generation sections D. Five, three, and one of the unitary power generation section D are lined up in the cluster power generation section Ga in a symmetric stepped manner. The cluster power generation section Ga is an irregular polygon (dodecagon) which is vastly different from a rectangle. The cluster power generation section Ga is similar to the cluster-power generation section G in embodiment 2, except for the arrangement (method of arrangement) of the unitary power generation sections D1 to D9.

In other words, the unitary power generation sections D1 and D2 are connected in series via a specific connection point SP12 (connection point CP12; the same applies to other specific connection points SP (connection points CP)), the unitary power generation sections D2 and D3 are connected in series via a specific connection point SP23, the unitary power generation sections D3 and D4 are connected in series via a specific connection point SP34, the unitary power generation sections D4 and D5 are connected in series via a specific connection point SP45, the unitary power generation sections D5 and D6 are connected in series via a specific connection point SP56, the unitary power generation sections D6 and D7 are connected in series via a specific connection point SP67, the unitary power generation sections D7 and D8 are connected in series via a specific connection point SP78, and the unitary power generation sections D8 and D9 are connected in series via a specific connection point SP89, so as to form a series circuit in which the nine unitary power generation sections D are connected in series. The planar shape of the unitary power generation section D is practically a square.

The photovoltaic device 1 (light-receiving face of the photovoltaic device 1) is a polygon, not a simple rectangle. The polygon is, specifically, composed of a central rectangular portion and additional right and left triangular projecting portions. In other words, the photovoltaic device 1 is composed of two symmetric trapezoids placed back to back. The photovoltaic device 1 in accordance with the present embodiment is composed of single-type cluster power generation sections Ga in various orientations (see FIG. 14D).

The irregular polygonal planar shape of the cluster power generation section Ga in the present embodiment (FIG. 14A) enables the unitary power generation sections D (cluster power generation section Ga) to be efficiently and tightly packed in an irregularly shaped area (FIG. 14C). Rectangular cluster power generation sections G may be provided in the central rectangular portion, and the cluster power generation sections Ga may be provided in the right and left projecting portions.

In the cluster power generation sections Ga, the light-receiving area of the unitary power generation sections D is equal for all series stages. Therefore, the light-receiving area for each series stage is equal throughout the whole photovoltaic device 1 in which a plurality of cluster power generation sections Ga are connected in parallel via the specific connection points SP. The photovoltaic device 1 is free from imbalance in area between the series stages, capable of highly efficient power generation, and readily manufacturable.

In the photovoltaic device 1 of the present embodiment, the unitary power generation sections D are connected in parallel via the specific connection points SP between the unitary power generation sections D. Therefore, even if the photovoltaic device 1 is partly shaded, the imbalance in irradiated area between the series stages is restrained, and the generation efficiency does not drop much.

Embodiment 15

A photovoltaic device 1 in accordance with the present embodiment will be described in reference to FIGS. 15A to 15F. The photovoltaic device 1 in accordance with the present embodiment has a basic configuration similar to that of the photovoltaic devices 1 in accordance with embodiment 2 (see FIGS. 2A and 2B) and embodiment 14 (see FIGS. 14A to 14D). Hence, the same reference numerals will be used where appropriate, and the description will focus on major technical differences.

Figure 15A:
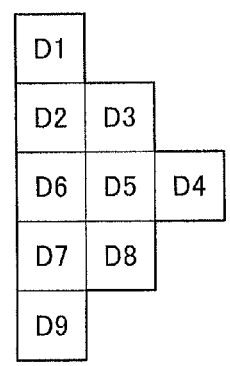
FIG. 15A is a plan view illustrating, in a simplified manner, the arrangement of unitary power generation sections in a cluster power generation section applied to a photovoltaic device according to embodiment 15 of the present invention.

FIG. 15A is a plan view illustrating, in a simplified manner, the arrangement of unitary power generation sections D in a cluster power generation section Gb applied to the photovoltaic device 1 in accordance with embodiment 15 of the present invention. In the present embodiment, the cluster power generation sections G are suffixed with an alphabetic letter (e.g., Gb). The unitary power generation sections D in the cluster power generation sections Gb are arranged in the same manner as those in the cluster power generation sections Ga of embodiment 14.

FIG. 15B is a plan view illustrating, in a simplified manner, the arrangement of unitary power generation sections D in a cluster power generation section Gc applied to the photovoltaic device 1 in accordance with embodiment 15 of the present invention.

FIG. 15C is a plan view illustrating, in a simplified manner, the arrangement of unitary power generation sections D in a cluster power generation section Gd applied to the photovoltaic device 1 in accordance with embodiment 15 of the present invention.

FIG. 15D is a plan view illustrating, in a simplified manner, the arrangement of unitary power generation sections D in a cluster power generation section Ge applied to the photovoltaic device 1 in accordance with embodiment 15 of the present invention.

Figure 15E:
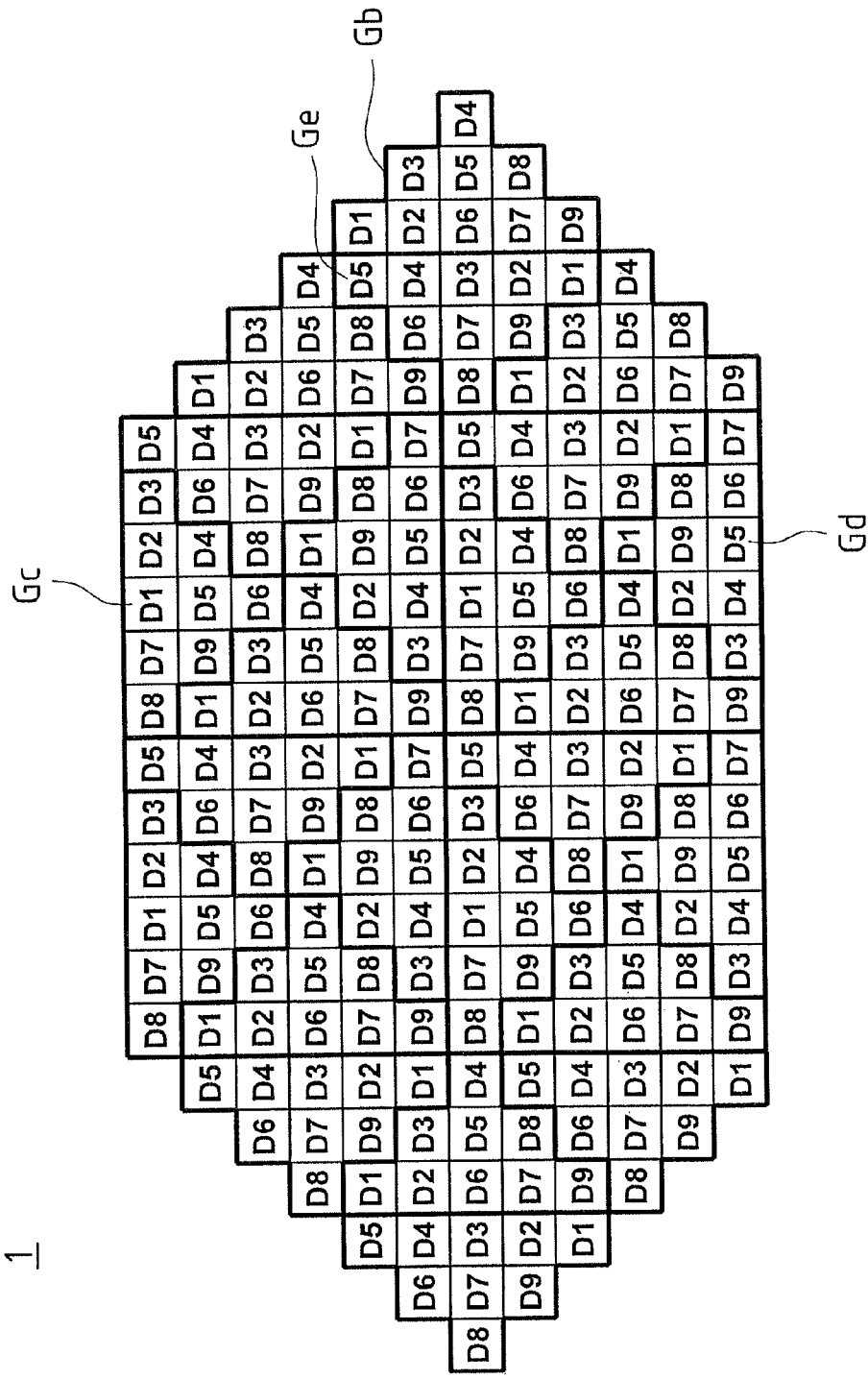
FIG. 15E is a plan view schematically illustrating the arrangement of cluster power generation sections and unitary power generation sections in a photovoltaic device according to embodiment 15 of the present invention.

FIG. 15E is a plan view schematically illustrating the arrangement of the cluster power generation sections Gb to Ge and the unitary power generation sections D in the photovoltaic device 1 in accordance with embodiment 15 of the present invention.

Figure 15F:
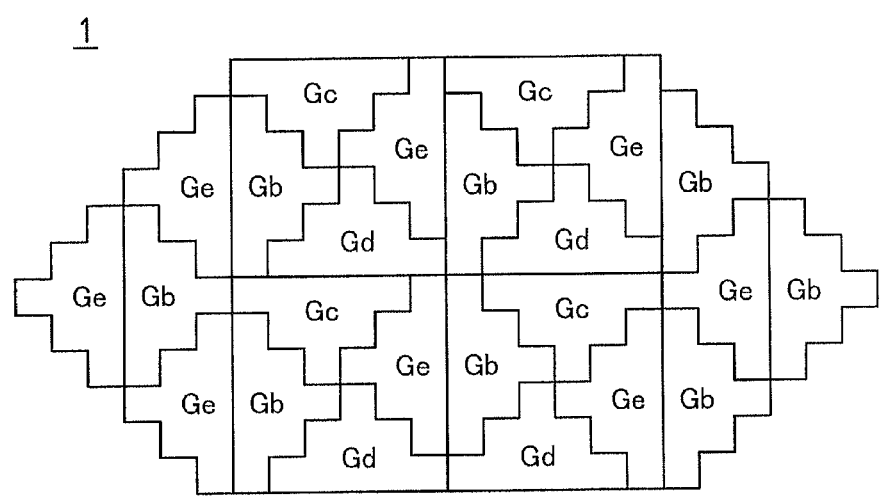
FIG. 15F is a plan view illustrating, in a simplified manner, the arrangement of cluster power generation sections in the photovoltaic device shown in FIG. 15E.

FIG. 15F is a plan view illustrating, in a simplified manner, the arrangement of the cluster power generation sections Gb to Ge in the photovoltaic device 1 shown in FIG. 15E.

In the photovoltaic device 1 in accordance with embodiment 14, the cluster power generation sections G were efficiently and tightly packed by arranging only the cluster power generation sections Ga. In the present embodiment, the four types of cluster power generation sections G (i.e., Gb to Ge) are used to restrain an imbalance between series circuits.

The unitary power generation sections D in the cluster power generation section Gb are arranged in the same manner as those in the cluster power generation section Ga as can be seen in the figure. In the cluster power generation section Gc, as can be seen in the figure, five of the unitary power generation sections D (D1 to D9) are arranged at the top in the widthwise direction, one of them is arranged at the bottom, and the unitary power generation sections D1, . . . , and D9 are arranged in this order clockwise starting at the middle one of the five unitary power generation sections D. In the cluster power generation section Gd, as can be seen in the figure, five of the unitary power generation sections D (D1 to D9) are arranged at the bottom in the widthwise direction, one of them is arranged at the top, and the unitary power generation sections D1, . . . , and D9 are arranged in this order counterclockwise starting at the unitary power generation section D at the top. In the cluster power generation section Ge, as can be seen in the figure, five of the unitary power generation sections D (D1 to D9) are arranged on the right side in the lengthwise direction, one of them is arranged on the left side, and the unitary power generation sections D1, . . . , and D9 are arranged in this order, first upward and then downward starting at the bottom one of the five unitary power generation sections D.

Hence, the unitary power generation sections D, when arranged, form a common overall shape throughout the cluster power generation sections Gb to Ge, but the individual unitary power generation sections D1 to D9 are arranged differently in cluster power generation sections Gb to Ge.

In the photovoltaic device 1 in accordance with the present embodiment, cluster power generation sections Gb to Ge are tightly packed in the same area as the cluster power generation sections G are tightly packed in accordance with embodiment 14. Specifically, the four types of cluster power generation sections Gb, Gc, Gd, and Ge shown in FIGS. 15A to 15D are arranged. A combination of eight cluster power generation sections Gb, four cluster power generation sections Gc, four cluster power generation sections Gd, and eight cluster power generation sections Ge is arranged.

In the photovoltaic device 1 in accordance with the present embodiment, the multiple types of cluster power generation sections G are arranged to prevent those unitary power generation sections D in a series stage are located at a specific place on the plane and more distribute the unitary power generation sections D over the light-receiving face.

For example, FIG. 14C (embodiment 14) shows regions where four unitary power generation sections D4 are located very close to each other. In contrast, in FIG. 15E (the present embodiment), those unitary power generation sections D in the same series stage are never adjacent to each other in the lengthwise or widthwise direction. The latter achieves an arrangement with more distribution.

Therefore, when the light-receiving face is partially shaded, it unlikely that the sum area of the unitary power generation sections D in the sun differs much from one series stage to another. The configuration thus further restrains an imbalance between series stages and maintains highly efficient power generation.

As described above, the photovoltaic device 1 in accordance with the present embodiment includes multiple types of cluster power generation sections G with different arrangements of unitary power generation sections D. Since the unitary power generation sections D in the same series stage (specific series stage) are not fixed at particular positions in the cluster power generation section G and hence more distributed (for example, adjoining cluster power generation sections G can be located at very different positions (position state)), the photovoltaic device 1 effectively restrains the adverse effect of variation in the amount of light irradiation, for example, partial shadow cast over the light-receiving face.

Embodiment 16

A photovoltaic device 1 in accordance with the present embodiment will be described in reference to FIG. 16. The photovoltaic device 1 in accordance with the present embodiment has a basic configuration similar to that of the photovoltaic devices 1 in accordance with embodiment 2 (see FIGS. 2A, FIG. 2B) and embodiment 14 (see FIGS. 14A to 14D). Hence, the same reference numerals will be used where appropriate, and the description will focus on major technical differences.

Figure 16:
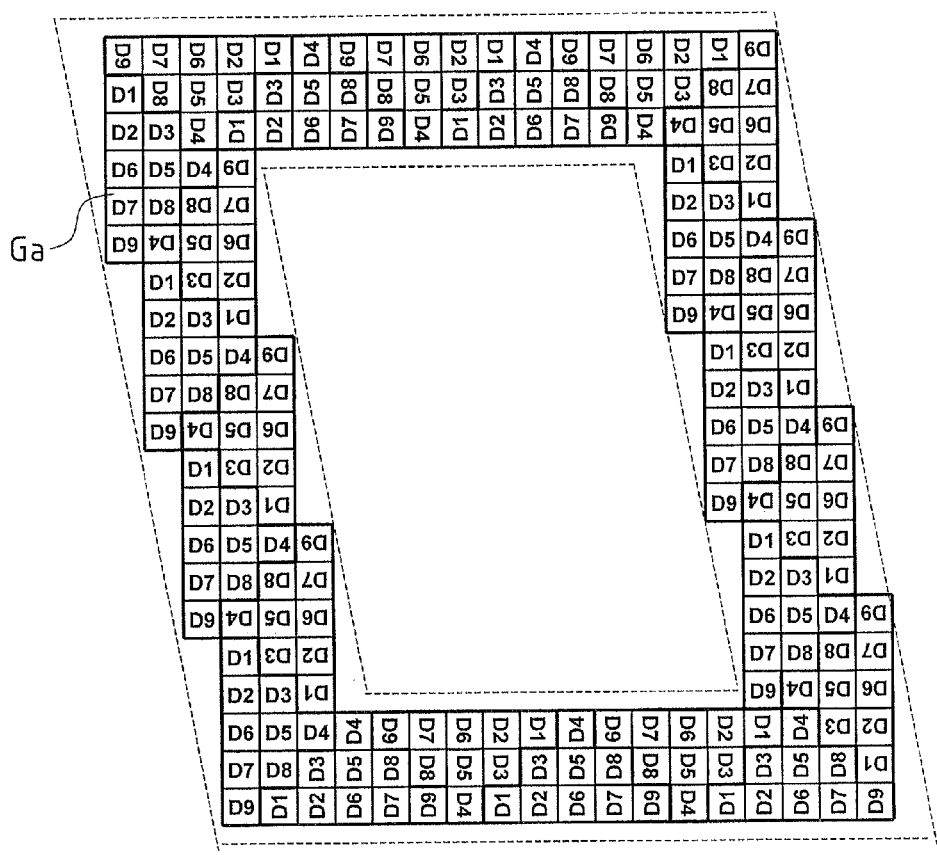
FIG. 16 is a plan view schematically illustrating the arrangement of cluster power generation sections and unitary power generation sections D in a photovoltaic device according to embodiment 16 of the present invention.

FIG. 16 is a plan view schematically illustrating the arrangement of cluster power generation sections Ga and unitary power generation sections D in the photovoltaic device 1 in accordance with embodiment 16 of the present invention. The cluster power generation sections Ga are identical to those described in embodiment 14.

In the photovoltaic device 1 in accordance with the present embodiment, 24 cluster power generation sections Ga are arranged in an area shaped like a parallelogrammatic frame. Although a single type of cluster power generation sections Ga are arranged as in a frame, for example, cluster power generation sections Gb, Gc, Gd, and Ge described in embodiment 15 may be applied to form a frame-like shape. The configuration enables a suitable combination of cluster power generation sections G according to the area in which the photovoltaic device 1 is installed, and thus achieves a tightly packed arrangement of non-rectangular cluster power generation sections G in an irregularly shaped area.

Embodiment 17

A photovoltaic device 1 in accordance with the present embodiment will be described in reference to FIGS. 17A to 17E. The photovoltaic device 1 in accordance with the present embodiment has a basic configuration similar to that of the photovoltaic devices 1 in accordance with embodiments 2 (see FIGS. 2A and 2B), 14, and 15. Hence, the same reference numerals will be used where appropriate, and the description will focus on major technical differences.

FIG. 17A is a plan view illustrating, in a simplified manner, the arrangement of unitary power generation sections D in a cluster power generation section Gf applied to the photovoltaic device 1 in accordance with embodiment 17 of the present invention. In the present embodiment, the cluster power generation sections G are suffixed with an alphabetic letter (e.g., Gf).

FIG. 17B is a plan view illustrating, in a simplified manner, the arrangement of unitary power generation sections D in a cluster power generation section Gg applied to the photovoltaic device 1 in accordance with embodiment 17 of the present invention.

FIG. 17C is a plan view illustrating, in a simplified manner, the arrangement of unitary power generation sections D in a cluster power generation section Gh applied to the photovoltaic device 1 in accordance with embodiment 17 of the present invention.

Figure 17D:
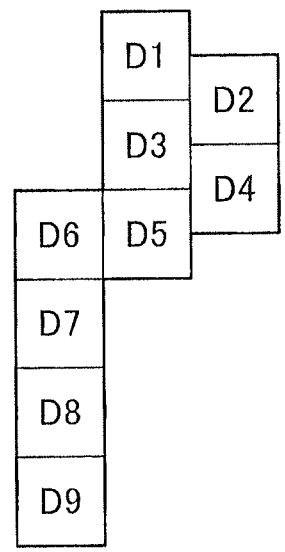
FIG. 17D is a plan view illustrating, in a simplified manner, the arrangement of unitary power generation sections in a cluster power generation section applied to a photovoltaic device according to embodiment 17 of the present invention.

FIG. 17D is a plan view illustrating, in a simplified manner, the arrangement of unitary power generation sections D in a cluster power generation section Gi applied to the photovoltaic device 1 in accordance with embodiment 17 of the present invention.

Figure 17E:
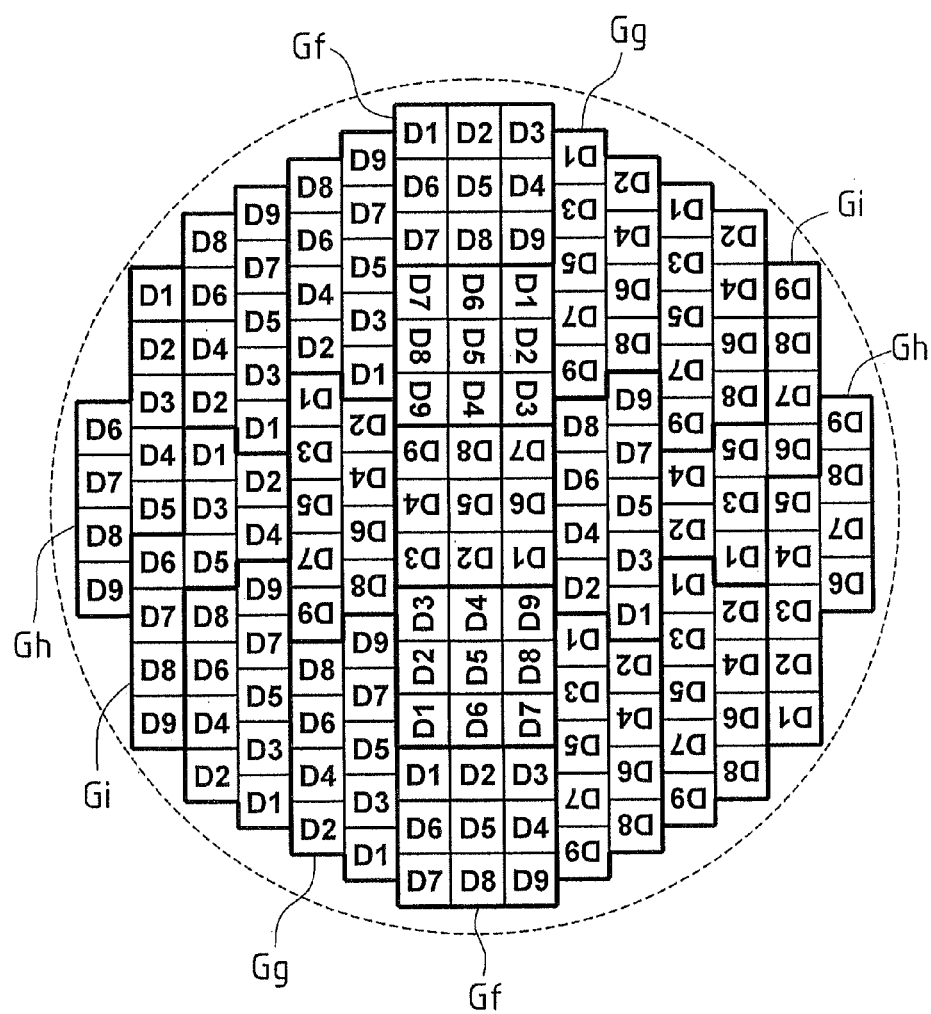
FIG. 17E is a plan view schematically illustrating the arrangement of cluster power generation sections and unitary power generation sections in a photovoltaic device according to embodiment 17 of the present invention.

FIG. 17E is a plan view schematically illustrating the arrangement of the cluster power generation sections Gf to Gi and the unitary power generation sections D in the photovoltaic device 1 in accordance with embodiment 17 of the present invention.

In the photovoltaic device 1 in accordance with embodiment 17, the cluster power generation sections Gf to Gi are arranged to achieve an efficient, tightly packed arrangement of cluster power generation sections G in the circular photovoltaic device 1. In the present embodiment, the four types of cluster power generation sections Gf to Gi are provided as the cluster power generation sections G to restrain an imbalance between series circuits.

The unitary power generation sections D (D1, . . . , and D9) in the cluster power generation section Gf are arranged in this order starting at the upper left corner as in a 3×3 matrix as can be seen in the figure. In the cluster power generation section Gg, as can be seen in the figure, four (D2, D4, D6, and D8) of the unitary power generation sections D (D1 to D9) are arranged in the left column, and the remaining five (D1, D3, D5, D7, and D9) of them are arranged in the right column. Furthermore, the unitary power generation sections D in the left column are shifted by half a unitary power generation section D in the lengthwise direction from those in the right column. In addition, the unitary power generation sections D1, . . . , and D9 are arranged in this order along a wobbling path starting at the bottom of the right column. In the cluster power generation section Gh, as can be seen in the figure, four (D6 to D9) of the unitary power generation sections D (D1 to D9) are arranged in the left column, and the remaining five (D1 to D5) of them are arranged in the right column. In addition, the unitary power generation sections D1, . . . , and D9 are arranged in this order from top to bottom, first in the right column and then in the left column. In the cluster power generation section Gi, as can be seen in the figure, four (D6 to D9) of the unitary power generation sections D (D1 to D9) are arranged in the left column, three (D1, D3, and D5) of them are arranged in the middle column, and the remaining two (D2 and D4) of them are arranged in the right column. In addition, the unitary power generation sections D1, . . . , and D9 are arranged in this order, starting at the top of the middle column, first along a wobbling path down in the middle and right columns and then down in the left column.

In the photovoltaic device 1 in accordance with the present embodiment, the cluster power generation sections Gf to Gi are tightly packed in a circular area. Specifically, the four types of cluster power generation sections Gf, Gg, Gh, and Gi shown in FIGS. 17A to 17D are arranged. A combination of five cluster power generation sections Gf, ten cluster power generation sections Gg, two cluster power generation sections Gh, and two cluster power generation sections Gi is arranged. The five cluster power generation sections Gf are suitably rotated and arranged at the center of the photovoltaic device 1 in the lengthwise direction. The cluster power generation sections Gg, Gh, and Gi are arranged to the left and right.

As described above, the photovoltaic device 1 in accordance with the present embodiment includes multiple types of cluster power generation sections G with different arrangements of unitary power generation sections D. Since the unitary power generation sections D in the same series stage (specific series stage) are not fixed at particular positions in the cluster power generation section G and hence more distributed (for example, adjoining cluster power generation sections G can be located at very different positions (position state)), the photovoltaic device 1 effectively restrains the adverse effect of variation in the amount of light irradiation, for example, partial shadow cast over the light-receiving face.

In the photovoltaic device 1 in accordance with the present embodiment, the unitary power generation sections D in the cluster power generation sections Gf to Gi are arranged to form a shape that is not a simple matrix and also rotated suitably in their arrangement. The configuration enables an efficient layout of the unitary power generation sections D in a circular area. The application of the cluster power generation sections Gf to Gi prevents the unitary power generation sections D in the same series stage from being located very close to each other and hence distributes them across the light-receiving face. The photovoltaic device 1 hence does not allow for large reductions in power generation efficiency for partial shadow.

As described above in embodiments 14 to 17, the plane configuration of the unitary power generation sections D in the cluster power generation sections G is not limited to a matrix-like shape. In addition, the light-receiving face required with the photovoltaic device 1 is not limited to a matrix-like shape. Therefore, as in the examples given in embodiments 14 to 17, the cluster power generation sections G (unitary power generation sections D) can be tightly packed to fit the shape of the light-receiving face of the photovoltaic device 1 with no part of the shape being wasted, by irregularly arranging the cluster power generation sections G (unitary power generation sections D).

Embodiment 18

A photovoltaic device 1 in accordance with the present embodiment will be described in reference to FIGS. 18A and 18B. The photovoltaic device 1 in accordance with the present embodiment has a basic configuration similar to that of the photovoltaic device 1 in accordance with embodiment 2 (see FIGS. 2A and 2B). Hence, the same reference numerals will be used where appropriate, and the description will focus on major technical differences.

Figures 18A, 18B:
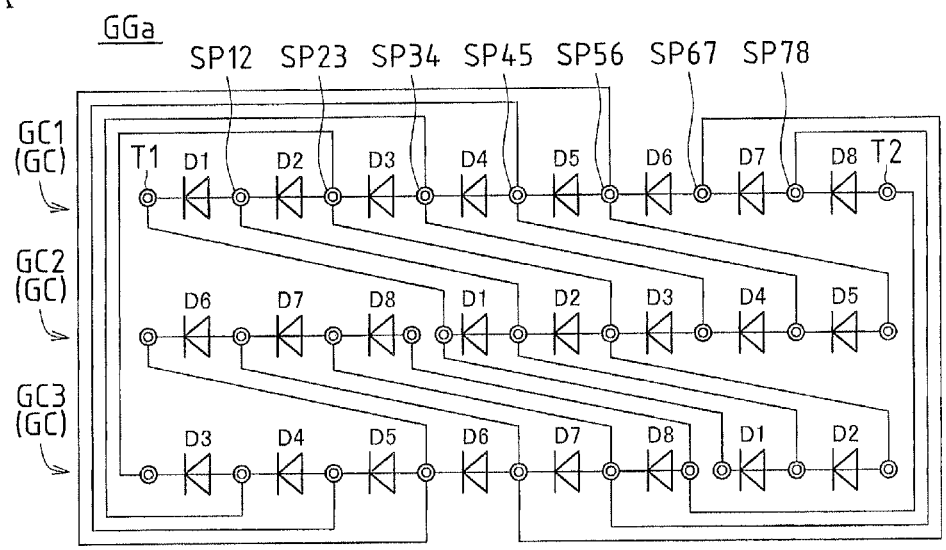
FIG. 18A is a plan view schematically illustrating the arrangement and connections of unitary power generation sections in a cluster power generation section applied to a photovoltaic device according to embodiment 18 of the present invention.
FIG. 18B is a plan view schematically illustrating the arrangement of the cluster power generation sections and the unitary power generation sections in the photovoltaic device according to embodiment 18 of the present invention.

FIG. 18A is a plan view schematically illustrating the arrangement and connections of unitary power generation sections D in a cluster power generation section GGa applied to the photovoltaic device 1 in accordance with embodiment 18 of the present invention.

FIG. 18B is a plan view schematically illustrating the arrangement of the cluster power generation sections GGa and the unitary power generation sections D in the photovoltaic device 1 in accordance with embodiment 18 of the present invention.

In the photovoltaic device 1 in accordance with the present embodiment, the cluster power generation section GGa includes multiple series circuits GC (e.g., three series circuits GC1, GC2, and GC3) which are formed by unitary power generation sections D. Hereinafter, the series circuits GC1, GC2, and GC3 may be simply referred to as the "series circuits GC" when it is not necessary to distinguish between them individually.

Each series circuit GC includes unitary power generation sections D1 to D8. In other words, the cluster power generation section GGa includes multiple unitary power generation sections D (single photovoltaic elements are used in the present embodiment) in each series stage.

The cluster power generation section GGa in accordance with the present embodiment includes three parallel-connected series circuits GC (GC1, GC2, and GC3) in each of which unitary power generation sections D1 to D8 are connected in series between the device terminals T1 and T2. In other words, there are provided three each of unitary power generation sections D1, D2, . . . , and D8, and these three unitary power generation sections D are connected in parallel.

For example, the series circuit GC1 includes unitary power generation sections D1 to D8 arranged in this order and connected in series to form a series circuit GC. The series circuit GC2 includes unitary power generation sections D6 to D8 and D1 to D5 arranged in this order, with the unitary power generation sections D5 and D6 being connected by connection wiring which runs around the series circuits GC1 and GC2, to form a series circuit GC. The series circuit GC3 includes unitary power generation sections D3 to D8 and D1 to D2 arranged in this order, with the unitary power generation sections D2 and D3 being connected by connection wiring which runs around the series circuit GC1, to form a series circuit GC.

Since those unitary power generation sections D in the same series stage of the series circuits GC in the cluster power generation section GGa are connected in parallel, there exists no primary/secondary relationship between the series circuits GC. For convenience of description, however, the unitary power generation sections D may be divided into those in one of the series circuits GC (e.g., GC1) and those in another one of the series circuits GC (e.g., GC2).

The series circuit GC may be defined, for example, by a connecting path along which the connection intervals between the unitary power generation sections D are shorter than connections to other unitary power generation sections D, except for the connection to the device terminals T1 and T2. The cluster power generation section GGa is, in the equivalent circuit, a lattice-like series-parallel circuit in which all the unitary power generation sections D are connected both in parallel and in series. Although a series circuit GC connected to no other series circuits GC cannot be singly extracted in the equivalent circuit, for example, unitary power generation sections D which are linearly arranged are preferably grouped as one series circuit GC (e.g., GC1).

In addition, the photovoltaic device 1 includes eight (4 rows by 2 columns) cluster power generation sections GGa. Cluster power generation sections GGa with a common arrangement in the left/right direction in the figure are arranged parallel to the longer side in two columns. In the vertical direction in the figure, cluster power generation sections GGa are alternately rotated by 180° and disposed side by side in four rows. In other words, the photovoltaic device 1 includes eight cluster power generation sections GGa in each of which there are provided three parallel-connected sets of eight series-connected unitary power generation sections D.

Since the cluster power generation section GGa includes multiple unitary power generation sections D in each series stage (parallel-connected multiple unitary power generation sections D), the unitary power generation sections D in that series stage (e.g., the three unitary power generation sections D1) are arranged at positions which are not adjacent to each other. In other words, the unitary power generation section D (unitary power generation section D1) in a series stage (unitary power generation section D1) of a series circuit GC (e.g., GC1) and the unitary power generation section D (unitary power generation section D1) in the same series stage (unitary power generation section D1) of another series circuit GC (e.g. GC2) are arranged at a distance from each other, not adjacent to each other.

For example, if the series circuit GC composed of the unitary power generation sections D1 to D8 in one series circuit GC1 is linearly arranged, the series circuit GC composed of the unitary power generation sections D6 to D8 and D1 to D5 in another series circuit GC2 is linearly arranged adjacent to the series circuit GC1. The arrangement of series stages (unitary power generation sections D) differs.

Specifically, the unitary power generation section D1 in the series circuit GC2 (other series circuit GC) corresponding to the unitary power generation section D1 in the series circuit GC1 (one series circuit GC) is arranged with the intervening unitary power generation sections D2 and D3 in the series circuit GC1 (or the unitary power generation sections D7 and D8 in the series circuit GC2), and arranged at a position distanced by two unitary power generation sections D. Therefore, the cluster power generation section GGa in accordance with the present embodiment includes, inside thereof, parallel-connected unitary power generation sections D belonging to the same series stage at positions which are at a distance from each other.

Since the parallel-connected unitary power generation sections D are located at a distance from each other, not close to each other, inside the cluster power generation section GGa, it is ensured that the arrangement positions of the unitary power generation sections D (e.g., D1) in any series stage are distributed in an irregular manner on the light-receiving face of the photovoltaic device 1. Therefore, it is ensured that it is less likely that the unitary power generation sections D (e.g., D1) in a particular series stage are shaded more often than those in the other series stages when partial shadow is cast over the light-receiving face of the photovoltaic device 1. Hence, the configuration more effectively restrains an imbalance in sunlight between the same series stages and enables light energy to be effectively drawn from portions in the sun when partial shadow is being cast.

A photovoltaic device 1 with a highly irregular arrangement can be easily manufactured if individual cluster power generation sections GGa are fabricated before arranging them to fit the light-receiving face (e.g., transparent substrate 1ts). In addition, the unit (division unit, region unit) which defines the individual cluster power generation sections GGa can be classified, for example, by the architecture of the wiring board. For example, if one cluster power generation section GGa is fabricated on each wiring board, the wiring board can be treated as one cluster power generation section GGa.

As described above, in the photovoltaic device 1 in accordance with the present embodiment, the cluster power generation section GGa includes additional unitary power generation sections D connected in parallel with respective unitary power generation sections D. Therefore, in the photovoltaic device 1 in accordance with the present invention, each cluster power generation section GGa includes multiple series circuits GC each formed by unitary power generation sections D, and each series stage of the series circuits GC includes parallel-connected unitary power generation sections D. Therefore, a unitary power generation section D in one series circuit GC and one in another series circuit GC can be located at a distance from each other, even if they are in the same series stage. The configuration hence effectively restrains the adverse effect of variation in the amount of light irradiation, for example, partial shadow cast over the light-receiving face.

In the cluster power generation section GGa of the photovoltaic device 1, the arrangement of the unitary power generation sections D in one series circuit GC and the arrangement of the unitary power generation sections D in another series circuit GC are different when they are compared for the same series stage. In other words, since the unitary power generation sections D in the same series stage (specific series stage) are not fixed at particular positions in the cluster power generation section GGa and hence more distributed, the photovoltaic device 1 readily realizes the cluster power generation section GGa with an increased level of irregularity in the arrangement of the unitary power generation sections D. The photovoltaic device 1 hence effectively restrains the adverse effect of variation in the amount of light irradiation (for example, partial shadow cast over the light-receiving face) and improves productivity.

In addition, as described above, the parallel-connected unitary power generation sections D in one series circuit GC and those in another series circuit GC preferably have different arrangements when they are compared for the same series stage. For example, if one series circuit GC is linearly arranged, the other series circuit GC is arranged (disposed side by side) linearly and parallel to the one series circuit GC, and the unitary power generation sections D in the same series stage are arranged mutually differently in their relative positions in the linearly arrangements.

For example, the unitary power generation section D1, connected to the device terminal T1, is located at the far left position in the series circuit GC (e.g., GC1) constituting the one series circuit GC. The unitary power generation section D1 is located at the fourth position from the left in the series circuit GC (e.g., GC2) constituting the other series circuit GC as opposed to the series circuit GC (GC1) constituting the one series circuit GC. Likewise, the unitary power generation section D1 is located at the seventh position from the left in the series circuit GC (e.g., GC3) constituting the other series circuit GC.

The present embodiment is applicable to other embodiments (e.g., embodiments 2 and 10). For example, if the present embodiment is applied to embodiment 10 (see FIGS. 10A and 10B), the cluster power generation sections G11, G12, and G13 may act as one cluster power generation section GGa, the cluster power generation sections G21, G22, and G23 as another cluster power generation section GGa (distinguishable by adding a suffix as in "GGb"), . . . , and the cluster power generation sections G41, G42, and G43 as still another cluster power generation section GGa (e.g., distinguishable by adding a suffix as in "GGd").

Considering the integrity (ease of manufacturing, efficiency in manufacturing) of the wiring board, as described in the present embodiment, it is preferable to apply a single type of cluster power generation sections GGa and rotate them by 180° to realize a wide variety of arrangements and more distribution.

Embodiment 19

A photovoltaic device 1 in accordance with the present embodiment will be described in reference to FIGS. 19A to 19C. The photovoltaic device 1 in accordance with the present embodiment has a basic configuration similar to that of the photovoltaic device 1 in accordance with embodiment 2 (see FIGS. 2A and 2B). Hence, the same reference numerals will be used where appropriate, and the description will focus on major technical differences.

FIG. 19A is a plan view illustrating, in a simplified manner, the arrangement of unitary power generation sections D in a cluster power generation section Gj applied to the photovoltaic device 1 in accordance with embodiment 19 of the present invention. In the present embodiment, the cluster power generation sections G are suffixed with an alphabetic letter (e.g., Gj) to distinguish between them.

FIG. 19B is a plan view illustrating, in a simplified manner, the arrangement of unitary power generation sections D in a cluster power generation section Gk applied to the photovoltaic device 1 in accordance with embodiment 19 of the present invention.

Figure 19C:
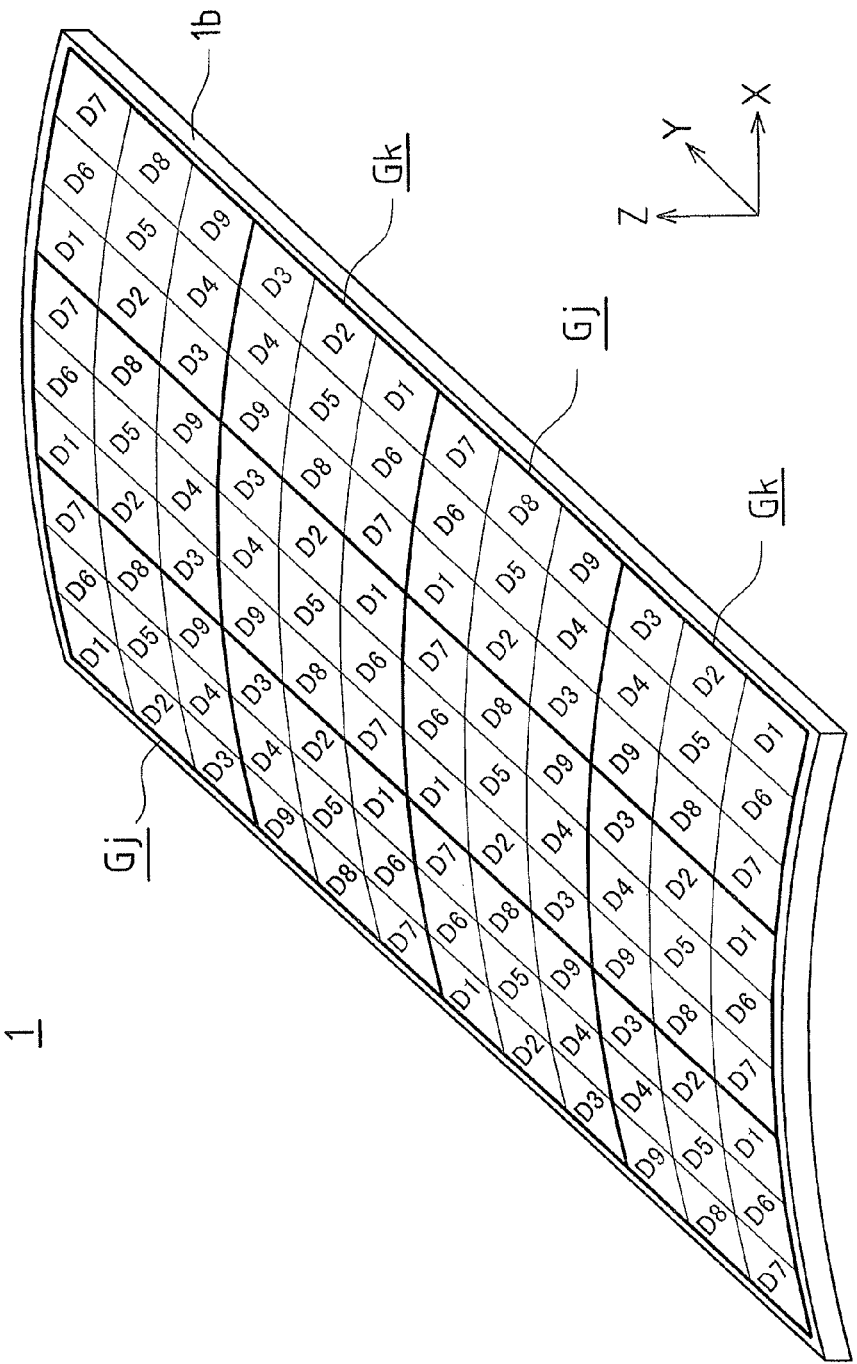
FIG. 19C is a plan view schematically illustrating the arrangement of the cluster power generation sections and the unitary power generation sections in a photovoltaic device according to embodiment 19 of the present invention.

FIG. 19C is a plan view schematically illustrating the arrangement of the cluster power generation sections Gj and Gk and the unitary power generation sections D in the photovoltaic device 1 in accordance with embodiment 19 of the present invention.

In the photovoltaic device 1 in accordance with the present embodiment, (3×3=9) unitary power generation sections D are arranged like a matrix in both the cluster power generation sections Gj and Gk. The arrangement of the unitary power generation sections D in the cluster power generation section Gj and the arrangement of the unitary power generation sections D in the cluster power generation section Gk are such that if either one of the arrangements is rotated by 180°, it matches the other.

In addition, in the photovoltaic device 1, the cluster power generation sections G are arranged as in a matrix (in the x or row direction and in the y or column direction). The cluster power generation sections Gj are arranged in the second and fourth rows which intersect with the y direction (column direction), the cluster power generation sections Gk are arranged in the first and third rows which intersect with the y direction, and three each of the cluster power generation sections Gj and Gk are arranged in the row direction (x direction). In other words, the cluster power generation sections Gj and Gk are alternately arranged in the column direction (y direction). Across the entire light-receiving face of the photovoltaic device 1, there are arranged 108 (9×12) unitary power generation sections D.

The photovoltaic device 1 in accordance with the present embodiment is assumed to have been mounted to a mounting section 1b. The mounting section 1b has a curved face which bulges, for example, in the z direction (vertical direction) when observed along the x direction. Even if the individual unitary power generation sections D are not curved, but have a substantially planar face, the light-receiving face formed across the entire photovoltaic device 1 may be curved (e.g., a curved face which bulges in the z direction when observed along the x direction) because there are provided many unitary power generation sections D.

In other words, since each unitary power generation section D has a sufficiently small size when compared with the light-receiving face of the photovoltaic device 1 (1/108 in the present embodiment), the light-receiving face can be rendered curved by arranging the unitary power generation sections D on the curved mounting section 1b. The face of the mounting section 1b is supposed to be linear (substantially planar) when observed along the y direction in the present embodiment. Alternatively, the face may be curved both when observed along the y direction and when observed along the x direction.

As described above, the light-receiving face of the photovoltaic device 1, i.e., the light-receiving face formed by arranging the unitary power generation sections D, is a curved face. Therefore, the photovoltaic device 1 is applicable both when the attaching face (mounting section 1b) is planar and when it is curved. The photovoltaic device 1 is thus more broadly applicable.

A suitable transparent substrate 1ts (see FIG. 1 miscellaneous) may be provided on the light-receiving face. Alternatively, a suitable coating film may be applied in place of the transparent substrate 1ts.

Especially, when the photovoltaic device 1 is mounted to an automobile roof (corresponding to the mounting section 1b), the automobile roof often forms a curved face, not a simple plane, for design purposes. When that is the case, unitary power generation sections D can be arranged to substantially fit a curved face by using unitary power generation sections D of small size as in the present embodiment. The configuration does not negatively affect the design of the automobile and enables the unitary power generation sections D to be fixed on the curved roof in a stable manner.

If the photovoltaic elements provided on a curved face are simply connected in series, the individual photovoltaic elements have slightly different angles to the sunlight and slightly different orientations to the sunlight depending on where the photovoltaic elements are located on the curved face. That causes the individual photovoltaic elements to receive different amounts of sunlight (irradiation amount) and may lead to a sunlight imbalance between series stages.

This potential problem is addressed as follows in the present embodiment. The unitary power generation sections D in each series stage are distributed across the curved mounting section 1b. The effect of a sunlight imbalance which could result from different angles to the sunlight from position to position on the curved face is distributed substantially across the series stages. The present embodiment thus restrains reductions in power generation efficiency which are attributable to sunlight imbalance.

In other words, the photovoltaic device 1 in accordance with the present embodiment is built as a photovoltaic device with a curved light-receiving face. Hence, the photovoltaic device 1 can be disposed on the mounting section 1b which has a curved face like, for example, an automobile roof. The photovoltaic device 1 ensures efficient power generation when it is applied to an automobile.

The unitary power generation sections D and the cluster power generation sections G were sometimes described in embodiments 1 to 18 using the term, "planar arrangement," to represent their layout. This simple term, "planar arrangement," is for convenience of description only, and does not exclude the possibility of the photovoltaic device 1 having a curved light-receiving face.

In other words, the face condition (planar or curved) of the unitary power generation sections D and the cluster power generation sections G in accordance with the present application is by no means limited in any absolute meaning. When adjoining unitary power generation sections D or adjoining cluster power generation sections G are arranged to form the photovoltaic device 1, the light-receiving face of the photovoltaic device 1 may be rendered curved by changing the orientation of the light-receiving face of the section D or G to the sunlight from one of the adjoining unitary power generation sections D or the adjoining cluster power generation sections G to another. The unitary power generation sections D and the cluster power generation sections G may be combined to form various curved faces including those described below as examples.

For example, when the unitary power generation section D is substantially planar, the cluster power generation section G is often likewise substantially planar in general (as in embodiments 1 to 18). However, a photovoltaic device 1 with a curved light-receiving face can be formed by arranging the cluster power generation sections G so that the light-receiving face of a cluster power generation section G differs from the light-receiving face of an adjacent cluster power generation section G (see embodiment 19).

In addition, when the unitary power generation section D is substantially planar, a cluster power generation section G with a curved light-receiving face can be formed by arranging unitary power generation sections D so that the light-receiving face of a unitary power generation section D differs from the light-receiving face of an adjacent unitary power generation section D. A photovoltaic device 1 with a curved light-receiving face can be readily formed by arranging cluster power generation sections G with a curved light-receiving face.

In addition, when the unitary power generation section D is curved, the light-receiving face of the cluster power generation section G and the light-receiving face of the photovoltaic device 1 can be readily rendered curved. Considering ease of manufacturing and mass-manufacturability of the unitary power generation sections D, it is preferable that the unitary power generation sections D are substantially planar and also that the orientation of the light-receiving face is rendered to differ from one of the unitary power generation sections D and the cluster power generation sections G to another when the cluster power generation sections G and the photovoltaic device 1 are formed.

In embodiments 1 to 19, since the unitary power generation section D was described as a silicon solar cell as an example, the transparent substrate 1$ts$ was described as a substantially planar substrate (e.g., glass plate). This is by no means limiting the structure of the unitary power generation section D. For example, when the unitary power generation section D is formed from an organic solar cell or a dye sensitized solar cell, the unitary power generation section D can be readily rendered to have a curved face.

Embodiments 1 to 19 are applicable, if necessary, to unitary power generation sections D with a curved light-receiving face and cluster power generation sections G with a curved light-receiving face. When that is the case, the transparent substrate 1$ts$ may be a curved substrate. In addition, when the unitary power generation sections D and the cluster power generation sections G are mounted to a mounting plate 1$b$, a transparent coating film may be used, in place of the transparent substrate 1$ts$, to provide a coating to the light-receiving face.

The photovoltaic device in accordance with the present invention restrains an imbalance between the irradiated area and the area taken up by the operating unitary power generation sections and realizes efficient power generation even if there occurs variation in the amount of light irradiation. The photovoltaic device is applicable to photovoltaic systems and vehicles which include photovoltaic devices and is thereby greatly beneficial.

The invention claimed is:

1. A photovoltaic device comprising a plurality of cluster power generation sections, each cluster power generation section including unitary power generation sections connected in series via at least one connection point, the cluster power generation sections each having at least a predetermined one of the connection points designated as a specific connection point, and the specific connection points being connected together to link the cluster power generation sections, wherein one of the cluster power generation sections has a relative planar arrangement of the unitary power generation sections which is at least partially different from a relative planar arrangement of the unitary power generation sections in an adjoining one of the cluster power generation sections, the planar arrangement of the unitary power generation sections of the one of the cluster power generation sections is rotated a multiple of 90° from the planar arrangement of the unitary power generation sections of the adjoining one of the cluster power generation sections, and in both of the planar arrangements, two or more of the unitary power generation sections are disposed both in a row direction and a column direction of the planar arrangements.

2. The photovoltaic device according to claim 1, wherein the unitary power generation sections have a substantially equal light-receiving area in the cluster power generation sections.

3. The photovoltaic device according to claim 1, wherein each of the specific connection points is a connection point located at a boundary which divides the cluster power generation section into equal numbers of unitary power generation sections.

4. The photovoltaic device according to claim 3, wherein the boundary divides the cluster power generation section along rows or columns of the unitary power generation sections.

5. The photovoltaic device according to claim 1, wherein all the connection points are designated as specific connection points.

6. The photovoltaic device according to claim 1, wherein:
the cluster power generation sections are arranged so that they are either wider in the row direction than they are long in the column direction or longer in the column direction than they are wide in the row direction; and
the unitary power generation sections in the cluster power generation sections have different planar arrangements either in the row direction or in the column direction, in whichever direction the photovoltaic device has a greater dimension.

7. The photovoltaic device according to claim 1, wherein each of the unitary power generation sections is either a single photovoltaic element or a compound photovoltaic element in which photovoltaic elements are connected in series or in parallel.

8. The photovoltaic device according to claim 1, wherein the unitary power generation sections in some of the cluster power generation sections have a different arrangement from that of the unitary power generation sections in the other cluster power generation sections.

9. The photovoltaic device according to claim 1, wherein the cluster power generation sections each include an additional unitary power generation section for each one of the unitary power generation sections, the additional unitary power generation section being connected in parallel with that one of the unitary power generation sections.

10. The photovoltaic device according to claim 9, wherein the unitary power generation sections in one series circuit in the cluster power generation sections have a different arrangement from that of the unitary power generation sections in another series circuit when the arrangements are compared for the same series stage.

11. The photovoltaic device according to claim 1, wherein the unitary power generation sections as a whole form a curved light-receiving face.

12. The photovoltaic device according to claim 1, comprising a transparent substrate on which the cluster power generation sections are mounted.

13. A photovoltaic system, comprising:
a photovoltaic device according to claim 1; and
a power conditioner for converting electric power supplied by the photovoltaic device to a predetermined mode of electric power.

14. The photovoltaic system according to claim 13, wherein:
at least two photovoltaic devices according to claim 1 are connected in parallel;
the specific connection points have an identical arrangement in the photovoltaic devices; and
the specific connection points are connected together to link the photovoltaic devices.

15. A vehicle, comprising:
a body; and
a photovoltaic device according to claim 1 installed on a surface of the body.

* * * * *